US008028119B2

(12) United States Patent
Miura

(10) Patent No.: US 8,028,119 B2
(45) Date of Patent: Sep. 27, 2011

(54) MEMORY MODULE, CACHE SYSTEM AND ADDRESS CONVERSION METHOD

(75) Inventor: Seiji Miura, Hachioji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 734 days.

(21) Appl. No.: 11/435,712

(22) Filed: May 18, 2006

(65) Prior Publication Data

US 2006/0271755 A1 Nov. 30, 2006

(30) Foreign Application Priority Data

May 20, 2005 (JP) ................................ 2005-147957

(51) Int. Cl.
G06F 13/38 (2006.01)
G06F 12/00 (2006.01)
G08C 25/00 (2006.01)
(52) U.S. Cl. ........ 711/103; 711/102; 711/150; 711/118; 711/E12.021; 711/E12.041
(58) Field of Classification Search .................. 711/150, 711/151, 154, 158, 168
See application file for complete search history.

(56) References Cited

U.S. PATENT DOCUMENTS

| | | | |
|---|---|---|---|
| 5,530,673 A | 6/1996 | Tobita et al. | 365/185.09 |
| 5,724,550 A * | 3/1998 | Stevens | 711/146 |
| 6,275,436 B1* | 8/2001 | Tobita et al. | 365/221 |
| 6,791,877 B2 | 9/2004 | Miura et al. | 365/185.11 |
| 7,331,046 B2* | 2/2008 | Shida et al. | 717/162 |
| 7,660,945 B1* | 2/2010 | Lee et al. | 711/113 |
| 7,882,305 B2* | 2/2011 | Moritoki | 711/113 |
| 2002/0185337 A1 | 12/2002 | Miura et al. | 185/11 |
| 2003/0206442 A1* | 11/2003 | Tang et al. | 365/185.17 |
| 2005/0015582 A1* | 1/2005 | Shida et al. | 713/2 |
| 2005/0021912 A1* | 1/2005 | Ho et al. | 711/137 |
| 2005/0060486 A1* | 3/2005 | Kang et al. | 711/103 |
| 2006/0004949 A1* | 1/2006 | Van Steenwijk et al. | 711/103 |
| 2008/0276040 A1* | 11/2008 | Moritoki | 711/113 |

FOREIGN PATENT DOCUMENTS

| | | |
|---|---|---|
| EP | 0 566 306 A2 | 10/1993 |
| JP | 5-299616 | 11/1993 |
| JP | 7-146820 | 6/1995 |
| JP | 2001-5723 | 1/2001 |
| JP | 2002-366429 | 12/2002 |
| JP | 2003-91463 A | 3/2003 |

OTHER PUBLICATIONS

"Composite Memory (Stacked CSP) Flash Memory+RAM Data Sheet" Model Name: LRS1380, [Online] on Dec. 10, 2001, Sharp Corporation, Internet URL: (http://www.sharp.co.jp/products/device/flash/cmlist.html).

* cited by examiner

Primary Examiner — Mardochee Chery
(74) Attorney, Agent, or Firm — Miles & Stockbridge P.C.

(57) ABSTRACT

A memory system including a non-volatile memory, a cache memory, a control circuit, and a data processing device is configured. The high speed can be achieved by transferring data in the non-volatile memory to the cache memory to retain the same therein. When the data in the non-volatile memory is transferred to the cache memory, error correction is performed so as to improve the reliability. Since the cache memory and the non-volatile memory can be accessed from the data processing device independently, improvement in usability can be achieved. The memory system including the plurality of chips is configured as a memory system module where respective chips are arranged in a stacked manner and wired by a ball grid array (BGA) and wire bonding between chips.

18 Claims, 30 Drawing Sheets

FIG. 9A

Time →

| Add1 | Add2 (Tag2) | Add8 | Add10 (Index2) | replace |
|---|---|---|---|---|
| 65 | 0 | 0 | 65 | none |
| 17 | 1 | 1 | 18 | none |
| 66 | 0 | 0 | 66 | none |
| 18 | 1 | 1 | 19 | none |
| 67 | 0 | 0 | 67 | none |
| 19 | 1 | 1 | 20 | none |
| 68 | 0 | 0 | 68 | none |
| 20 | 1 | 1 | 21 | none |
| 69 | 0 | 0 | 69 | none |
| 21 | 1 | 1 | 29 | none |
| 70 | 0 | 0 | 70 | none |
| 22 | 1 | 1 | 23 | none |

FIG. 9B

Time →

| Add1 | Add2 (Tag2) | Add1 (Index2) | replace |
|---|---|---|---|
| 65 | 0 | 65 | none |
| 17 | 1 | 17 | none |
| 66 | 0 | 66 | none |
| 18 | 1 | 18 | none |
| 67 | 0 | 67 | none |
| 19 | 1 | 19 | none |
| 68 | 0 | 68 | none |
| 20 | 1 | 20 | none |
| 69 | 0 | 69 | none |
| 21 | 1 | 21 | none |
| 70 | 0 | 70 | none |
| 22 | 1 | 22 | none |

FIG. 10A

Time ↓

| Add1 | Add2 (Tag2) | Add8 | Add10 (Index2) | replace |
|---|---|---|---|---|
| 0 | 1 | 1 | 1 | none |
| 1 | 7 | 7 | 8 | none |
| 0 | 15 | 15 | 15 | none |
| 1 | 31 | 31 | 32 | none |
| 0 | 63 | 63 | 63 | none |
| 1 | 127 | 127 | 128 | none |
| 0 | 255 | 255 | 255 | none |
| 1 | 510 | 510 | 511 | none |
| 0 | 2 | 2 | 2 | none |
| 1 | 8 | 8 | 9 | none |
| 0 | 16 | 16 | 16 | none |
| 1 | 32 | 32 | 33 | none |

FIG. 10B

Time ↓

| Add1 | Add2 (Tag2) | Add1 (Index2) | replace |
|---|---|---|---|
| 0 | 1 | 0 | none |
| 1 | 7 | 1 | none |
| 0 | 15 | 0 | none |
| 1 | 31 | 1 | none |
| 0 | 63 | 0 | none |
| 1 | 127 | 1 | none |
| 0 | 255 | 0 | none |
| 1 | 510 | 1 | none |
| 0 | 2 | 0 | replace |
| 1 | 8 | 1 | replace |
| 0 | 16 | 0 | replace |
| 1 | 32 | 1 | replace |

MEMORY MODULE, CACHE SYSTEM AND ADDRESS CONVERSION METHOD

CROSS-REFERENCE TO RELATED APPLICATION

The present application claims priority from Japanese Patent Application No. JP 2005-147957 filed on May 20, 2005, the content of which is hereby incorporated by reference into this application.

TECHNICAL FIELD OF THE INVENTION

The present invention relates to a memory system including a non-volatile memory and a control method of the memory system.

BACKGROUND OF THE INVENTION

Conventionally, there is a composite type semiconductor memory in which a flash memory (32 M bit capacity) and a static random access memory (NOR (4 M bit capacity) are integrally sealed in a fine pitch ball grid array (FBGA) package using a stack chip. Address input terminals and data input/output terminals are commonly used in the flash memory and the NOR for the input/output electrodes of the FBGA package. However, the control terminals thereof are independently provided (For example, "COMPOSITE MEMORY (STACKED CSP) FLASH MEMORY+RAM DATA SHEET" MODEL NAME: LRS1380, [ONLINE] on Dec. 10, 2001 SHARP CORPORATION [RETRIEVAL DATE: Aug. 21, 2002] (Non-Patent Document 1).

There is also a composite type semiconductor memory in which a flash memory chip and a DRAM chip are integrally sealed in a lead frame type package. In this composite type semiconductor memory, the flash memory and the DRAM have common address input terminals, data input/output terminals, and control terminals for the input/output electrodes of the package, through which data are inputted and outputted (for example, FIG. 1 and FIG. 15 of Japanese Patent Application Laid-Open Publication No. 5-299616 (Patent Document 1) and EP Patent No. 0566306 (Patent Document 2)).

There is also a system composed of a flash memory operated as a main memory, a cache memory, a controller and a CPU (for example, FIG. 1 of Japanese Patent Application Laid-Open Publication No. 7-146820 (Patent Document 3)).

There is also a semiconductor memory composed of a flash memory, a DRAM, and a transfer control circuit (for example, FIG. 2 of Japanese Patent Application Laid-Open Publication No. 2001-5723 (Patent Document 4) and Japanese Patent Application Laid-Open Publication No. 2002-366429 (Patent Document 5)).

SUMMARY OF THE INVENTION

The inventors of the present invention have studied a cellular phone, a memory system which is composed of a processor, a flash memory and a random access memory and is used in the cellular phone, and operation of the memory system prior to filing the present patent application.

As shown in FIG. 33, a data processing device PRC and a memory module MCM are used in a cellular phone.

The data processing device PRC is composed of a central processing unit CPU and an SRAM controller. The memory module MCM is composed of a NOR flash memory NOR FLASH and an SRAM. The data processing device PRC accesses the memory module MCM to perform data reading and data writing.

After power-on operation, the data processing device PRC reads boot data stored in the NOR flash memory NOR FLASH to start up itself. Thereafter, the data processing device PRC reads an application program from the NOR flash memory NOR FLASH according to necessity to execute the same in the central processing unit CPU. The SRAM functions as a work memory and it stores calculation results in the central processing unit CPU and the like.

In recent years, application, data and work area handled in a cellular phone have been increasing along with the increase in the number of functions applied to the cellular phone (distributions of music, game, and others), and it is anticipated that a flash memory and a random access memory with larger storage capacity are required. Further, a recent cellular phone has been remarkably sophisticated, and needs for high-speed and large-capacity memory have been increasing.

A NOR flash memory used in a current cellular phone is a NOR flash memory using a memory array system called "NOR structure". The NOR type has an array structure where a parasitic resistance of a memory cell array is suppressed low, and resistance reduction is achieved by providing one metal bit line contact for each two memory cells connected in parallel. Therefore, a reading time can be set to be about 80 ns, which is approximately equal to a reading time in a NOR. However, since one contact must be provided for each two cells, an occupation ratio of a contact portion to a chip area is high, and an area of one bit per memory cell becomes large, which results in such a problem that a demand for large capacity cannot be satisfied sufficiently.

As typical large-capacity flash memories, an AND flash memory using an AND structure for a memory array and a NAND flash memory using a NAND structure are known. In these flash memories, one bit line contact is provided for each 16 to 128 cells. Therefore, a high density memory array can be realized. Accordingly, since an area of one bit per memory cell can be reduced in comparison to the NOR flash memory, demand for large capacity can be satisfied. However, it has been found that a reading time required for outputting first data is long such as about 25 µs to 100 µs, and compatibility with the NOR flash memory cannot be achieved.

It has been also found that reliability of the flash memory lowers due to the repetition of rewriting thereto, and such a phenomenon that data written in the flash memory in a write operation is changed when it is read out in a read operation or data is not written in a rewrite operation occurs rarely.

Further, it has been also found that such a phenomenon that a rays emitted from radioactive material such as uranium in a semiconductor sealing material enter a memory array in a random access memory RAM and stored data in the memory array is destroyed rarely occurs, which causes the degradation in reliability of the random access memory RAM.

Therefore, one of objects of the present invention is to provide a memory system including a ROM and a RAM, which has a large storage capacity and is manufactured at low cost, and is user-friendly.

The typical ones of the inventions disclosed in this application will be briefly described as follows. A data processing device, a flash memory, a cache memory, and a memory controller are packaged in one sealing member, and electrodes for wiring to a semiconductor chip and electrodes for connecting the sealing member and a part outside the sealing member are provided in the sealing member.

At that time, in order to speed up a read operation to a request for reading data in the flash memory from the data processing device, the memory controller is connected to the cache memory and the flash memory so that data transfer from the flash memory to the cache memory is performed by the memory controller.

After power-on operation, it is preferable to perform the control for transferring at least a part of data in the flash memory to the cache memory.

It is preferable to perform the control so that addresses inputted from the data processing device are distributed to index addresses in the cache memory.

It is preferable that data to be utilized by the data processing device is transferred to the cache memory in advance through the control by the memory controller.

It is also preferable that a register in the flash memory is utilized as a cache memory.

It is preferable that the memory controller performs error detection and error correction in a data read operation from the flash memory, and performs a substitution process to a failure address where writing has not been performed correctly in a data write operation. Also, it is preferable that the control for leveling the number of writing times to a memory cell in the flash memory is performed. Further, it is preferable that error detection is performed even after data has been read from the cache memory.

It is preferable to provide a signal line which can notify arrival of data required by the data processing device.

The memory controller preferably receives accesses for reading and writing from and to the flash memory from the data processing device even during the data read operation from the cache memory so as to perform data reading and data writing from and to the flash memory.

A high-performance memory can be realized.

BRIEF DESCRIPTIONS OF THE DRAWINGS

FIG. 9A is a diagram showing one example of data update in the cache memory in the memory system to which the present invention is applied;

FIG. 9B is a diagram showing one example of data update in the cache memory in the memory system to which the present invention is applied;

FIG. 10A is a diagram showing one example of data update in the cache memory in the memory system to which the present invention is applied;

FIG. 10B is a diagram showing one example of data update in the cache memory in the memory system to which the present invention is applied;

DESCRIPTIONS OF THE PREFERRED EMBODIMENTS

Hereinafter, embodiments of the present invention will be described in detail with reference to the accompanying drawings. Circuit elements constituting each block in the embodiments are not particularly limited, but they are formed on one semiconductor substrate such as single crystal silicon by an integrated circuit technology such as a known CMOS (complementary MOS transistor).

First Embodiment

Figure 1:
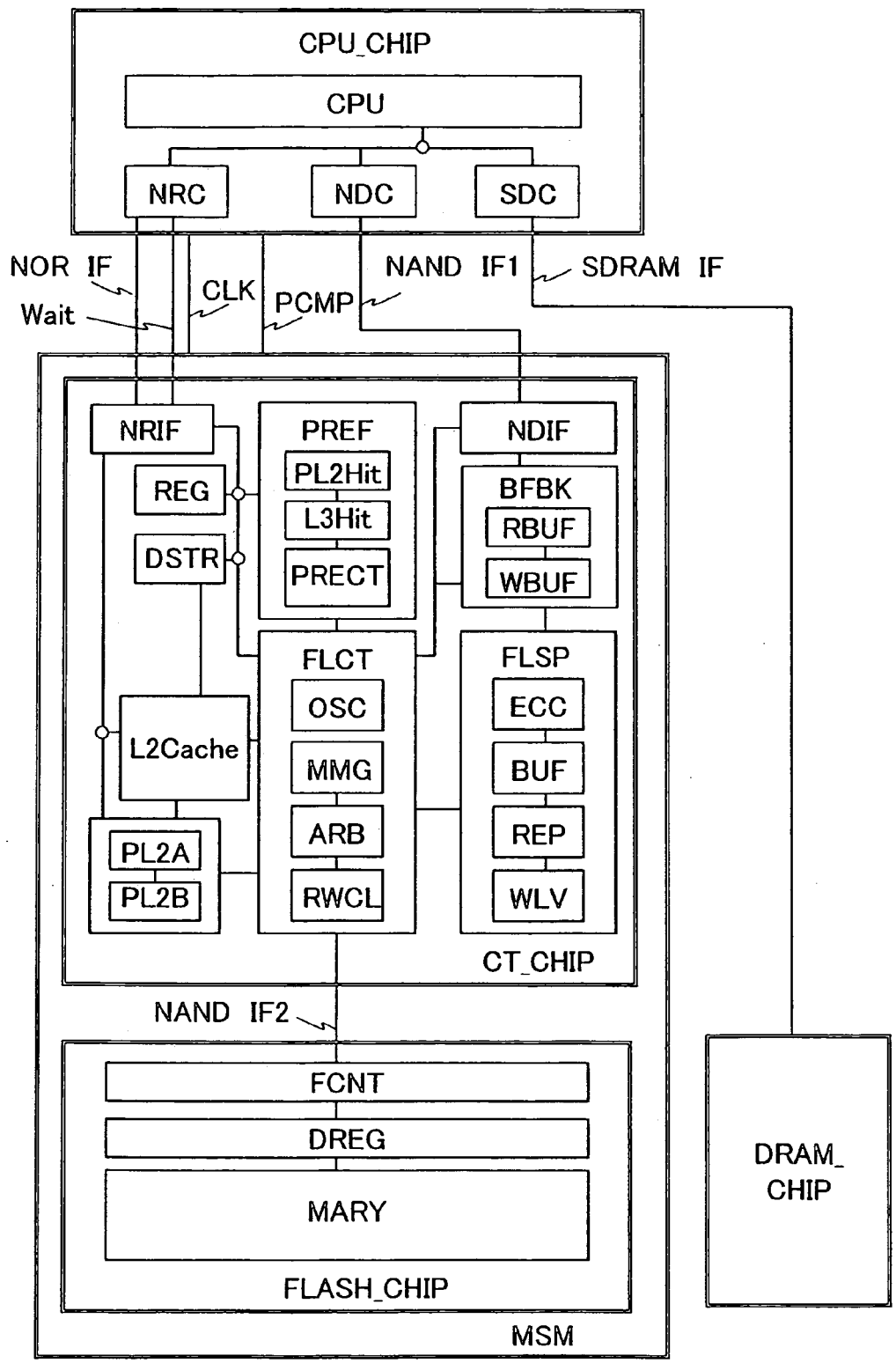
FIG. 1 is a configuration diagram of a memory system to which the present invention is applied.

FIG. 1 shows a memory system composed of a data processing device CPU_CHIP and a memory module MSM according to a first embodiment to which the present invention is applied. Respective elements or parts will be described below.

The memory module MSM is composed of FLASH_CHIP and a CT_CHIP. The FLASH_CHIP is a non-volatile memory. A ROM (read only memory), an EEPROM (electrically erasable and programmable ROM), a flash memory can be used as the non-volatile memory. In this embodiment, description will be made with using the flash memory as an example.

As a typical large-capacity flash memory, an AND flash memory using an AND structure in a memory array and a NAND flash memory using a NAND structure therein are known. Both the flash memories can be used in the present invention. Also, there are a large-capacity flash memory including a NAND interface and a large-capacity flash memory including an AND interface, and both the flash memories can be used in the present invention. In this embodiment, description will be made with using the large-capacity flash memory including a NAND interface as an example.

Though not particularly limited, a typical flash memory used as the FLASH_CHIP is a large-capacity flash memory including a NAND interface, which has a large storage capacity of about 2 Gbits and whose reading time (time from a read request to data output) is as slow as about 25 μs to 100 μs.

A DRAM_CHIP is a dynamic random access memory, which has various types such as an EDO (Extended Data Out), a SDRAM (Synchronous DRAM), and DDR (Double Data Rate) depending on the differences in internal configuration or interface. Any DRAM can be used as the memory module MSM. In this embodiment, description will be made with using the SDRAM as an example. The dynamic random access memory DRAM_CHIP is used as a temporary work memory for executing an application program in the data processing device CPU_CHIP.

Though not particularly limited, a typical SDRAM used as the DRAM_CHIP has a large storage capacity of about 256 Mbits.

A control circuit CT_CHIP is a control circuit for controlling data transfer between the FLASH_CHIP and the data processing device CPU_CHIP. Though not particularly limited, the control circuit CT_CHIP incorporates a cache memory L2Cache having a storage capacity of 1 Mbytes, which has a reading time of about 30 ns to 90 ns and is faster than or equal to a conventional NOR flash memory.

The cache memory L2Cache can be realized by using a magnetic random access memory MRAM and a phase-change memory PRAM which are non-volatile memories, or a static random access memory SRAM which is a volatile memory. Any random access memory can be used for the memory module MSM. In this embodiment, description will be made based on the case of using the static random access memory SRAM, which is a volatile memory, as the cache memory L2Cache.

Data transfer between the flash memory FLASH_CHIP and the control circuit CT_CHIP is performed through a NAND interface NAND IF2, and data transfer between the data processing device CPU_CHIP and the dynamic random access memory DRAM_CHIP is performed through an SDRAM interface SDRAM IF.

The data processing device CPU_CHIP is composed of a central processing unit CPU, a NOR flash controller NRC, a NAND flash controller NDC, and a DRAM controller SDC. The NOR flash controller NRC accesses the memory module MSM through a NOR interface to perform data writing and reading. The DRAM controller SDC accesses the DRAM- _CHIP through the SDRAM interface (SDRAM IF) to perform data reading and writing. The NAND flash controller NDC accesses the memory module MSM through a NAND interface (NAND IF1) to perform data reading and writing.

The flash memory FLASH_CHIP is composed of a control circuit FCNT, a data register DREG, and a memory cell array MARY. The control circuit FCNT is a circuit which operates in response to a read or write command from the NAND interface NAND IF2 of the control circuit CT_CHIP.

When a read request is inputted into the control circuit FCNT, though not particularly limited, data with a data size of about 2 KB is transferred from the memory cell array MARY to the data register DREG, and the data is transferred to the control circuit CT_CHIP through the NAND interface NAND IF2. Also, the data transferred to the data register DREG is retained as it is.

When a write request and write data are inputted into the control circuit FCNT, though not particularly limited, data with a data size of about 2 KB is inputted into the data register DREG, and the data is finally written in the memory cell array MARY. Also, the data inputted into the data register DREG is retained as it is.

Though not particularly limited, the flash memory FLASH_CHIP is divided into a main data area and a replacement area REPAREA.

The main data area includes an initial program area, and a boot program for starting up the data processing device CPU_CHIP just after power-on operation and automatic transfer area designating data showing a data range within a cache area for automatic transfer from the flash memory FLASH_CHIP to the cache memory L2Cache are stored in the initial program area.

(Configuration of Control Circuit Ct_Chip)

The control circuit CT_CHIP is composed of a NOR interface circuit NRIF which receives a read request and a write request from the NOR interface (NOR IF), a NAND interface circuit NDIF which receives a read request and a write request from the NAND interface (NAND IF), a register block REG, an address conversion circuit DSTR, cache memories L2Cache, PL2A, and PL2B, a prefetch control circuit PREF, a flash control circuit FLCT, a buffer circuit BFBK, and a flash error control circuit FLSP.

Though not particularly limited, the cache memory L2Cache has a capacity of about 1 Mbytes, and the cache memories PL2A and PL2B have a capacity of 512 bytes, respectively.

The prefetch control circuit PREF is composed of hit determination circuits PL2Hit and L3Hit and a pre-reading control circuit. The buffer circuit BFBK is composed of a read buffer RBUF and a write buffer WBUF.

The flash control circuit FLCT is composed of a clock control circuit OSC, a memory address management circuit MMG, an access arbitration circuit ARB, and a control circuit RWCL.

The flash error control circuit FLSP is composed of an error detection and correction circuit ECC, a buffer circuit BUF, a replacement processing circuit REP, and a writing times leveling circuit WLV.

An operation of the memory system will be described below. First, an operation of the memory system just after power-on operation will be described.

(Operation Just after Power-on)

When the data processing device CPU_CHIP, the dynamic random access memory DRAM_CHIP, the control circuit CT_CHIP, and the flash memory FLASH_CHIP are powered on, the flash control circuit FLCT reads data in the initial program area of the FLASH_CHIP to the buffer circuit BUF and checks whether or not there is an error in the data in the error detection and correction circuit ECC. If the data includes no error, the flash control circuit FLCT transfers a boot program in the initial program area to the cache memory PL2A, and if there is an error, it corrects the error and then transfers the boot program in the initial program area to the cache memory PL2A. By automatically transferring the boot program from the FLASH_CHIP to the cache memory PL2A just after power-on operation in this manner, the data processing device CPU_CHIP can read the boot program to rapidly start up itself, and further can perform initial setting of the dynamic random access memory DRAM_CHIP.

While the data processing device CPU_CHIP is starting up, the flash control circuit FLCT reads automatic transfer area designating data from the buffer circuit BUF, sequentially reads data in the flash memory FLASH_CHIP in a range designated by the data into the buffer circuit BUF, and checks whether or not the data includes an error in the error detection and correction circuit ECC. If there is no error, the flash control circuit FLCT transfers the data to the cache memory L2Cache via the cache memory PL2B, but if there is an error, the flash control circuit FLCT corrects the error and then transfers the data to the cache memory L2Cache via the cache memory PL2B. When the automatic data transfer is terminated, the memory module MSM switches an initial operation completion signal PCMP indicating the completion of a series of initial operations to High.

The access arbitration circuit ARB may be configured so as to write a transfer completion flag indicating the completion of data transfer into the register block REG. In this case, since the initial operation completion signal PCMP is not required, the number of signal pins can be reduced.

Since the data processing device CPU_CHIP can know that the data transfer just after power-on operation has been completed by checking the initial operation completion signal PCMP of the memory module MSM, it can access the cache memory L2Cache immediately.

As described above, by automatically transferring the boot program from the flash memory FLASH_CHIP to the cache memory L2Cache just after power-on operation, the data processing device CPU_CHIP can read the boot data to start up itself rapidly. Further, by automatically transferring data in the FLASH_CHIP to the cache memory L2Cache while the data processing device CPU_CHIP is starting up, the data processing device CPU_CHIP can access the memory module MSM just after the starting-up thereof. Therefore, the performance improvement can be achieved.

(Description of Register Block)

Next, the register block REG will be described. Though not particularly limited, the register block REG includes a reading mode setting register RModeReg, a cache area setting register CAreaReg, a cache lock area setting register CaLockReg, a write protect area setting register WproReg, and a writing times leveling process area setting register WlvlReg.

When a cache area and a non-cache area are to be changed, though not particularly limited, a value in the cache area setting register CAreaReg is rewritten from the NOR interface NOR IF, thereby changing the cache area and the non-cache area. Though not particularly limited, a whole area of the flash memory FLASH_CHIP serves as a cache area just after power-on.

The data in the cache area is transferred to the cache memories L2Cache, PL2A, and the PL2B, and the data in the non-cache area is not transferred thereto.

When the cache lock area and the non-cache lock area are to be changed, though not particularly limited, a value in the cache area setting register CAreaReg is rewritten from the NOR interface NOR IF, thereby changing the cache lock area and the non-cache lock area. Though not particularly limited, a whole area of the flash memory FLASH_CHIP serves as a non-cache lock area just after power-on.

When data in the cache lock area is transferred to the cache memory L2Cache, the data can be present in the cache memory L2Cache until the cache area setting register is rewritten in response to a cache lock release command. Also, data in the non-cache lock area may be ejected from the cache memory L2Cache.

When the writing times leveling process area and the non-writing times leveling process area are to be changed, though not particularly limited, a value in the writing times leveling process area setting register WlvlReg is rewritten from the NOR interface NOR IF, thereby changing the writing times leveling process area and the non-writing times leveling process area. Though not particularly limited, half of a whole area of the flash memory FLASH_CHIP serves as the writing times leveling process area just after power-on.

When the writing times leveling circuit WLV determines that rewritings have been concentrated, a writing times leveling process is performed to the data in the writing times leveling process area.

The writing times leveling process is not performed to the data in the non-writing times leveling process area.

When the write protect area and the non-write protect area are to be changed, though not particularly limited, a value of the write protect area setting register WproReg is rewritten from the NOR interface NOR IF, thereby changing the write protect area and the non-write protect area. Though not particularly limited, a whole area of the flash memory FLASH_CHIP serves as a non-write protect area just after power-on.

Writing is not performed in the write protect area, and writing can be performed in the non-write protect area.

The NOR interface in the memory module MSM includes a synchronous NOR interface which operates in synchronization with a clock signal CLK and an asynchronous NOR interface which does not synchronize with the clock signal CLK, and it operates through either of these NOR interfaces. Though not particularly limited, the memory module MSM operates through the asynchronous NOR interface just after power-on.

Though not particularly limited, the address conversion circuit DSTR can realize various types of address conversion method (easy index conversion, index bit shift conversion, and index calculation) and it operates by either of these address conversion methods. Though not particularly limited, just after power-on, the address conversion circuit DSTR operates by an index calculation method.

Though not particularly limited, the NOR interface in the memory module MSM and the address conversion method can be changed by rewriting the value in the reading mode setting register RModeReg from the NOR interface NOR IF.

As described above, it is possible to independently set the synchronous NOR interface and the asynchronous NOR interface, the address conversion method, the cache area and the non-cache area, the cache lock area and the non-cache lock area, the writing times leveling process area and the non-writing times leveling process area, and the write protect area and the non-write protect area. Therefore, the setting corresponding to the system can be freely selected by a user.

(Description of Normal Operation)

Data transfer between the flash memory FLASH_CHIP and the data processing device CPU_CHIP after the power-on sequence at a power-on time has been terminated will be described.

Operation when the data processing device CPU_CHIP inputs a read request through the NOR interface NOR IF will be first described.

When the data processing device CPU_CHIP inputs a read command and an address RADD through the NOR interface (NOR IF) into the control circuit CT_CHIP, the NOR interface circuit NRIF in the control circuit CT_CHIP retains the read command and the address. The read command and the address RADD retained in the NOR interface circuit NRIF are inputted into the memory address management circuit MMG, the access arbitration circuit ARB, and the address conversion circuit DSTR.

The memory address management circuit MMG compares address data showing a cache area retained in the register block REG and the address RADD with each other.

When the address RADD is out of the range of the cache area, cache area range outside data is sent by the NOR interface NOR IF from the memory address management circuit MMG to the data processing device CPU_CHIP via the NOR interface circuit NRIF.

The access arbitration circuit arbitrates between a read request inputted from the NOR interface circuit NRIF and a read or write request from the NAND interface circuit NDIF.

First, when a read request is inputted from the NOR interface circuit NRIF to the access arbitration circuit, the access arbitration circuit checks whether or not there is a read or write request from the NAND interface circuit NDIF or whether or not operation to the read or write request from the NAND interface circuit NDIF is in execution.

When a read or write request from the NAND interface circuit NDIF has been issued but an operation to this request has not been performed, a read or write request from the NAND interface circuit NDIF is postponed and the read request from the NOR interface circuit NRIF is preferentially permitted.

When operation to a read or write request from the NAND interface circuit NDIF is in execution, the operation in execution is temporarily interrupted and the read request from the NOR interface circuit NRIF is preferentially permitted.

When read and write requests are inputted from the NAND interface circuit NDIF to the access arbitration circuit, the access arbitration circuit checks whether or not a read or write request from the NOR interface circuit NRIF is present or whether or not an operation to the read or write request from the NOR interface circuit NRIF is in execution.

When the operation to the read or write request from the NOR interface circuit NRIF is in execution, after the operation has been completed, the read or write request from the NAND interface circuit NDIF is permitted.

When no read or write request from the NOR interface circuit NRIF is present, the read or write request from the NAND interface circuit NDIF is permitted.

The address conversion circuit converts the address RADD into address MRADD in order to improve occupation rates and hit rates of the cache memories L2Cache, PL2A, and PL2B.

The address MRADD obtained through the conversion in the address conversion circuit is inputted into the cache memory L2Cache and the prefetch control circuit PREF.

In the cache memory L2Cache, a hit determination whether or not data designated by the address MRADD is present in the cache memory L2Cache is first performed. The case where the data designated by the address MRADD is present in the cache memory L2Cache means L2Cache hit, and the case where the data is not present means L2Cache miss.

In a hit determination circuit PL2Hit in the prefetch control circuit PREF, a hit determination whether or not the data designated by the address MRADD is present in the cache memory PL2A or PL2B is preformed.

The case where the data designated by the address MRADD is present in the cache memory PL2A or PL2B means PL2 hit, and the case where the data is not present means PL2 miss.

Also, in a hit determination circuit L3Hit in the prefetch control circuit PREF, a hit determination whether or not data designated by the address MRADD is present in the data register DREG in the flash memory FLASH_CHIP is performed.

The case where the data designated by the address MRADD is present in the data register DREG in the flash memory FLASH_CHIP means L3 hit, and the case where the data is not present means L3 miss.

(Operation in L2Cache Hit)

In case of the L2Cache hit, data is directly outputted from the cache memory L2Cache to the data processing device CPU_CHIP through the NOR interface circuit NRIF and the NOR interface NOR IF.

When a Wait signal becomes Low, the data processing device CPU_CHIP knows the arrival of requested data and takes in the requested data.

That is, in the case of L2Cache hit, it is unnecessary to perform data transfer from the flash memory FLASH_CHIP to the cache memory L2Cache, and data can be read directly from the cache memory L2Cache. Therefore, data transfer can be performed at high speed.

(Operation in PL2 Hit)

In the case of L2Cache miss and PL2 hit, data is directly outputted from either of the cache memories PL2A and PL2B, and the data is outputted to the data processing device CPU_CHIP through the NOR interface circuit NRIF and the NOR interface NOR IF. At that time, a reading time is equal to a reading time from the L2Cache.

That is, in the case of PL2 hit, it is unnecessary to perform data transfer from the flash memory FLASH_CHIP to cache memories PL2A and PL2B, and data can be directly read from the cache memory PL2A or PL2B. Therefore, data transfer can be performed at high speed.

In the case of a hit in the cache memories L2Cache, PL2A and PL2B as described above, data can be directly outputted from the cache memories L2Cache, PL2A and PL2B, and data transfer between the data processing device CPU_CHIP and the memory module MSM can be performed at high speed.

(Operation in L2Cache Miss, PL2 Miss, and L3 Hit)

Next, data transfer in the case of L2Cache miss, PL2 miss, and L3 hit will be described.

In the case of L2Cache miss, PL2 miss, and L3 hit, when a read request from the NOR interface circuit NRIF is permitted in the access arbitration circuit, the control circuit RWCL inputs a read request of the $N^{th}$ page data to the control circuit FCNT, and the $N^{th}$ page data in the data register DREG is transferred to the buffer circuit BUF.

By utilizing a time period where the $N^{th}$ page data in the data register DREG is being transferred to the buffer circuit BUF, data currently retained in the cache memories PL2A and PL2B are transferred to the cache memory L2Cache to update the cache memory L2Cache.

The $N^{th}$ page data transferred to the buffer circuit BUF is subjected to error detection in the error detection and correction circuit ECC. When the $N^{th}$ page data transferred to the buffer circuit BUF contains no error, the $N^{th}$ page data is transferred to the cache memory PL2A by the control circuit RWCL. On the other hand, when the $N^{th}$ page data contains any error, after the error correction in the error detection and correction circuit ECC, the $N^{th}$ page data is transferred to the cache memory PL2A by the control circuit RWCL. The data requested by the data processing device CPU_CHIP in the $N^{th}$ page data transferred to the cache memory PL2A is outputted to the data processing device CPU_CHIP through the NOR interface circuit NRIF and the NOR interface NOR IF.

Though not particularly limited, Wait signal is kept at High until the data is outputted, and the data processing device CPU_CHIP waits for arrival of the data. When the Wait signal becomes Low, the data processing device CPU_CHIP knows the arrival of the requested data and takes it therein.

Further, when the pre-reading instruction circuit PRECT instructs the control circuit RWCL to perform data pre-reading, the control circuit RWCL inputs a read request to the control circuit FCNT, and the next page data in the data register DREG, namely, the $(N+1)^{th}$ page data is transferred to the buffer circuit BUF.

Though not particularly limited, the $(N+1)^{th}$ page data transferred to the buffer circuit BUF is subjected to error detection for each 512 B in the error detection and correction circuit ECC. When the $(N+1)^{th}$ page data transferred to the buffer circuit BUF contains no error, the $(N+1)^{th}$ page data is transferred to cache memory PL2A by the control circuit RWCL. However, when the $(N+1)^{th}$ page data contains any error, after the error correction in the error detection and correction circuit ECC, the $(N+1)^{th}$ page data is transferred to the cache memory PL2B by the control circuit RWCL. In the case of a hit in the data register DREG in the flash memory FLASH_CHIP, it is unnecessary to perform data transfer from the memory cell array MARY to the data register DREG, and data can be directly read from the data register DREG. Therefore, data can be transferred at high speed.

By utilizing the data register DREG in the flash memory FLASH_CHIP as a cache memory as described above, a cache memory capacity can be effectively increased and a hit rate can be improved. Consequently, data transfer between the data processing device CPU_CHIP and the memory module MSM can be performed at high speed.

Further, since the next page data of data requested by the data processing device CPU_CHIP is transferred to the cache memory PL2B in advance by means of the data pre-reading function, the hit rate of the cache memory can be improved and data transfer can be made faster.

(Operation in L2Cache Miss, PL2 Miss, and L3 Miss)

Data transfer operation in the case of L2Cache miss, PL2 miss and L3 miss will be described.

When a read request from the NOR interface circuit NRIF is permitted in the access arbitration circuit, first, the control circuit RWCL inputs a read request of the $N^{th}$ page data into the control circuit FCNT. The control circuit FCNT transfers the $N^{th}$ page data in the memory cell array MARY to the data register DREG. Next, the data register DREG outputs the $N^{th}$ page data to the control circuit RWCL. The control circuit RWCL transfers the data to the buffer circuit BUF.

During data transfer from the data register DREG to the buffer circuit BUF, data currently retained in the cache memories PL2A and PL2B are transferred to the cache memory L2Cache to update the cache memory L2Cache.

Though not particularly limited, the $N^{th}$ page data transferred to the buffer circuit BUF is subjected to error detection for each 512 B in the error detection and correction circuit ECC. When the $N^{th}$ page data transferred to the buffer circuit BUF contains no error, the $N^{th}$ page data is transferred to the cache memory PL2A by the control circuit RWCL. However, when the $N^{th}$ page data contains any error, after the error correction in the error detection and correction circuit ECC, the $N^{th}$ page data is transferred to the cache memory PL2A by the control circuit RWCL. The data requested by the data processing device CPU_CHIP in the $N^{th}$ page data transferred to the cache memory PL2A is outputted to the data processing device CPU_CHIP through the NOR interface circuit NRIF and the NOR interface NOR IF.

Though not particularly limited, the Wait signal is kept at High until data is outputted, and the data processing device CPU_CHIP waits for arrival of data.

Further, when the pre-reading instruction circuit PRECT instructs the control circuit RWCL to perform data pre-reading, the control circuit RWCL inputs a read request to the control circuit FCNT to transfer the next page data in the data register DREG, namely, the $(N+1)^{th}$ page data to the buffer circuit BUF.

Though not particularly limited, the $(N+1)^{th}$ page data transferred to the buffer circuit BUF is subjected to error detection for each 512 B in the error detection and correction circuit ECC. When the $(N+1)^{th}$ page data transferred to the buffer circuit BUF contains no error, the $(N+1)^{th}$ page data is transferred to the cache memory PL2B by the control circuit RWCL. However, when the $(N+1)^{th}$ page data contains any error, after the error correction in the error detection and correction circuit ECC, the $(N+1)^{th}$ page data is transferred to the cache memory PL2B by the control circuit RWCL.

Also, the data transferred to the data register DREG is retained as it is, and the data register DREG is utilized as a cache memory.

Further, since the next page data of $N^{th}$ page data requested by the data processing device CPU_CHIP, namely, $(N+1)^{th}$ page data is transferred to the cache memory PL2B in advance by means of the data pre-reading function, the hit rate can be improved and data transfer can be made faster.

By utilizing the data register DREG in the flash memory FLASH_CHIP as a cache memory to obtain the hit in the data register DREG as described above, it is unnecessary to directly perform data transfer from the memory cell array MARY to the data register DREG. Consequently, a high speed data transfer can be realized.

Further, by transferring the next page data of the data requested by the data processing device CPU_CHIP to the cache memory PL2B in advance by means of the data pre-reading function, the hit rate can be improved and data transfer can be made faster.

Further, since data update from the cache memories PL2A and PL2B to the cache memory L2Cache is performed simultaneously with data transfer from the data register DREG to the buffer circuit BUF performed at a time of L2Cache miss and PL2 miss, data update time to the cache memory L2Cache is hidden and efficient data transfer can be realized.
(Description of Read Operation from NAND Interface NAND IF1)

Next, an operation performed when the data processing device CPU_CHIP inputs a read request from the NAND interface NAND IF1 will be described.

When a read request from the NAND interface circuit NDIF is permitted by the access arbitration circuit ARB, first, the control circuit RWCL inputs a data read request into the control circuit FCNT. The control circuit FCNT transfers data in the memory cell array MARY into the data register DREG. Next, the data register DREG outputs the data thereof to the control circuit RWCL. The control circuit RWCL transfers the data to the buffer circuit BUF.

The data transferred to the buffer circuit BUF is subjected to error detection in the error detection and correction circuit ECC. When the data transferred to the buffer circuit BUF contains no error, the data is transferred to the read buffer circuit RBUF by the control circuit RWCL. However, when the data contains any error, after the error correction in the error detection and correction circuit ECC, the data is transferred to the read buffer RBUF by the control circuit RWCL.

Data required by the data processing device CPU_CHIP in the data transferred to the read buffer RBUF is outputted to the data processing device CPU_CHIP through the NAND interface circuit NDIF and the NAND interface NAND IF1.
(Description of Write Operation from NAND Interface NAND IF1)

Next, an operation performed when the data processing device CPU_CHIP inputs a write request from the NAND interface NAND IF1 will be described.

When a write request, a write address NWADD, and write data NWDATA are inputted in the NAND interface circuit NDIF, the write data NWDATA is transferred to the write buffer WBUF and the write address NWADD is transferred to the address arbitration circuit ARB.

The address arbitration circuit ARB transfers the write address NWADD to the address conversion circuit DSTR. The address conversion circuit DSTR performs arithmetic operation to the address NWADD to convert the same to the address MNWADD and input it into the cache memory L2Cache and the hit determination circuit PL2Hit.

Thereafter, the cache memory L2Cache and the hit determination circuit PL2Hit utilize the address MNWADD to perform a process for maintaining consistency of data with the cache memories L2Cache, PL2A, and PL2B. Specifically, the cache memory L2Cache checks whether or not data of the address MNWADD is present, and if it is present, the cache memory L2Cache invalidates the data. Also, the hit determination circuit PL2Hit checks whether or not the data of address MNWADD is present in the cache memories PL2A and PL2B, and if it is present, the hit determination circuit PL2Hit invalidates the data. When invalidation of data in the cache memories L2Cache, PL2A, and PL2B is terminated, data in the data register DREG is invalidated by the hit determination circuit L3Hit.

When invalidation of all the cache memories is completed, the access arbitration circuit ARB permits the write request from the NAND interface circuit NDIF.

When the write request from the NAND interface circuit NDIF is permitted in the access arbitration circuit ARB, first, the control circuit RWCL inputs a data write request and write data Wdata into the control circuit FCNT. The control circuit FCNT transfers the write data Wdata to the data register DREG, and further writes the data transferred to the data register DREG into the memory cell array MARY.

The replacement processing circuit REP checks whether or not writing into the memory cell array MARY has been succeeded, and if succeeded, the replacement processing circuit REP terminates the process. If the writing has resulted in failure, the replacement processing circuit REP performs the writing to a new address for replacement prepared in the flash memory FLASH_CHIP in advance. When the replacement process is performed, a failure address and address data showing an address to which the replacement process has been performed instead of the failure address has been performed are retained and managed.

The memory address management circuit MMG checks whether or not the write address NWADD is the address in the writing times leveling process area.

When the write address NWADD is the address in the writing times leveling process area, after the data WDATA has been written in the memory cell array MARY, the sum total of the number of writing times and the number of erasing times managed by the writing times leveling circuit WLV is increased by one. Further, when the sum total of the number of writing times and the number of erasing times reaches the sum total threshold value of the number of writing times and the number of erasing times retained by the writing times leveling circuit WLV, the writing times leveling circuit WLV determines that rewritings have been concentrated, and it changes correspondence between physical address and logic address for each 64 page data, though not particularly limited. Then, it retains the data showing the correspondence between physical address and logic address. As described above, the number of rewriting times of the memory array can be leveled by the writing times leveling circuit WLV, and the reliability can be improved.

(Description of Erase Operation from NAND Interface NAND IF1)

Next, operation performed when an erase request is inputted into the data processing device CPU_CHIP from the NAND interface NAND IF1 will be described.

When an erase request and an erase address NEADD are inputted into the NAND interface circuit NDIF, the erase request and the erase address NEADD address are transferred to the arbitration circuit ARB.

The address arbitration circuit ARB transfers the erase address NEADD to the address conversion circuit DSTR. The address conversion circuit DSTR performs arithmetic operation to the address NEADD to convert the address NEADD to an address MNEADD and input it to the cache memory L2Cache and the hit determination circuit PL2Hit.

Thereafter, the cache memory L2Cache and the hit determination circuit PL2Hit utilize the address MNEADD to perform a process for maintaining consistency of data with the cache memories L2Cache, PL2A, and PL2B. Specifically, the cache memory L2Cache checks whether or not data of the address MNEADD is present, and if it is present, the cache memory L2Cache invalidates the data. Also, the hit determination circuit PL2Hit checks whether or not the data of address MNEADD is present in the cache memories PL2A and PL2B, and if it is present, the hit determination circuit PL2Hit invalidates the data. When invalidation of data in the cache memories L2Cache, PL2A, and PL2B is terminated, data in the data register DREG is invalidated by the hit determination circuit L3Hit.

When invalidation of all the cache memories is completed, the access arbitration circuit ARB permits the erase request from the NAND interface circuit NDIF.

When the erase request from the NAND interface circuit NDIF is permitted in the access arbitration circuit ARB, first, the control circuit RWCL inputs a data erase request of and an erase address MNEADD into the control circuit FCNT. The control circuit FCNT erases data in the memory cell array MARY in accordance with the erase request and the erase address MNEADD.

Further, the memory address management circuit MMG checks whether or not the erase address NEADD is an address in the writing times leveling process area.

When the erase address NEADD is the address in the writing times leveling process area, after the data in the memory cell array MARY has been erased, the sum total of the number of writing times and the number of erasing times managed by the writing times leveling circuit WLV is increased by one. Further, when the sum total of the number of writing times and the number of erasing times reaches the sum total threshold value of the number of writing times and the number of erasing times retained by the writing times leveling circuit WLV, the writing times leveling circuit WLV determines that rewritings have been concentrated, and it changes correspondence between physical address and logic address for each 64 page data, though not particularly limited. Then, it retains the data showing the correspondence between physical address and logic address. As described above, the number of rewriting times of the memory array can be leveled by the writing times leveling circuit WLV, and the reliability can be improved.

Note that, in FIG. 1, the error detection and correction circuit ECC, the replacement processing circuit REP, and the writing times leveling circuit WLV are provided in the control circuit CT_CHIP. However, it is of course possible to provide them in the flash memory FLASH_CHIP so that the error detection, the error correction, the address replacement process, and the writing times leveling process are performed on the side of the flash memory FLASH_CHIP.

(Description of Write Operation from NOR Interface NOR IF)

Next, operation performed when a write request is inputted into the data processing device CPU_CHIP from the NOR interface NOR IF will be described.

Though not particularly limited, when a write request, a write address NORWADD, and write data NORWDATA are inputted into the NOR interface circuit NRIF, the write data NWDATA is transferred to the write buffer WBUF through the flash control circuit FLCT, and the write address NORWADD is transferred to the arbitration circuit ARB through the NAND interface circuit NDIF. Thereafter, the memory module MSM operates in the same manner as the case where a write request is inputted into the NAND interface NAND IF1.

By delivering the write address NORWADD and the write data NORWDATA from the NOR interface NOR IF to the NAND interface circuit NDIF in this manner, write operation from the NOR interface NOR IF can be realized.

(Description of Erase Operation from NOR Interface NOR IF)

Next, operation performed when an erase request is inputted into the data processing device CPU_CHIP from the NOR interface NOR IF will be described.

Though not particularly limited, when an erase request and an erase address NOREADD are inputted into the NOR interface circuit NRIF, the erase address NOREADD is transferred to the arbitration circuit ARB through the NAND interface circuit NDIF.

Thereafter, the memory module MSM operates in the same manner as the case where the erase request is inputted into the NAND interface NAND IF1 described above.

By delivering the erase address NOREADD from the NOR interface NOR IF to the NAND interface circuit NDIF in this manner, an erase operation from the NOR interface NOR IF can be realized.

Though not particularly limited, the clock control circuit OSC starts a clock operation at the time of starting the data transfer in the memory module MSM just after power-on operation and at the time of starting data transfer performed when access to the memory module MSM from the NOR interface NOR IF and NAND interface occurs, and it stops the clock operation at the time when the data transfer has been terminated.

As described above, since the clock control circuit OSC operates only when it is required for data transfer, it is possible to achieve the low power consumption.

Effect of First Embodiment

As described above, by following the NOR interface and the NAND interface system and automatically transferring the boot program in the flash memory FLASH_CHIP to the cache memory L2Cache just after power-on operation, the data processing device CPU_CHIP can start up itself rapidly by using this boot program. Further, by automatically transferring data in the flash memory FLASH_CHIP to the cache memory L2Cache during the time when the data processing device CPU_CHIP is starting up, the data processing device CPU_CHIP can access the memory module MSM immediately when the data processing device CPU_CHIP has started up. Therefore, the performance improvement can be achieved. An address map in the flash memory can be set. Also, it is possible to independently set the synchronous NOR interface and the asynchronous NOR interface, the address conversion method, the cache area and the non-cache area, the cache lock area and the non-cache lock area, the writing times leveling process area and the non-writing times leveling process area, and the write protect area and the non-write protect area. Therefore, setting corresponding to the system can be freely selected by a user.

<<Cache Memory>>

Since the data processing device CPU_CHIP can output data directly from the cache memories L2Cache, PL2A, and PL2B incorporated in the memory module MSM, data transfer between the data processing device CPU_CHIP and the memory module MSM can be performed at high speed. It is possible to select the address conversion circuit and the address conversion. Since the address conversion circuit performs address conversion so that read addresses inputted from the data processing device CPU_CHIP are distributed to index addresses in the cache memory L2Cache, occupation rates or hit rates of the cache memories L2Cache, PL2A, and PL2B can be improved and data transfer can be made faster.

<<Pre-Reading>>

Further, by transferring the next page data of data currently requested by the data processing device CPU_CHIP to the cache memory in advance by means of the data pre-reading function, the hit rate of the cache memory can be increased and data transfer can be made faster.

<<L3Cache>>

By utilizing the data register DREG in the flash memory FLASH_CHIP as a cache memory, a cache memory capacity can be effectively increased and a hit rate can be improved. Consequently, data transfer between the data processing device CPU_CHIP and the memory module MSM can be performed at high speed.

<<Update of Cache Data>>

Further, since data update from the cache memories PL2A and PL2B to the cache memory L2Cache is performed simultaneously with data transfer from the data register DREG to the buffer circuit BUF performed at a time of L2Cache miss and PL2 miss, data update time to the cache memory L2Cache is hidden and efficient data transfer can be realized.

<<Error Detection and Correction, and Address Replacement Process>>

Since error detection and error correction are performed inside the memory module MSM at the time of reading from the FLASH and the replacement process to a failure address where writing has not been performed correctly is performed at a time of writing thereto, the process can be made faster and reliability can be kept high.

<<Leveling of Number of Writing Times>>

Since the number of rewriting times in the memory array can be leveled by the writing times leveling circuit WLV, the reliability can be further improved.

<<Wait Signal>>

The data processing device CPU_CHIP can know the arrival of requested data from a Wait signal, and it can take in the requested data reliably in accordance with a hit determination for the cache memory L2Cache and hit determination results in the hit determination circuits PL2Hit and L3Hit, even when a data reading time is different.

In this embodiment, the example that one flash memory is included in the memory module MSM has been described. However, it is needless to say that the present invention can be realized even if a plurality of flash memories are included in the memory module MSM.

(Description of Memory Map)

Figure 2:
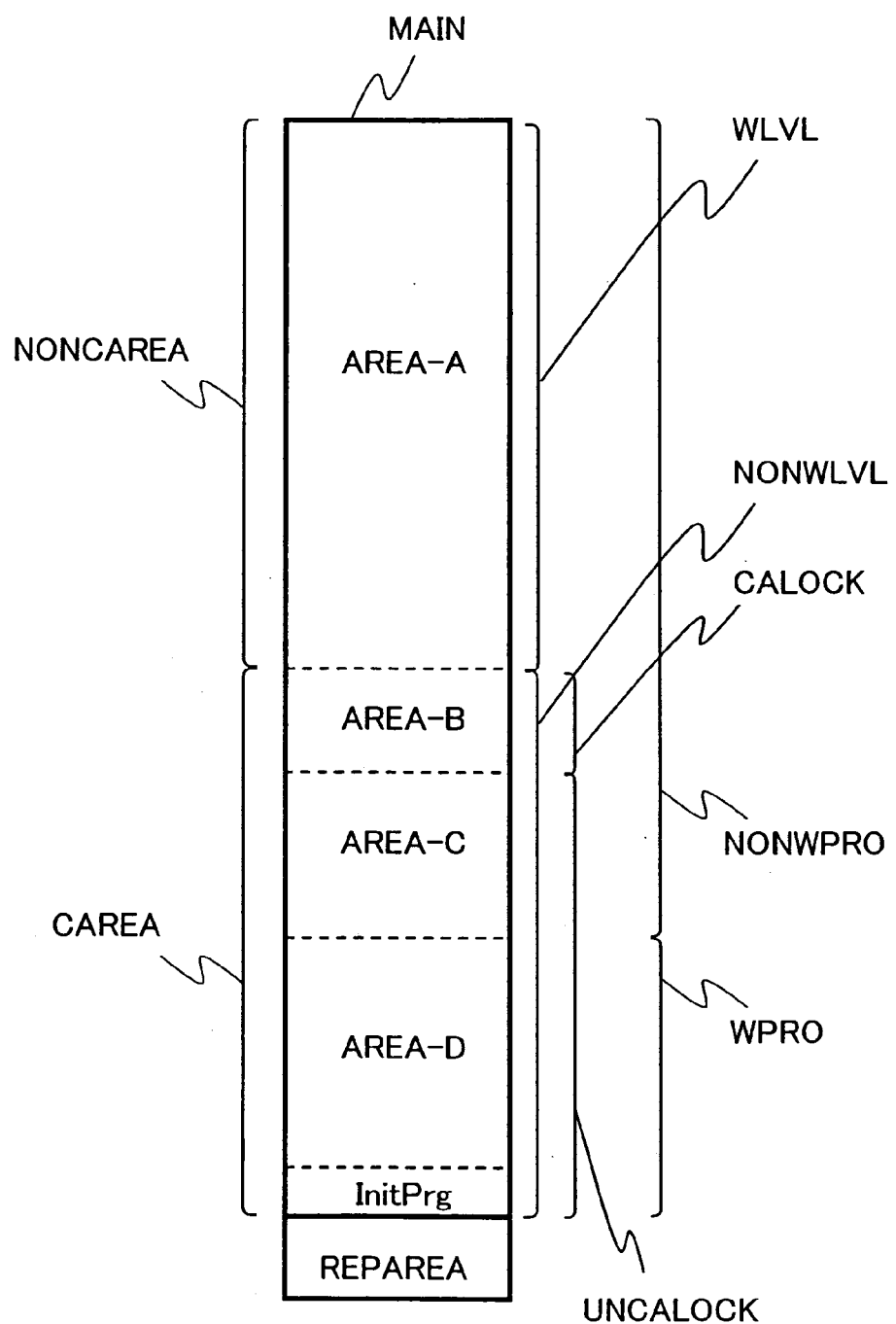
FIG. 2 is an explanatory diagram showing one example of an address map in the memory system to which the present invention is applied.

FIG. 2 shows one example of the memory map to the flash memory FLASH_CHIP managed by the memory address management circuit MMG based upon values in respective registers in the register block REG mode setting register RModeReg, cache area setting register CAreaReg, cache lock area setting register CaLockReg, write protect area setting register WproReg, and writing times leveling process area setting register WlvlReg). In this embodiment, though not particularly limited, a typical memory map will be described with using a memory module in which a storage area of the flash memory FLASH_CHIP is 1 Gbit+32 Mbit (32 Mbit corresponds to a replacement area) as an example.

Though not particularly limited, the flash memory FLASH_CHIP is divided into a main area MAIN and a replacement area REPAREA. Further, the main area MAIN includes an area AREA-A, an area AREA-B, an area AREA-C, an area AREA-D, and an initial program area InitProg.

The area AREA-A is managed as a non-cache area NONCAREA, a writing times leveling process area WLV, and a non-write protect area NONWPRO.

The area AREA-B is managed as a cache area CAREA, a cache lock area CALOCK, a writing times leveling process area WLVL, and a non-write protect area NONWPRO.

The area AREA-C is managed as a cache area CAREA, a non-cache lock area UNCALOCK, a non-writing times leveling process area NONWLV, and a non-write protect area NONWPRO.

The area AREA-D is managed as a cache area CAREA, a non-cache lock area UNCALOCK, a non-writing times leveling process area NONWLV, and a write protect area WPRO.

The initial program area InitProg is managed as a cache area CAREA, a non-cache lock area UNCALOCK, a non-writing times leveling process area NONWLV, and a write protect area WPRO.

Though not particularly limited, the boot program and the automatic transfer area designating data are stored in the initial program area InitProg.

Though not particularly limited, an operating system and the like are stored in the area AREA-D.

Though not particularly limited, application programs are stored in the areas AREA-B and AREA-C.

Though not particularly limited, such data as music data, voice data, moving picture data, still image data are stored in the area AREA-A.

When rewriting is repeated in the FLASH, the reliability thereof degraded, and such an event that data written in the flash memory in a write operation is changed when it is read out in a read operation or data is not written in a rewrite operation occurs rarely. The replacement area REPAREA is provided for replacing such failure program and data into a new area. Though not particularly limited, it is preferable that the size of the replacement area REPAREA is determined so that reliability that the flash memory FLASH_CHIP ensures can be achieved.

The cache area CAREA, the non-cache area NONCAREA, the write protect area WRPRO, the non-write protect area NONWPRO, the writing times leveling process area WLVL, and the non-writing times leveling process area NONWLVL can be respectively set independently by programming them in respective registers in the register block REG from the cache lock area CALOCK, the non-cache lock area UNCALOCK, and the NOR interface NOR IF, and these areas can be arbitrarily selected in accordance with the system on a user side.

(Operation Just after Power-On)

Data transfer from the flash memory FLASH_CHIP to the cache memories L2Cache, PL2A, and PL2B at the time of power-on will be described.

After power-on, the flash control circuit FLCT reads data in the initial program area InitProg of the flash memory FLASH_CHIP to the buffer circuit BUF, and checks whether or not the data includes any error in the error detection and correction circuit ECC. When the data includes no error, the flash control circuit FLCT transfers a boot program in the initial program area to the cache memory PL2A. However, when the data includes an error, the flash control circuit FLCT corrects the error and then transfers a boot program in the initial program area to the cache memory PL2A. Next, the flash control circuit FLCT reads automatic transfer area designating data from the buffer circuit BUF and sequentially reads the data in the flash memory FLASH_CHIP in a range shown by this designating data to the buffer circuit BUF, and then checks whether or not the data include any error in the error detection and correction circuit ECC. If the data includes no error, the flash control circuit FLCT transfers the data to the cache memory L2Cache via the cache memory PL2B. If the data includes any error, the flash control circuit FLCT corrects the error and transfers the data to the cache memory L2Cache via the cache memory PL2B.

By transferring the required data to the cache memory in advance just after power-on as described above, the data processing device CPU_CHIP reads the boot program from the cache memory after the power-on thereof and it can start up itself rapidly. Further, it can perform the initial setting of the dynamic random access memory DRAM_CHIP.

(Description of Read Operation)

Data in the cache area CAREA is retained in the cache memories (L2Cache, PL2A, and PL2B). In the case of a hit in the cache memories (L2Cache, PL2A, and PL2B), data is directly outputted from the cache memories (L2Cache, PL2A, and PL2B) to the data processing device CPU_CHIP through the NOR interface circuit NRIF and the NOR interface NOR IF.

In the case of a miss in the cache memories (L2Cache, PL2A, and PL2B), data is transferred from the flash memory FLASH_CHIP to the cache memories (L2Cache, PL2A, and PL2B). Next, operation for transferring data in the flash memory FLASH_CHIP to the cache memories L2Cache, PL2A, and PL2B will be described.

When a read request from the NOR interface NOR IF is the L2Cache miss, the PL2 miss, and the L3 hit, or the L2Cache miss, the PL2 miss and the L3 miss, data is transferred from the flash memory FLASH_CHIP to the cache memories L2Cache, PL2A, and PL2B.

First, data transfer when a read request from the NOR interface NOR IF is the L2Cache miss, the PL2 miss, and the L3 hit will be described.

When requested data is data in the cache area, the $N^{th}$ page data in the data register DREG of the flash memory FLASH_CHIP is transferred to the buffer circuit BUF.

During the transfer of the data corresponding to one page in the data register DREG to the buffer circuit BUF, the data currently retained in the cache memories PL2A and PL2B is transferred to the cache memory L2Cache to update the cache memory L2Cache.

Whether or not the $N^{th}$ page data transferred to the buffer circuit BUF includes any error is checked in the error detection and correction circuit ECC. When the data include no error, the data is directly transferred to the cache memory PL2A. If the data includes any error, data which has been subjected to error correction is transferred to the cache memory PL2A.

Further, the next page data in the data register DREG, namely, the $(N+1)^{th}$ page data is transferred to the buffer circuit BUF by means of the pre-reading function.

Whether or not the $(N+1)^{th}$ page data transferred to the buffer circuit BUF includes any error is checked in the error detection and correction circuit ECC. If the data includes no error, it is directly transferred to the cache memory PL2B. If the data includes any error, data which has been subjected to error correction is transferred to the cache memory PL2B.

Next, data transfer when a read request from the NOR interface NOR IF is the L2Cache miss, the PL2 miss, and the L3 miss will be described.

When an address of the read request is in the cache area, the $N^{th}$ page data in the memory cell array MARY of the flash memory FLASH_CHIP is transferred to the data register DREG. Thereafter, the $N^{th}$ page data in the data register DREG is transferred to the buffer circuit BUF.

During the transfer of the data in the data register DREG to the buffer circuit BUF, data currently retained in the cache memories PL2A and PL2B is transferred to the cache memory L2Cache to update the cache memory L2Cache.

Whether or not the $N^{th}$ page data transferred to the buffer circuit BUF includes any error is checked in the error detection and correction circuit ECC. When the data includes no error, it is directly transferred to the cache memory PL2A. If the data includes any error, the data which has been subjected to error correction is transferred to the cache memory PL2A.

Further, the next page data in the data register DREG, namely, the $(N+1)^{th}$ page data is transferred to the buffer circuit BUF by means of the pre-reading function.

Whether or not the $(N+1)^{th}$ page data transferred to the buffer circuit BUF includes any error is checked in the error detection and correction circuit ECC. If the data includes no error, it is directly transferred to the cache memory PL2B. If the data includes any error, data which has been subjected to error correction is transferred to the cache memory PL2B.

When a read request from the NOR interface NOR IF is the L2Cache hit, data is directly read from the cache memory L2Cache. Further, when a read request from the NOR interface NOR IF is the PL2 hit, data is directly read from the cache memory PL2 or PL2B.

(Description of Effect)

<<Cache Memory>>

Date in the cache area is transferred to the cache memories (L2Cache, PL2A, and PL2B), and when a read request from the data processing device CPU_CHIP is hit in the cache memories (L2Cache, PL2A, and PL2B), since data can be directly outputted from the cache memories (L2Cache, PL2A, and PL2B), data transfer between the data processing device CPU_CHIP and the memory module MSM can be performed at high speed.

<<Pre-Reading>>

By transferring the next page data of data currently requested by the data processing device CPU_CHIP to the cache memory in advance by means of the data pre-reading function, the hit rate of the cache memory is increased and data transfer can be made faster.

<<L3Cache>>

By utilizing the data register DREG in the flash memory FLASH_CHIP as a cache memory, the capacity of the cache memory can be effectively increased and thus the hit rate can be improved. Consequently, data transfer between the data processing device CPU_CHIP and the memory module MSM can be performed at high speed.

<<Address Replacement Process>>

A replacement process for a failure address to which writing has not been performed correctly can be performed to a replacement processing area REPAREA at the time of data writing to the flash memory FLASH_CHIP. Consequently, the reliability can be improved.

(Description of Register Block)

Figure 3:
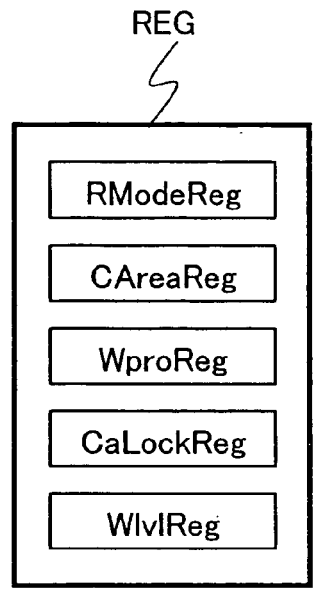
FIG. 3 is an explanatory diagram showing one example of a register block in the memory system to which the present invention is applied.

FIG. 3 is a block diagram of one example showing a plurality of registers which form the register block REG.

Though not particularly limited, the register block REG is composed of a reading mode setting register RModeReg, a cache area setting register CAreaReg, a cache lock area setting register CaLockReg, a write protect area setting register WproReg, and a writing times leveling process area setting register WlvlReg.

When the cache area and the non-cache area are to be changed, though not particularly limited, a value in the cache area setting register CAreaReg is rewritten from the NOR interface NOR IF, thereby changing the cache area and the non-cache area. Though not particularly limited, a whole area in the flash memory FLASH_CHIP serves as a cache area just after the power-on.

Data in the cache area is transferred to the cache memories L2Cache, PL2A, and PL2B, and data in the non-cache area is not transferred to the cache memories L2Cache, PL2A, and PL2B.

When the cache lock area and the non-cache lock area are to be changed, though not particularly limited, a value in the cache area setting register CAreaReg is rewritten from the NOR interface NOR IF, thereby changing the cache lock area and the non-cache lock area. Though not particularly limited, a whole area of the flash memory FLASH_CHIP serves as a non-cache lock area just after power-on.

When data in the cache lock area is transferred to the cache memory L2Cache, the data can be present in the cache memory L2Cache until the cache area setting register is rewritten in response to a cache lock release command. Also, data in the non-cache lock area may be ejected from the cache memory L2Cache.

When the writing times leveling process area and the non-writing times leveling process area are to be changed, though not particularly limited, a value in the writing times leveling process area setting register WlvlReg is rewritten from the NOR interface NOR IF, thereby changing the writing times leveling process area and the non-writing times leveling process area. Though not particularly limited, half of a whole area of the flash memory FLASH_CHIP serves as the writing times leveling process area just after power-on.

When the writing times leveling circuit WLV determines that rewritings have been concentrated, a writing times leveling process is performed to the data in the writing times leveling process area.

The writing times leveling process is not performed to the data in the non-writing times leveling process area.

When the write protect area and the non-write protect area are to be changed, though not particularly limited, a value of the write protect area setting register WproReg is rewritten from the NOR interface NOR IF, thereby changing the write protect area and the non-write protect area. Though not particularly limited, a whole area of the flash memory FLASH_CHIP serves as a non-write protect area just after power-on.

Writing is not performed in the write protect area, and writing can be performed in the non-write protect area.

The NOR interface in the memory module MSM includes a synchronous NOR interface which operates in synchronization with a clock signal CLK and an asynchronous NOR interface which does not synchronize with the clock signal CLK, and it operates through either of these NOR interfaces. Though not particularly limited, the memory module MSM operates through the asynchronous NOR interface just after power-on. Further, when the NOR interface provided in the memory module MSM is to be changed, though not particularly limited, a value in the reading mode setting register RModeReg is rewritten from the NOR interface NOR IF, thereby changing the NOR interface to the synchronous NOR interface or the asynchronous NOR interface.

Though not particularly limited, the address conversion circuit DSTR can realize various types of address conversion method (easy index conversion, index bit shift conversion, and index calculation) and it operates by either of these address conversion methods. Though not particularly limited, just after power-on, the address conversion circuit DSTR operates by an index calculation method.

Though not particularly limited, the NOR interface in the memory module MSM and the address conversion method can be changed by rewriting the value in the reading mode setting register RModeReg from the NOR interface NOR IF.

As described above, it is possible to independently set the synchronous NOR interface and the asynchronous NOR interface, the address conversion method, the cache area and the non-cache area, the cache lock area and the non-cache lock area, the writing times leveling process area and the non-writing times leveling process area, and the write protect area and the non-write protect area. Therefore, the setting corresponding to the system can be freely selected by a user.

(Initial Sequence at the Time of Power-On)

Figure 4:
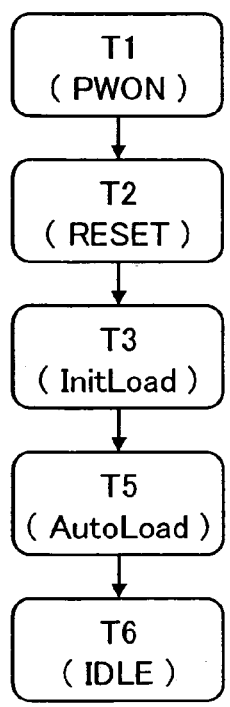
FIG. 4 is a diagram showing one example of an operation at the time of power-on of the memory system to which the present invention is applied.

FIG. 4 is a diagram showing an initial sequence at the time of power-on of the memory module MSM.

Power is ON to the control circuit CT_CHIP, the flash memory FLASH_CHIP, the dynamic random access memory DRAM_CHIP in a period of T1 (PWON), and reset is performed in a period of T2 (RESET). Data in the initial program area InitProg in the FLASH_CHIP is transferred to the control circuit CT_CHIP in the next period of T3 where the reset has been released (Initload). Data in a range designated by the automatic transfer area designating data in the initial program area is transferred from the flash memory FLASH_CHIP to the control circuit CT_CHIP in a period of T4 (AutoLoad). When transfer of the data in the range designated by the automatic transfer area designating data is terminated, an initial operation completion signal PCMP is set to High. The memory module MSM becomes idle in a period of T5 (IDLE) and thereafter, and it is put into a state of waiting for a request from the data processing device CPU_CHIP.

(Address Conversion: Straight)

Figure 6A:
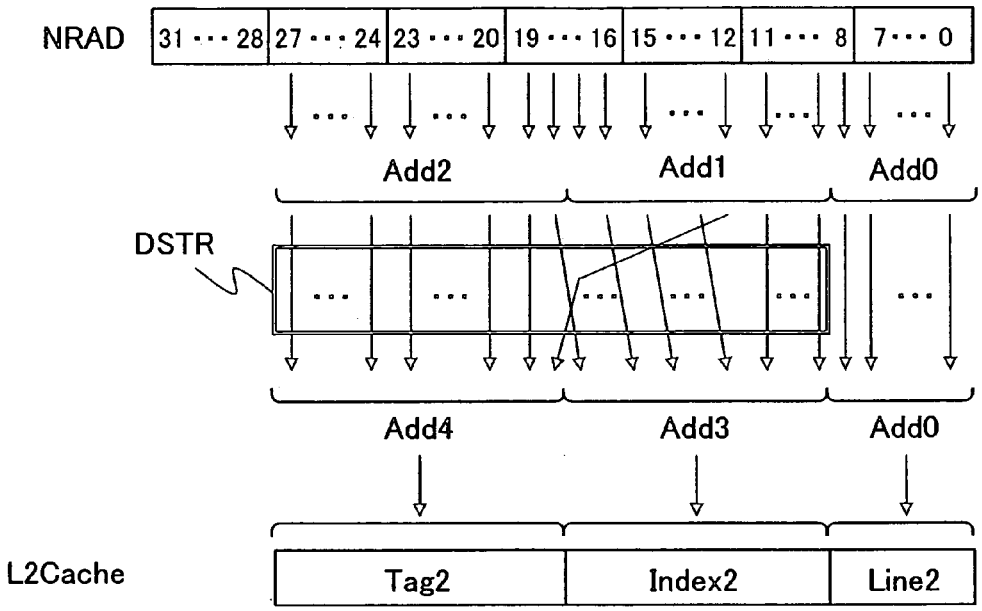
FIG. 6A is a diagram showing one example of an address conversion in the memory system to which the present invention is applied.
Figure 6B:
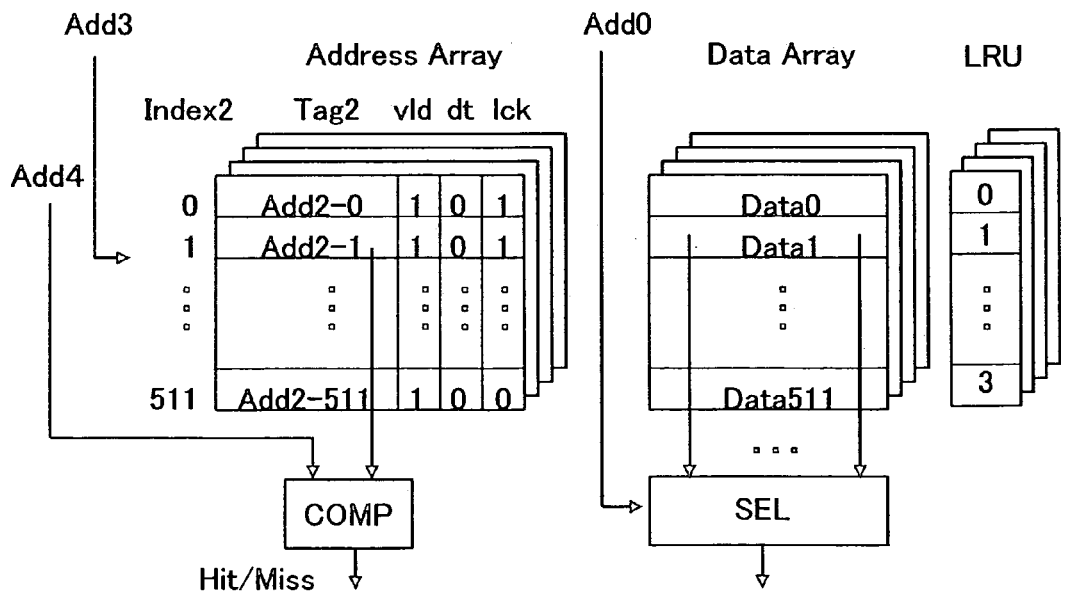
FIG. 6B is a diagram showing one example of a cache memory in the memory system to which the present invention is applied.
Figure 7:
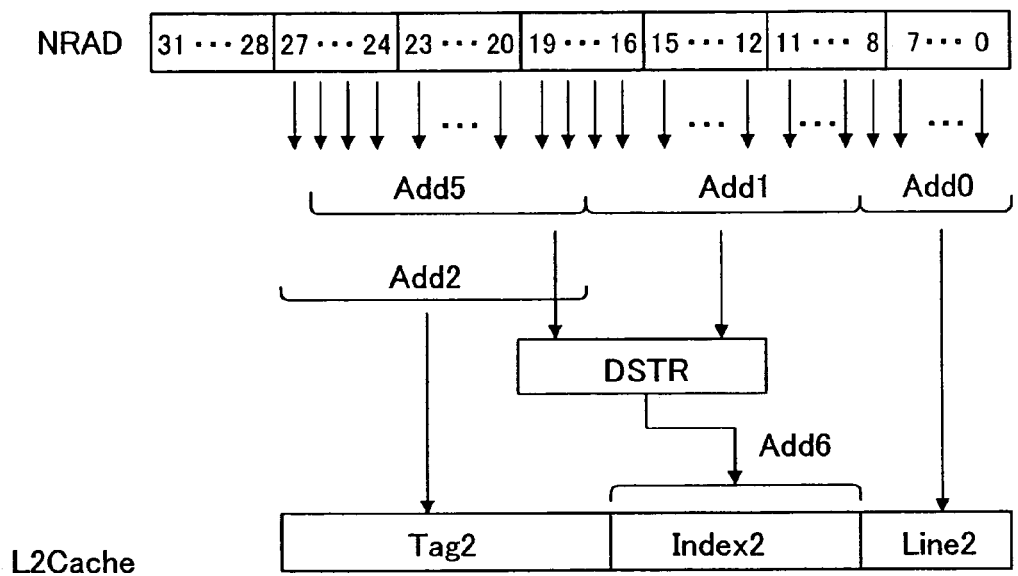
FIG. 7 is a diagram showing one example of an address conversion in the memory system to which the present invention is applied.
Figure 7:
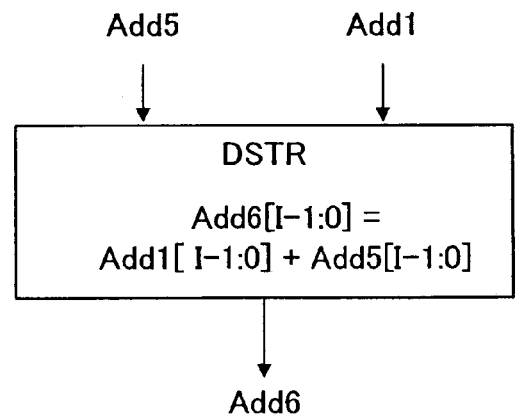

FIG. 5 to FIG. 7 are diagrams showing one example of address conversion between an address from the NOR interface NOR IF and an address in the cache memory L2Cache performed by the address conversion circuit DSTR.

Figure 5A:
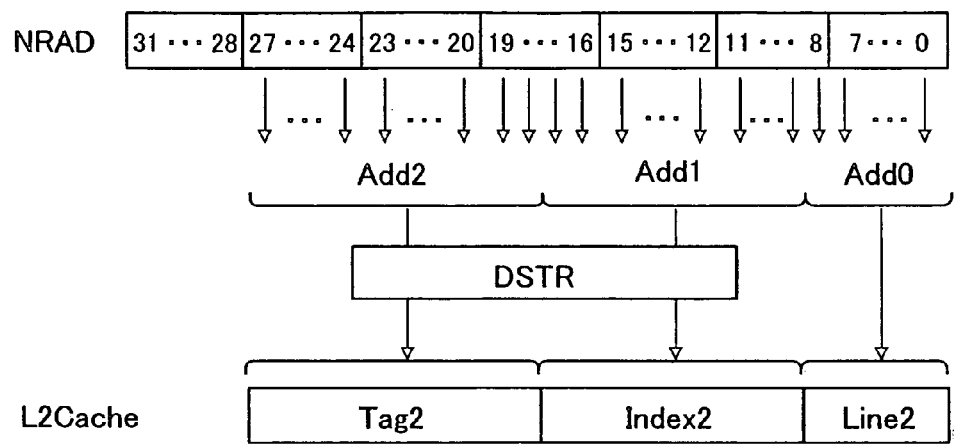
FIG. 5A is a diagram showing one example of an address conversion in the memory system to which the present invention is applied.
Figure 5B:
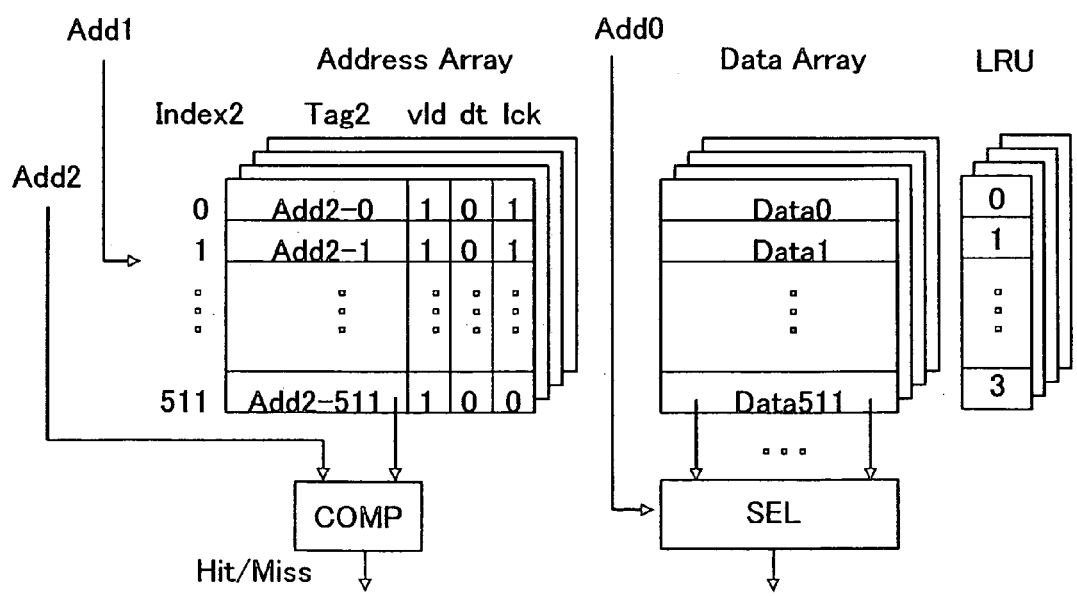
FIG. 5B is a diagram showing one example of a cache memory in the memory system to which the present invention is applied.

FIG. 5A and FIG. 5B will be first described. FIG. 5A is a diagram showing one example of an address conversion method between an address from the NOR interface NOR IF and an address in the cache memory L2Cache, and FIG. 5B is a diagram showing one example of a configuration of the cache memory L2Cache.

Though not particularly limited, the cache memory L2Cache has a capacity of 1 Mbytes, a line size of 512 bytes, an index address from 0 to 511, and a set associative of a four-way set associative.

The address NRAD from the NOR interface NOR IF includes 32 bits from 0 to 31 and can correspond to an address space with at most 4 Gbytes.

In this example, a case where the capacity of the flash memory FLASH_CHIP is 256 Mbytes will be described.

An address Add0 of the $0^{th}$ to $8^{th}$ bits in the address NRAD corresponds to a line size in the cache memory L2Cache, an address Add1 of the $9^{th}$ to $17^{th}$ bits corresponds to an index address Index2 in the cache memory L2Cache, and an address Add2 of the $18^{th}$ to the $27^{th}$ bits corresponds to a tag address Tag2 in the cache memory L2Cache.

Next, operation of the cache memory L2Cache when the value of the address Add1 is 511 and the value of the address Add2 is Add2-511 will be described.

The index address Index2 in the cache memory L2Cache is retrieved by utilizing the address Add1, and four kinds of tag addresses are selected because it is four-way set associative.

The comparison circuit COMP compares the address Add2 and the selected tag addresses with each other. Since the address Add2 coincides with the tag address at the Add2-511, namely, is hit, data Data 511 is selected from the data array.

Finally, the address Add0 is inputted to the selection circuit SEL and it outputs one byte in 512-bytes data Data1.
(Address Conversion: Bit Shift)

Next, FIG. 6A and FIG. 6B will be described. FIG. 6A is a diagram showing one example of an address conversion process between an address from the NOR interface NOR IF and an address in the cache memory L2Cache, and FIG. 6B is a diagram showing one example of a configuration of the cache memory L2Cache.

Though not particularly limited, the configuration of the cache memory L2Cache is similar to that shown in FIG. 5B.

The address NRAD from the NOR interface NOR IF includes 32 bits from 0 to 31 and can correspond to an address space with at most 4 Gbytes.

In this example, a case where the capacity of the flash memory FLASH_CHIP is 256 Mbytes will be described.

An address Add0 of the $0^{th}$ to $8^{th}$ bits in the address NRAD corresponds to a line size Line2 in the cache memory L2Cache.

The $9^{th}$ to $11^{th}$ bits and the $13^{th}$ to $18^{th}$ bits in the address NRAD correspond to the $0^{th}$ to $2^{nd}$ bits and the $3^{rd}$ to $8^{th}$ bits in the address Add3, respectively, which correspond to the index address Index2 in the cache memory L2Cache.

The $12^{th}$ bit and the $19^{th}$ to $27^{th}$ bits in the address NRAD correspond to the $0^{th}$ bit and the $1^{st}$ to $8^{th}$ bits in the address Add4, respectively, which correspond to the tag address Tag2 in the cache memory L2Cache.

Next, operation of the cache memory L2Cache when the value of the address Add3 is 1 and the value of the address Add4 is Add5-1 will be described.

1 of the index address Index2 in the cache memory L2Cache is retrieved by utilizing the address Add3, and four kinds of tag addresses are selected because it is four-way set associative.

The comparison circuit COMP compares the address Add4 and the selected tag addresses with each other. Since the address Add4 coincides with the tag address at the Add5-1, namely, is hit, data Data0 is selected from the data array.

Finally, the address Add0 is inputted to the selection circuit SEL and it outputs one byte in 512-bytes data Data0.
(Address Conversion: Distribution)

Next, FIG. 7 will be described. FIG. 7 is a diagram showing one example of an address conversion process between an address from the NOR interface NOR IF and an address in the cache memory L2Cache and one example of a configuration of the cache memory L2Cache.

Though not particularly limited, the configuration of the cache memory L2Cache is similar to that shown in FIG. 5B.

The address NRAD from the NOR interface NOR IF includes 32 bits from 0 to 31 and can correspond to an address space with at most 4 Gbytes.

In this example, a case where the capacity of the flash memory FLASH_CHIP is 256 Mbytes will be described.

An address Add0 of the $0^{th}$ to $8^{th}$ bits in the address NRAD corresponds to a line size Line2 in the cache memory L2Cache. An address Add1 of the $9^{th}$ to $17^{th}$ bits and an address Add5 of the $18^{th}$ to $26^{th}$ bits in the address NRAD are converted to an address Add6 by the address conversion circuit DSTR. The address Add6 corresponds to the index address Index2 of the cache memory L2Cache. An address Add2 of the $18^{th}$ to $27^{th}$ bits in the address NRAD corresponds to the tag address Tag2 in the cache memory L2Cache.

The bit width of the address Add1 and the address Add5 are equal to the index address of the cache memory. In the address conversion circuit DSTR, the sum of address Add1[8:0] and address Add5[8:0] is obtained, and the $8^{th}$ bit to the $0^{th}$ bit of the sum are converted to the address Add6[8:0] and then allocated to the index address Index2.

Since the line size, the index address, and the tag address are varied depending on the storage capacity and the configuration of the cache memory, the description is made based on a generalized example.

When the storage capacity of the cache memory L2Cache is $2^N$ bytes, the line size Line2 is L bits, the size of the index address Index2 is I bit, and the size of the tag address Tag2 is (N-I-L) bits, the address NRAD is divided to Add0[L-1:0], Add1[I-1:0] and Add2[N-L-I-1:0] from a lower bit.

Address Add0[L-1:0] corresponds to line size Line2[L-1:0] in the cache memory L2Cache, and address Add2[N-L-I-1:0] corresponds to the tag address Tag2[N-I-1:0] in the cache memory L2Cache. Further, Add1[I-1:0] has the same size as the index address Index2.

When the size of the tag address Tag2 is equal to or larger than the size of the index address Index2, address Add5[I-1:0] is allocated to the same size as that of the index address Index2 from a lower bit of address Add2[N-L-I-1:0].

When the size of the tag address Tag2 is smaller than the size of the index address Index2, address Add2[N-L-I-1:0] becomes Add5[N-L-I-1:0].

When the size of the tag address Tag2 is equal to or larger than the size of the index address Index2, the sum of address Add1[I-1:0] and address Add5[I-1:0] is obtained in the address conversion circuit DSTR, and the $(I-1)^{th}$ bit to the $0^{th}$ bit of the sum are converted to address Add6[I-1:0] and then allocated to index address Index2[I-1:0].

When the size of the tag address Tag2 is smaller than the size of the index address Index2, the sum of address Add1[I-1:0] and address Add5[N-L-I-1:0] is obtained in the address conversion circuit DSTR, and the $(I-1)^{th}$ bit to the $0^{th}$ bit of the sum are converted to address Add6[I-1:0] and then allocated to index address Index2[I-1:0].

Figure 8:
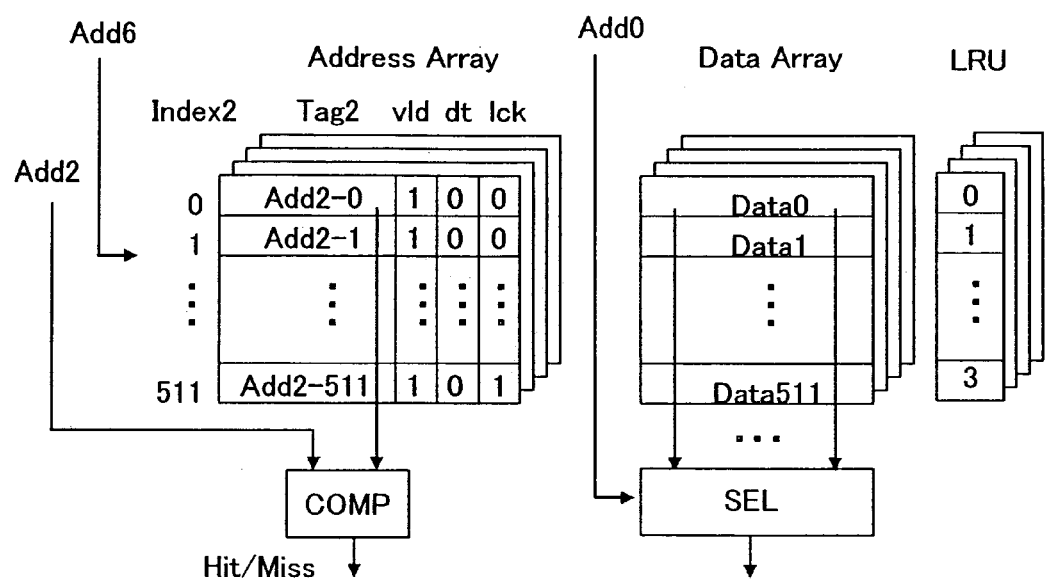
FIG. 8 is a diagram showing one example of a cache memory in the memory system to which the present invention is applied.

FIG. 8 is a diagram for describing operation of the cache memory L2Cache when the value of the address Add6 is 0 and the value of the address Add2 is Add2-0.

The index address Index2 in the cache memory L2Cache is retrieved by utilizing the address Add6, and four kinds of tag addresses are selected because it is four-way set associative.

The comparison circuit COMP compares the address Add2 and the selected tag addresses with each other. Since the address Add2 coincides with the tag address at the Add2-0, namely, is hit, data Data0 is selected from the data array.

Finally, the address Add0 is inputted to the selection circuit SEL and it outputs one byte in 512-bytes data Data0.

(Address Conversion: Effect)

FIG. 9A and FIG. 9B, and FIG. 10A and FIG. 10B are tables of the examples showing the update of the cache memory L2Cache when the address conversions described in FIG. 5A and FIG. 5B, and FIG. 7 are performed.

It has been found that a read request inputted from the data processing device CPU_CHIP to the memory module MSM during the execution of an application in the data processing device CPU_CHIP has features.

The first feature lies in that read requests, in which the address Add1 is generated in a dispersed manner and the address Add2 repeats a specific address range therein, are sequentially provided.

The second feature lies in that read requests, in which the address Add2 is generated in a dispersed manner and the address Add1 repeats a specific address range therein, are sequentially provided.

FIG. 9A shows data update "replace" of the cache memory L2Cache which occurs through address conversion in accordance with the index operation method shown in FIG. 7 when a read request having the first feature is inputted into the memory module.

FIG. 9B shows data update "replace" of the cache memory L2Cache which occurs through address conversion in accordance with the easy index operation method shown in FIG. 5 when a read request having the first feature is inputted into the memory module.

FIG. 10A shows data update "replace" of the cache memory L2Cache which occurs through address conversion in accordance with the index operation method shown in FIG. 7 when a read request having the second feature is inputted into the memory module.

FIG. 10B shows data update "replace" of the cache memory L2Cache which occurs through address conversion in accordance with the easy index operation method shown in FIG. 5 when a read request having the second feature is inputted into the memory module.

As shown in FIG. 9B, the address Add1 is allowed to correspond to the index address Index2 in the cache memory L2Cache and the address Add2 is allowed to correspond to the tag address Tag2 in the address conversion method in accordance with the easy index conversion method described in FIG. 5A and FIG. 5B. Therefore, when the read request having the first feature is inputted into the memory module, the index address Index is dispersed, so that "replace" in the cache memory L2Cache does not occur.

As shown in FIG. 9A, the address Add1 and the address Add2 are operated to generate address Add10 in a dispersed manner and the address Add10 is allowed to correspond to the index address Index2 in the cache memory L2Cache in the address conversion method in accordance with the index operation method shown in FIG. 7. Therefore, when the read request having the first feature is inputted into the cache memory L2 cache, since the index address Index is dispersed, "replace" in the cache memory L2Cache does not occur. That is, the cache memory L2Cache can be utilized effectively by the address conversion method in accordance with the index operation method described in FIG. 7, and the hit rate is improved.

As shown in FIG. 10B, the address Add1 is allowed to correspond to the index address Index2 in the cache memory L2Cache and the address Add2 is allowed to correspond to the tag address Tag2 in the address conversion method in accordance with the easy index conversion method described in FIG. 5A and FIG. 5B. Therefore, when a read request having the second feature is inputted to the cache memory L2Cache, since retrieval to a specific index address Index frequently occurs and miss occurs due to dispersion of the tag address Tag2, the "replace" of the cache memory L2Cache frequently occurs. That is, only a part of the cache memory L2Cache can be utilized and the "replace" of the cache memory L2Cache frequently occurs.

As shown in FIG. 10A, in the address conversion method in accordance with the index operation method shown in FIG. 7, the address Add1 and the address Add2 are operated to generate the address Add10 in a dispersed manner, and the address Add10 is allowed to correspond to the index address Index2 in the cache memory L2Cache. Therefore, even when a read request having the second feature is inputted into the cache memory L2Cache, "replace" of the cache memory L2Cache does not occur due to dispersion of the index address Index. That is, the cache memory L2Cache can be utilized effectively by the address conversion method in accordance with the index operation method described in FIG. 7, and the hit rate is improved.

As described above, for a read request having the first feature, the index can be dispersed by the address conversion method in accordance with the easy index conversion method shown in FIG. 5A and FIG. 5B. Meanwhile, for a read request having the second feature, the index cannot be dispersed and "replace" of the cache memory L2Cache frequently occurs.

In the index operation method shown in FIG. 7, for both a read request having the first feature and a read request having the second feature, the index can be dispersed, and the cache memory L2Cache can be utilized effectively. Consequently, the hit rate can be improved.

The easy index conversion method shown in FIG. 5A and FIG. 5B, the index bit shift conversion method shown in FIG. 6A and FIG. 6B, and the index operation method shown in FIG. 7 can be selected by rewriting the value of the reading mode setting register RModeReg from the NOR interface NOR IF. As described above, the address conversion methods can be arbitrarily selected in accordance with the system on a user side.

(Setting of Register)

FIG. 11A to FIG. 11D are flowcharts showing an example for performing selection of the synchronous NOR interface and the asynchronous NOR interface, selection of a burst length, and selection of address conversion methods performed in the address conversion circuit DSTR.

The selection of the synchronous NOR interface and the asynchronous NOR interface, the selection of a burst length, and the selection of address conversion methods performed in the address conversion circuit DSTR can be simultaneously performed by writing a set value into the reading mode setting register RModeReg.

When the selection of either of the synchronous NOR interface or the asynchronous NOR interface, the selection of a burst length, and the selection of address conversion methods performed in the address conversion circuit DSTR are to be performed, though not particularly limited, a command RModeSet for setting the value of the reading mode setting register RModeReg is inputted from the NOR interface NOR IF (Step 1), and the set value is then written in the reading mode setting register RModeReg (Step 2).

Figure 11A:
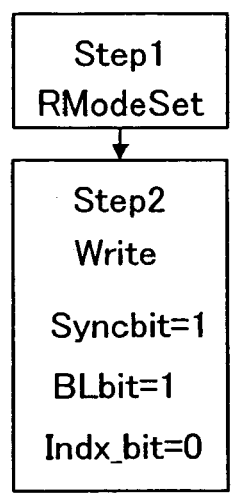
FIG. 11A is a diagram showing one example of a setting method to a register block in the memory system to which the present invention is applied.

FIG. 11A shows one example where the synchronous NOR interface is selected as the NOR interface, 4 is selected as the burst length, and the index operation method is selected as the address conversion method.

Figure 11B:
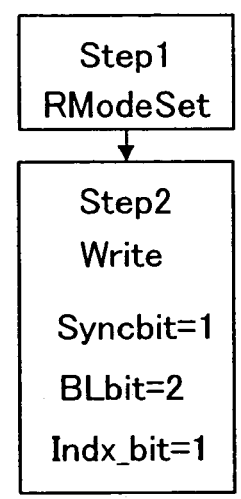
FIG. 11B is a diagram showing one example of a setting method to a register block in the memory system to which the present invention is applied.

FIG. 11B shows one example where the synchronous NOR interface is selected as the NOR interface, 8 is selected as the burst length, and the index bit shift conversion method is selected as the address conversion method.

Figure 11C:
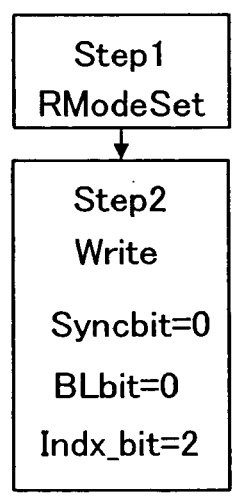
FIG. 11C is a diagram showing one example of a setting method to a register block in the memory system to which the present invention is applied.

FIG. 11C shows one example where the asynchronous NOR interface is selected as the NOR interface, 4 is selected as the burst length, and the easy index conversion method is selected as the address conversion method.

Figure 11D:
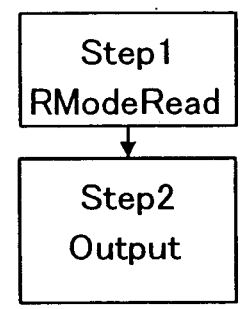
FIG. 11D is a diagram showing one example of a setting method to a register block in the memory system to which the present invention is applied.

FIG. 11D is a flowchart showing one example for reading the set value in the reading mode setting register RModeReg.

For reading the set value in the reading mode setting register RModeReg, though not particularly limited, a reading mode setting register read command RModeRead is inputted from the NOR interface NOR IF (Step 1), and then the set value in the reading mode setting register RModeReg is outputted through the NOR interface NOR IF (Step 2).

Figure 12A:
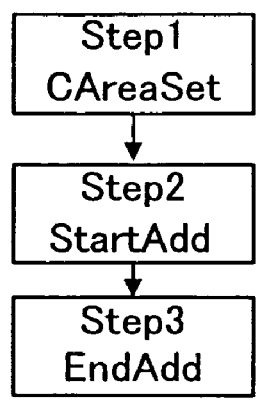
FIG. 12A is a diagram showing one example of a setting method to a register block in the memory system to which the present invention is applied.

FIG. 12A is a flowchart showing one example for setting ranges of a cache area and a non-cache area.

When setting of the cache area and the non-cache area is to be performed, though not particularly limited, a command CAreaSet for setting the cache area is inputted from the NOR interface NOR IF (Step 1), and a start address value for the cache area is then written in the cache area setting register CAreaReg (Step 2). Then, an end address value for the cache area is written in the cache area setting register CAreaReg (Step 3). An area between the start address value for the cache area and the end address value serves as the cache area, and the areas except for the cache area serve as the non-cache areas.

Figure 12B:
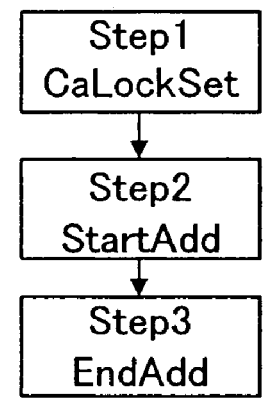
FIG. 12B is a diagram showing one example of a setting method to a register block in the memory system to which the present invention is applied.
Figure 12C:
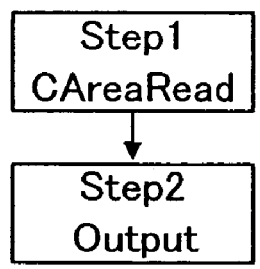
FIG. 12C is a diagram showing one example of a setting method to a register block in the memory system to which the present invention is applied.

FIG. 12C is a flowchart showing one example for reading a set value in the cache area setting register CAreaReg.

For reading the set value in the cache area setting register CAreaReg, though not particularly limited, a cache area setting register CAreaReg read command CAreaRead is inputted from the NOR interface NOR IF (Step 1), and the set value in the cache area setting register CAreaReg is outputted through the NOR interface NOR IF (Step 2).

FIG. 12B is a flowchart showing one example for setting ranges of a cache lock area and a non-cache lock area.

When the cache lock area and the non-cache lock area are to be set, though not particularly limited, a command CaLockSet for setting the cache lock area setting is inputted from the NOR interface NOR IF (Step 1), and a start address value for the cache lock area is then written in the cache lock area setting register CaLockReg (Step 2). Then, an end address value for the cache lock area is written in the cache lock area setting register CaLockReg (Step 3). An area between the start address value for the cache lock area and the end address value serves as the cache lock area, and areas except for the cache lock area serve as non-cache lock areas. Further, it is preferable that the cache lock area is set within the cache area.

Figure 12D:
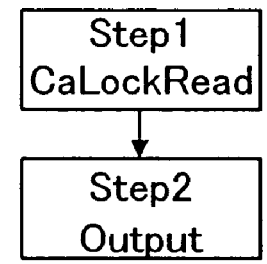
FIG. 12D is a diagram showing one example of a setting method to a register block in the memory system to which the present invention is applied.

FIG. 12D is a flowchart showing one example for reading a set value in the cache lock area setting register CaLockReg.

For reading the set value in the cache lock area setting register CaLockReg, though not particularly limited, a cache lock area setting register CaLockReg read command CaLockRead is inputted from the NOR interface NOR IF (Step 1), and a set value in the cache lock area setting register CaLockReg is outputted through the NOR interface NOR IF (Step 2).

Figure 13A:
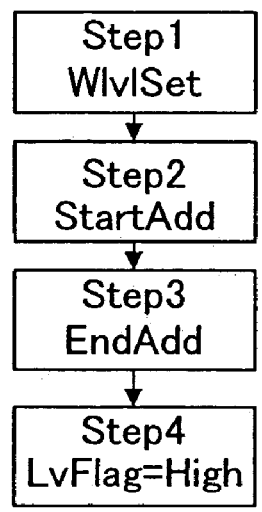
FIG. 13A is a diagram showing one example of a setting method to a register block in the memory system to which the present invention is applied.

FIG. 13A is a flowchart showing one example for setting a writing times leveling process area and a non-writing times leveling process area.

When setting of the writing times leveling process area and the non-writing times leveling process area is to be performed, though not particularly limited, a command WlvlSet for setting a writing times leveling process area is inputted from the NOR interface NOR IF (Step 1), and a start address value for the writing times leveling process area is written in the writing times leveling area setting register WlvlReg (Step 2). Then, an end address value for the writing times leveling process area is written in the writing times leveling process area setting register WlvlReg (Step 3). An area between the start address value for the writing times leveling process area and the end address value serves as the writing times leveling process area, and areas except for the writing times leveling process area serves as the non-writing times leveling process area.

Figure 13B:
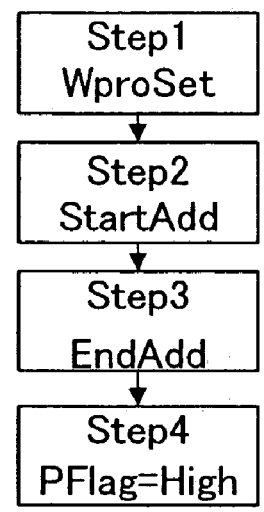
FIG. 13B is a diagram showing one example of a setting method to a register block in the memory system to which the present invention is applied.
Figure 13C:
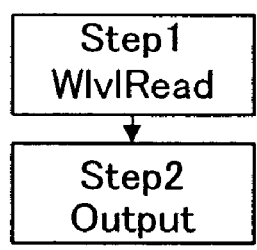
FIG. 13C is a diagram showing one example of a setting method to a register block in the memory system to which the present invention is applied.

FIG. 13C is a flowchart showing one example for reading a set value in the writing times leveling process area setting register WlvlReg.

For reading the set value in the writing times leveling process area setting register WlvlReg, though not particularly limited, a writing times leveling process area setting register WlvlReg read command WlvlRead is inputted from the NOR interface NOR IF (Step 1), and a set value in the writing times leveling process area setting register WlvlReg is outputted through the NOR interface NOR IF (Step 2).

FIG. 13B is a flowchart showing one example for setting a write protect area and a non-write protect area.

When setting of a write protect area and a non-write protect area is to be performed, though not particularly limited, a command WproSet for setting a write protect area is inputted from the NOR interface NOR IF (Step 1), and a start address value for the write protect area is written in the write protect area setting register WproReg (Step 2). Then, an end address value for the write protect area is written in the write protect area setting register WproReg (Step 3). An area between the start address value for the write protect area and the end address value serves as the write protect area, and areas except for the write protect area serves as non-write protect areas.

Figure 13D:
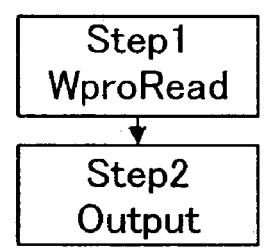
FIG. 13D is a diagram showing one example of a setting method to a register block in the memory system to which the present invention is applied.

FIG. 13D is a flowchart showing one example for reading a set value in the write protect area setting register WproReg.

For reading a set value in the write protect area setting register WproReg, though not particularly limited, a write protect area setting register read command WproRead is inputted from the NOR interface NOR IF (Step 1), and a set value in the write protect area setting register WproReg is outputted through the NOR interface NOR IF (Step 2).

As described above, it is possible to independently set the synchronous interface or the asynchronous interface, the cache area and the non-cache area, the cache lock area and the non-cache lock area, the writing times leveling process area and the non-writing times leveling process area, and the write protect area and the non-write protect area, and setting in accordance with the system can be freely selected by a user.

(Read Flow)

Figure 14:
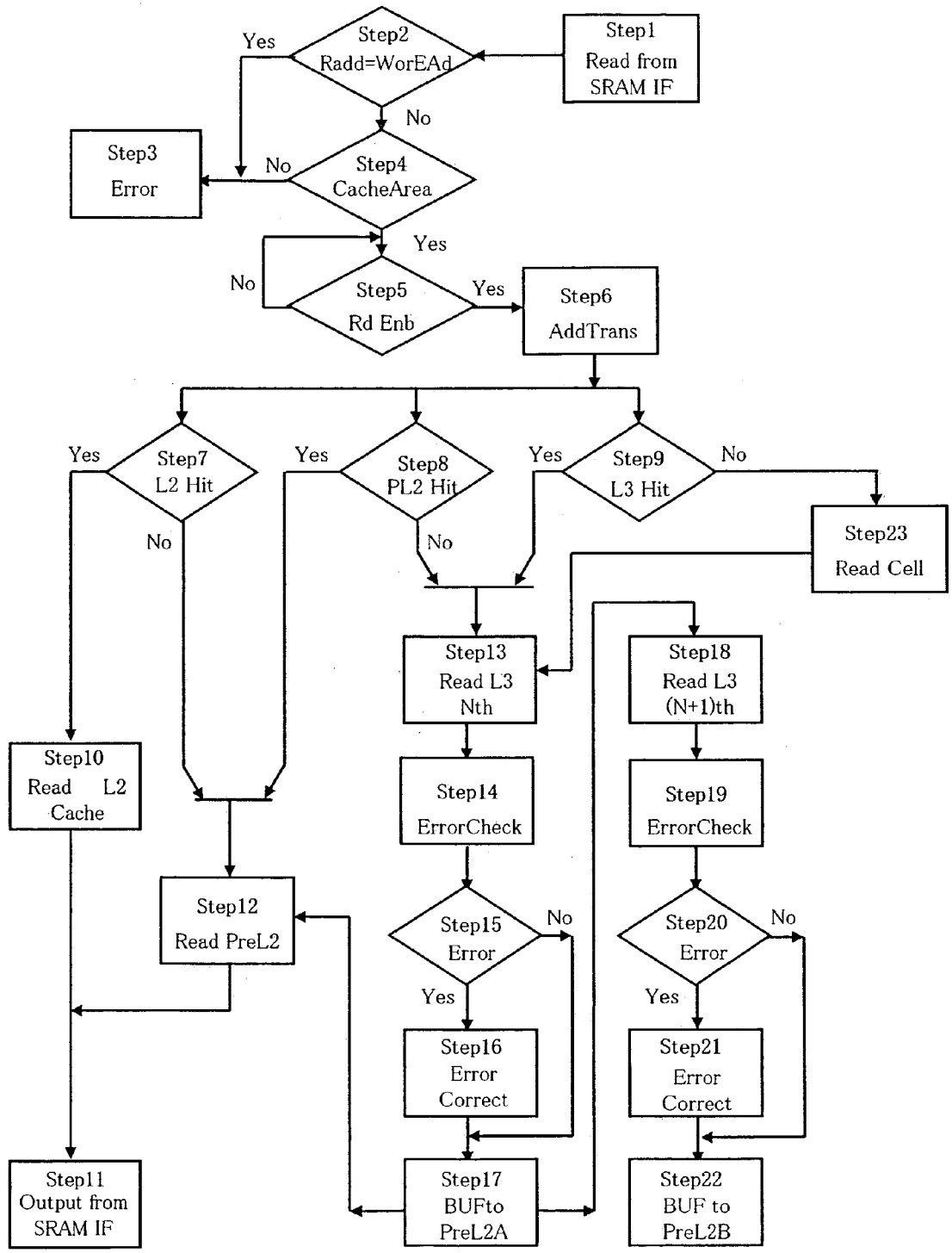
FIG. 14 is a flowchart showing one example of a flow of data read operation in the memory system to which the present invention is applied.

FIG. 14 is a flowchart showing one example of a read operation of the memory module MSM when a read request is inputted from the NOR interface NOR IF.

When a read request and a read address RAdd are inputted into the memory module MSM from the NOR interface NOR IF (Step 1), a write or erase request from the NOR interface NOR IF1 is generated and whether or not the write or erase address WorEAdd coincides with the read address Radd is checked (Step 2). When the write or erase address WorEAdd coincides with the read address Radd, the memory module MSM outputs an error through the NOR interface NOR IF (Step 3).

When the write or erase address WorEAdd does not coincide with the read address Radd, the memory address management circuit MMG checks whether or not the address Radd is within the cache address range (Step 4), and when the address Radd is out of the cache address range, the memory module MSM outputs an error through the NOR interface NOR IF (Step 3).

When the address Radd is within the cache address range, the access arbitration circuit ARB checks whether or not a read request or a write request from the NAND interface circuit NDIF is present and whether or not an operation to a read request or a write request from the NAND interface circuit NDIF is in execution. When the read request or the write request from the NAND interface circuit NDIF is present and an operation to the request is not performed yet, the read request or the write request from the NAND interface circuit NDIF is temporarily postponed and a read request from the NOR interface NOR IF is preferentially permitted (Step 4). Further, when the operation to the read request or the write request from the NAND interface circuit NDIF is in execution, the operation in execution is temporarily interrupted and the read request from the NOR interface NOR IF is preferentially permitted (Step 5).

Next, the address conversion circuit DSTR converts the address Radd to an address MRadd (Step 6). Then, the address MRadd is inputted into the cache memory L2Cache, and the hit determination circuits PL2Hit and L3Hit. Thereafter, hit determination is performed in the cache memory L2Cache (Step 7), hit determination is performed in the hit determination circuit PL2Hit (Step 8), and hit determination is performed in the hit determination circuit L3Hit (Step 9). In the case of a hit in the cache memory L2Cache, data is outputted from the cache memory L2Cache (Step 10), and it is read through the NOR interface NOR IF (Step 11). In the case of a miss in the cache memory L2Cache and a hit in the hit determination circuit PL2Hit, data is outputted from either one of the cache memories PL2A and PL2B (Step 12), and it is read through the NOR interface NOR IF (Step 11).

In the case of a miss in the cache memory L2Cache, a miss in the hit determination circuit PL2Hit, and a hit in the hit determination circuit L3Hit, the $N^{th}$ page data in the data register DREG in the flash memory FLASH_CHIP is transferred to the buffer circuit BUF (Step 13).

Next, while the $N^{th}$ page data is transferred to the buffer circuit BUF, it is subjected to error detection in the error detection and correction circuit ECC (Step 14). Then, whether or not the data includes any error is checked in the error detection and correction circuit ECC (Step 15). When the $N^{th}$ page data includes no error, the $N^{th}$ page data transferred to the buffer circuit BUF is transferred to cache memory PL2A by the control circuit RWCL. When the data includes any error, after the error is corrected in the error detection and correction circuit ECC (Step 16), the $N^{th}$ page data is transferred to the cache memory PL2A by the control circuit RWCL (Step 17).

Data requested by the data processing device CPU_CHIP in the $N^{th}$ page data transferred to the cache memory PL2A is read through the NOR interface NOR IF and the NOR interface circuit NRIF.

Further, the pre-reading instruction circuit PRECT instructs the control circuit RWCL to perform the data pre-reading, and the control circuit RWCL inputs a read request to the control circuit FCNT. Then, the next page data, namely, the $(N+1)^{th}$ page data in the data register DREG is transferred to the buffer circuit BUF.

Next, while the $(N+1)^{th}$ page data is transferred to the buffer circuit BUF, it is subjected to error detection in the error detection and correction circuit ECC (Step 19). Then, whether or not the data includes any error is checked in the error detection and correction circuit ECC (Step 20), and when the data includes no error, the $(N+1)^{th}$ page data transferred to the buffer circuit BUF is transferred to the cache memory PL2B by the control circuit RWCL. When the data includes an error, after the data is subjected to error correction in the error detection and correction circuit ECC (Step 12), the $N^{th}$ page data is transferred to the cache memory PL2A by the control circuit RWCL (Step 22).

In the case of a miss in the cache memory L2Cache, a miss in the hit determination circuit PL2Hit, and a miss in the hit determination circuit L3Hit, the control circuit RWCL first inputs a read request for the $N^{th}$ page data into the control circuit FCNT. The control circuit FCNT transfers the $N^{th}$ page data in the memory cell array MARY to the data register DREG (Step 23). Next, the $N^{th}$ page data in the data register DREG is transferred to the buffer circuit BUF (Step 13).

Next, while the $N^{th}$ page data is transferred to the buffer circuit BUF, it is subjected to error detection in the error detection and correction circuit ECC (Step 14). Then, whether or not the data includes any error is checked in the error detection and correction circuit ECC (Step 15), and when the data includes no error, the $N^{th}$ page data transferred to the buffer circuit BUF is transferred to the cache memory PL2A by the control circuit RWCL. If the data includes any error, after the data is subjected to error correction in the error detection and correction circuit ECC (Step 16), the $N^{th}$ page data is transferred to the cache memory PL2A by the control circuit RWCL (Step 17).

Data requested by the data processing device CPU_CHIP in the $N^{th}$ page data transferred to the cache memory PL2A is read through the NOR interface NOR IF and the NOR interface circuit NRIF.

Further, the pre-reading instruction circuit PRECT instructs the control circuit RWCL to perform the data pre-reading, and the control circuit RWCL inputs a read request to the control circuit FCNT. Then, the next page data, namely, the $(N+1)^{th}$ page data in the data register DREG is transferred to the buffer circuit BUF.

Next, while the $(N+1)^{th}$ page data is transferred to the buffer circuit BUF, it is subjected to error detection in the error detection and correction circuit ECC (Step 19). Then, whether or not the data includes any error is checked in the error detection and correction circuit ECC (Step 20), and when the data includes no error, the $(N+1)^{th}$ page data transferred to the buffer circuit BUF is transferred to the cache memory PL2B by the control circuit RWCL. When the data includes any error, after the data is subjected to error correction in the error detection and correction circuit ECC (Step 12), the $N^{th}$ page data is transferred to the cache memory PL2A by the control circuit RWCL (Step 22).

(Write Operation)

Figure 15:
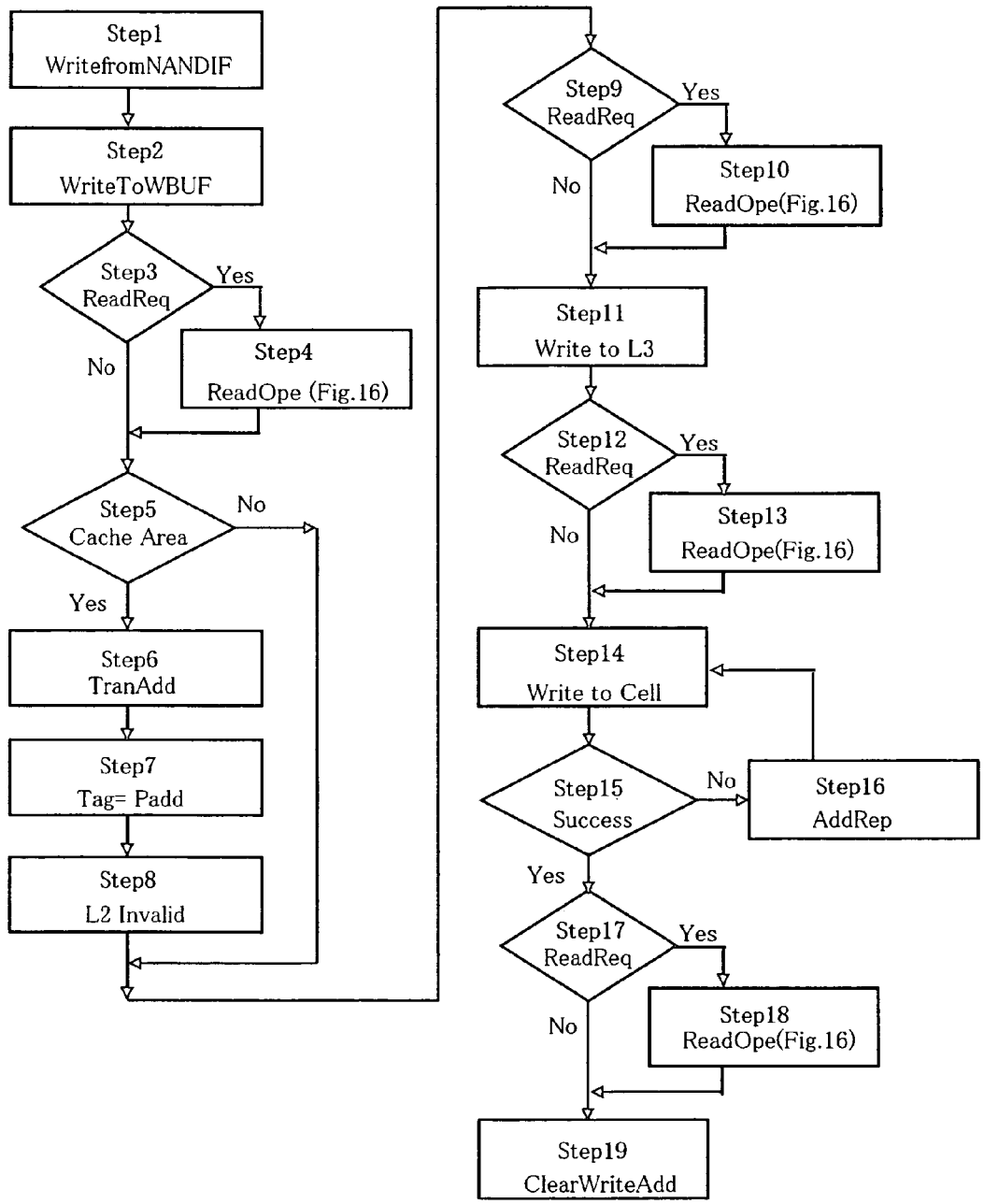
FIG. 15 is a flowchart showing one example of a flow of data write operation in the memory system to which the present invention is applied.

FIG. 15 is a flowchart showing one example of an access arbitration and write operation of the memory module MSM when a write request is generated from the NAND interface NAND IF1 and a read request is generated from the NOR interface.

When a write address NWADD and write data NWDATA are inputted from the NAND interface NAND IF1 (Step 1), the write address NWADD is transferred to the memory address management circuit MMG, and the write data NWDATA is transferred to the write buffer WBUF (Step 2).

Figure 20:
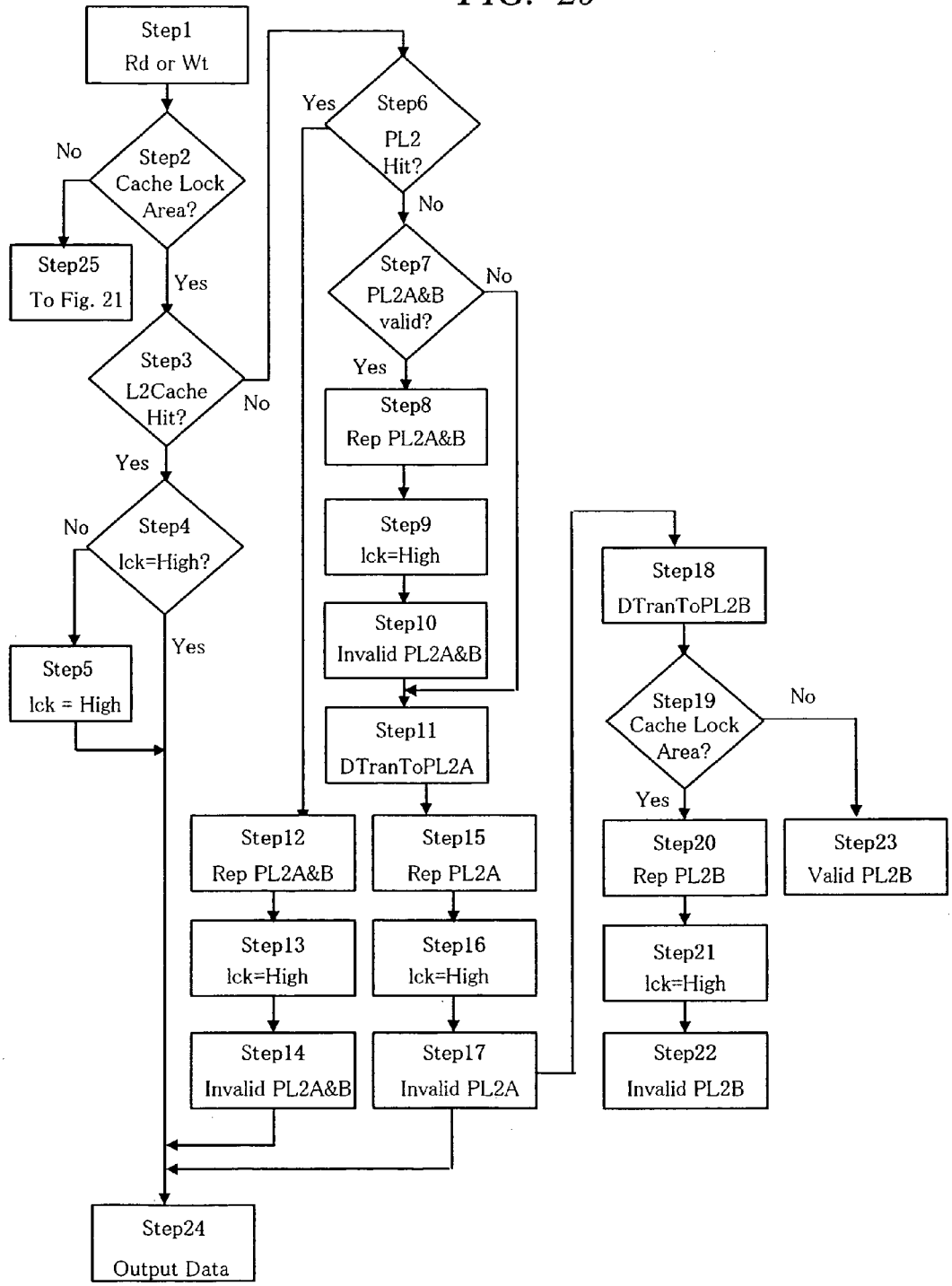
FIG. 20 is a flowchart showing one example of a flow of data read operation in the memory system to which the present invention is applied.

Next, the access arbitration circuit ARB checks whether or not a read request has been inputted from the NOR interface NOR IF (Step 3), and when the read request has been inputted, operation in response to the write request from the NAND interface NAND IF1 is temporarily stopped and the read operation shown in FIG. 20 is performed preferentially (Step 4). After the read operation is completed, the control returns back to the operation in response to the write request from the NAND interface NAND IF1, and whether or not the write address NWADD is present in the cache address area is checked (Step 5). Then, the address NWADD is converted to an address MNWADD in the address conversion circuit DSTR (Step 6).

The address MNWADD and tag addresses in the cache memory L2Cache are compared with each other (Step 7), and the tag address coincident with the address MNWADD is invalidated (Step 8).

Next, the access arbitration circuit ARB checks whether or not a read request is inputted from the NOR interface NOR IF (Step 9), and when the read request has been inputted, operation in response to the write request from the NAND interface NAND IF1 is temporarily stopped and the read operation shown in FIG. 20 is performed preferentially (Step 10). After the read operation is completed, the control returns back to the operation in response to the write request from the NAND interface NAND IF1, and the write data NWDATA retained in the write buffer WBUT is transferred to the data register DREG (Step 11).

Next, the access arbitration circuit ARB checks whether or not a read request is inputted from the NOR interface NOR IF (Step 12), and when the read request has been inputted, operation in response to the write request from the NAND interface NAND IF1 is temporarily stopped and the read operation shown in FIG. 20 is performed preferentially (Step 13). After the read operation is completed, the control returns back to the operation in response to the write request from the NAND interface NAND IF1, and the write data NWDATA retained in the data register DREG is written in the memory cell array MARY (Step 14).

The replacement processing circuit REP checks whether or not writing in the memory cell array MARY has been succeeded (Step 15), and when the writing is failed, a new address for replacement prepared in advance in the flash memory FLASH_CHIP is provided (Step 16), and writing is performed to the new address (Step 14). After the writing has been succeeded, the access arbitration circuit ARB checks whether or not a read request is inputted from the NOR interface NOR IF (Step 17), and when the read request has been inputted, an operation in response to the write request from the NAND interface NAND IF1 is temporarily stopped and the read operation shown in FIG. 20 is performed preferentially (Step 18). After the read operation is completed, the write address NWADD is cleared finally.

(Erase Operation from NAND IF1)

Figure 16:
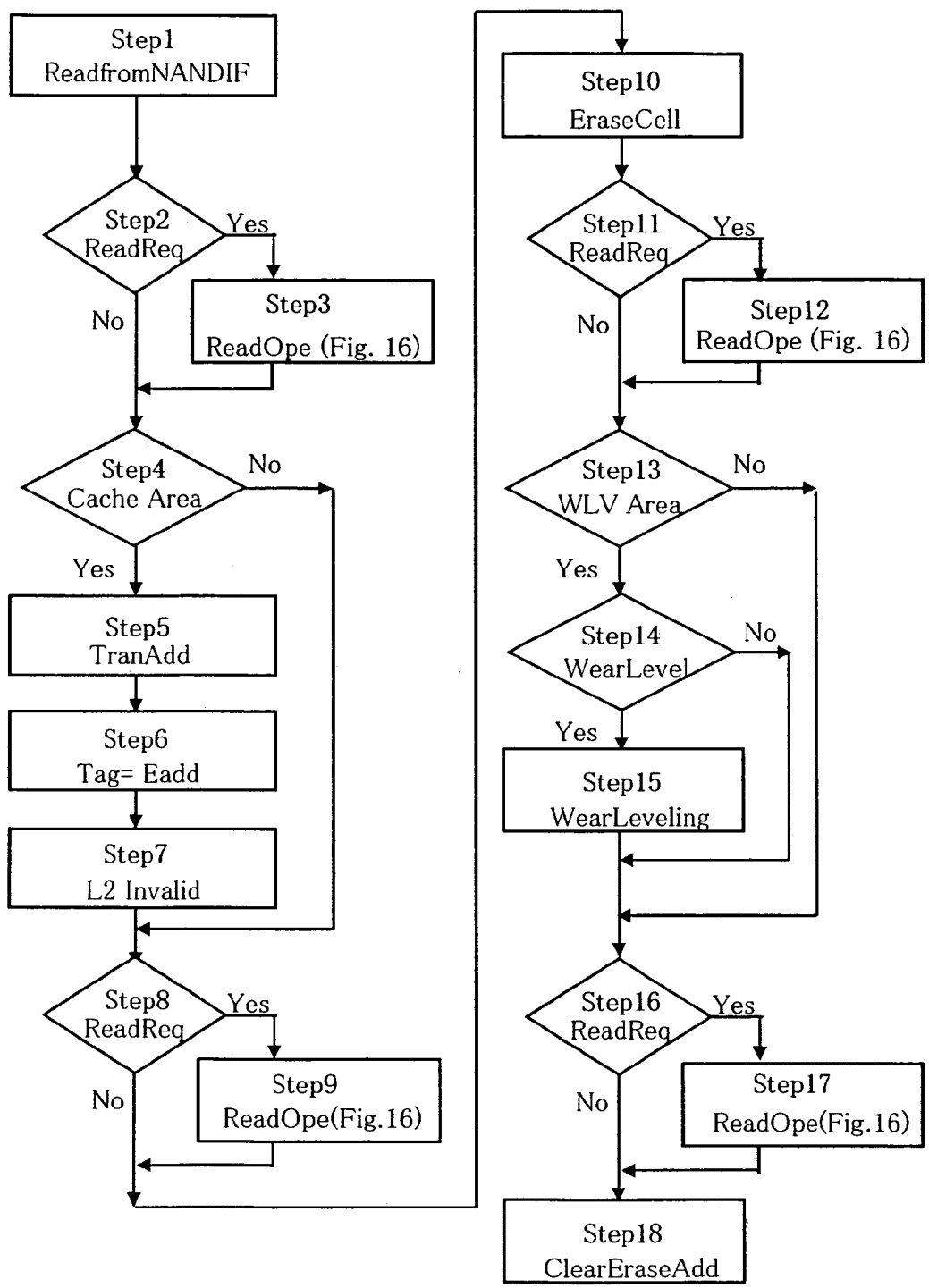
FIG. 16 is a flowchart showing one example of a flow of data erase operation in the memory system to which the present invention is applied.

FIG. 16 is a flowchart showing one example of an access arbitration and erase operation of the memory module MSM when an erase request is generated from the NAND interface NAND IF1 and a read request is generated from the NOR interface.

An erase command and an erase address NEADD are inputted from the NAND interface NAND IF1, and the erase address NEADD is transferred to the memory address management circuit MMG (Step 1).

Next, the access arbitration circuit ARB checks whether or not a read request is inputted from the NOR interface NOR IF (Step 2), and when the read request has been inputted, operation in response to the erase request from the NAND interface NAND IF1 is temporarily stopped and the read operation shown in FIG. 20 is performed preferentially (Step 3). After the read operation is completed, the control returns back to the operation in response to the erase request from the NAND interface NAND IF1, and whether or not the erase address NWADD is present in the cache address area is checked (Step 4). Then, the address NEADD is converted to an address MNEADD in the address conversion circuit DSTR (Step 5).

The address MNEADD and tag addresses in the cache memory L2Cache are compared with each other (Step 6), and the tag address coincident with the address MNEADD is invalidated (Step 7).

Next, the access arbitration circuit ARB checks whether or not a read request is inputted from the NOR interface NOR IF (Step 8), and when the read request has been inputted, operation in response to the erase request from the NAND interface NAND IF1 is temporarily stopped and the read operation shown in FIG. 20 is performed preferentially (Step 9). After the read operation is completed, the control returns back to the operation in response to the erase request from the NAND interface NAND IF1, and the memory cell array MARY is erased (Step 11).

Next, the access arbitration circuit ARB checks whether or not a read request is inputted from the NOR interface NOR IF (Step 11), and when the read request has been inputted, operation in response to the write request from the NAND interface NAND IF1 is temporarily stopped and the read operation shown in FIG. 20 is performed preferentially (Step 12). After the read operation is completed, the control returns back to the operation in response to the erase request from the NAND interface NAND IF1, and whether or not the address NEADD is present in the writing times leveling area is checked (Step 13). When the address NEADD is present in the writing times leveling area, whether or not the sum total of the writing times and erasing times has reached the sum total threshold value of the writing times and erasing times retained in the writing times leveling circuit WLV is checked (Step 14). When the sum total reaches the sum total threshold value, the writing times leveling circuit WLV determines that writings has been concentrated and performs writing times leveling process (Step 15). In the writing times leveling process, correspondence between physical address and logic address is changed for each block (64 pages) so as to retain the correspondence data between the physical address and the logic address.

When the address NEADD is not present in the writing times leveling area or after the writing times leveling process has been terminated, the access arbitration circuit ARB checks whether a read request is inputted from the NOR interface NOR IF (Step 16), and when the read request has been inputted, an operation in response to the erase request from the NAND interface NAND IF1 is temporarily stopped and the read operation shown in FIG. 20 is performed preferentially (Step 17). After the read operation is completed, the erase address NEADD is cleared finally (Step 18).

(Read Command from NAND IF1)

Figure 17:
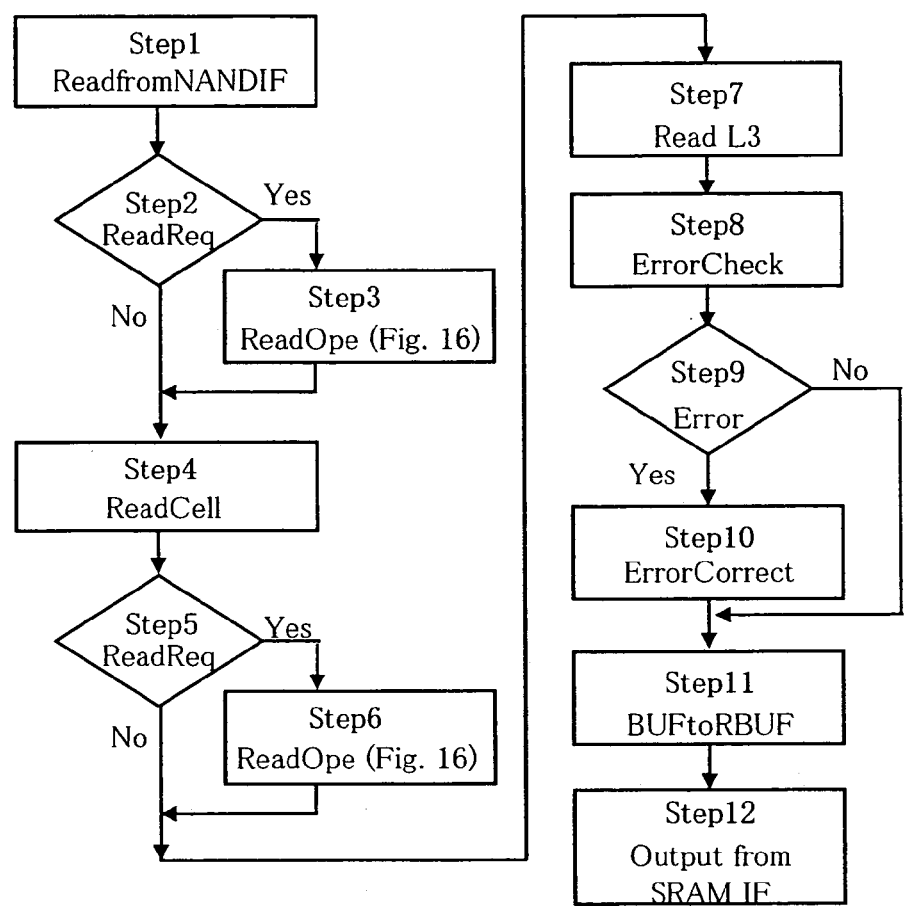
FIG. 17 is a flowchart showing one example of a flow of read operation in the memory system to which the present invention is applied.

FIG. 17 is a flowchart showing one example of an access arbitration and read operation of the memory module MSM when a read request is generated from the NAND interface NAND IF1 and a read request is generated from the NOR interface.

When a read command and a read address NRADD are inputted from the NAND interface NAND IF1 (Step 1), the access arbitration circuit ARB then checks whether or not a read request is inputted from the NOR interface NOR IF (Step 2), and when the read request has been inputted, an operation in response to the read request from the NAND interface NAND IF1 is temporarily stopped and the read operation shown in FIG. 20 is performed preferentially (Step 3). After the read operation is completed, the control returns back to the operation in response to the read request from the NAND interface NAND IF1, and data is read from the memory cell array MARY and transferred to the data register DREG (Step 4).

Next, the access arbitration circuit ARB checks whether or not a read request is inputted from the NOR interface NOR IF (Step 5), and when the read request has been inputted, operation in response to the read request from the NAND interface NAND IF1 is temporarily stopped and the read operation shown in FIG. 20 is performed preferentially (Step 6). After the read operation is completed, the control returns back to the operation in response to the read request from the NAND interface NAND IF1, and the data retained in the data register DREG is transferred to the buffer circuit BUF (Step 7).

While the data is transferred to the buffer circuit BUF, it is subjected to error detection in the error detection and correction circuit ECC (Step 8). Next, whether or not the data includes any error is checked in the error detection and correction circuit ECC (Step 9), and when the data includes no error, the data transferred to the buffer circuit BUF is transferred to the read buffer RBUF (Step 11). When the data includes an error, after the data is subjected to error correction in the error detection and correction circuit ECC (Step 10), the data is transferred to the read buffer RBUF (Step 11). Finally, the data retained in the read buffer RBUF is read to the NOR interface NOR IF (Step 12).

(Configuration of L2Cache for Cache Lock)

Figure 18:
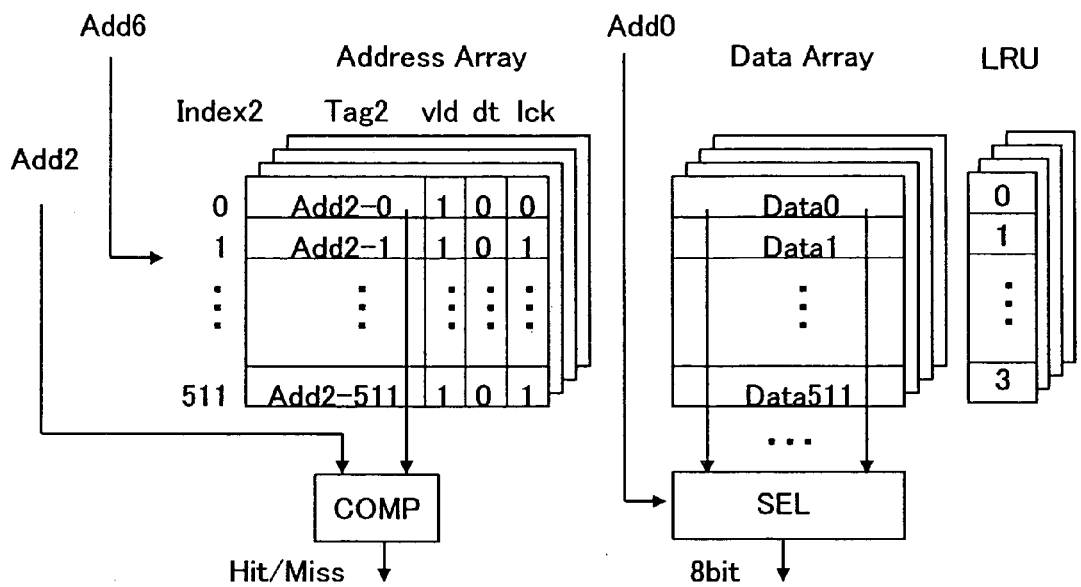
FIG. 18 is a diagram showing one example of a cache memory in the memory system to which the present invention is applied.
Figure 19:
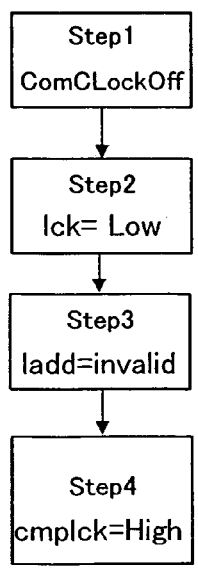
FIG. 19 is a diagram showing one example of a cache lock releasing method in the memory system to which the present invention is applied.

FIG. 18 is a diagram of one example showing a configuration of a cache memory L2Cache required for performing a cache lock operation.

An address Add6, an address Add2, and an address Add0 are equivalent to the addresses described in FIG. 8.

Though not particularly limited, a configuration of the cache memory L2Cache is composed of an address array AddressArray and a data array DataArray, in which a capacity of the data array DataArray is 256 Mbytes, a line size is 512 bytes, an index address Index2 is from 0 to 511, and a set associative is a four-way set associative. Further, the address array AddressArray includes a tag address Tag2, a valid bit vld, a dirty bit dt, and a cache lock flag lck, and data of 512 bytes is retained to one index address in the data array DataArray.

The value of the cache lock flag lck of the tag address present in the cache lock address range is 1, and the value of the cache lock flag lck of the tag address present out of the cache lock address range is 0.

Data with the value of cache lock flag lck of 1 is the data which is not subjected to data update, and the data is not ejected from the cache memory L2Cache unless the cache lock flag lck becomes 0.

Data with the value of cache lock flag lck of 0 is the data which is subjected to data update, and the data may be ejected from the cache memory L2Cache.

(Cache Lock Flag Release)

Figure 21:
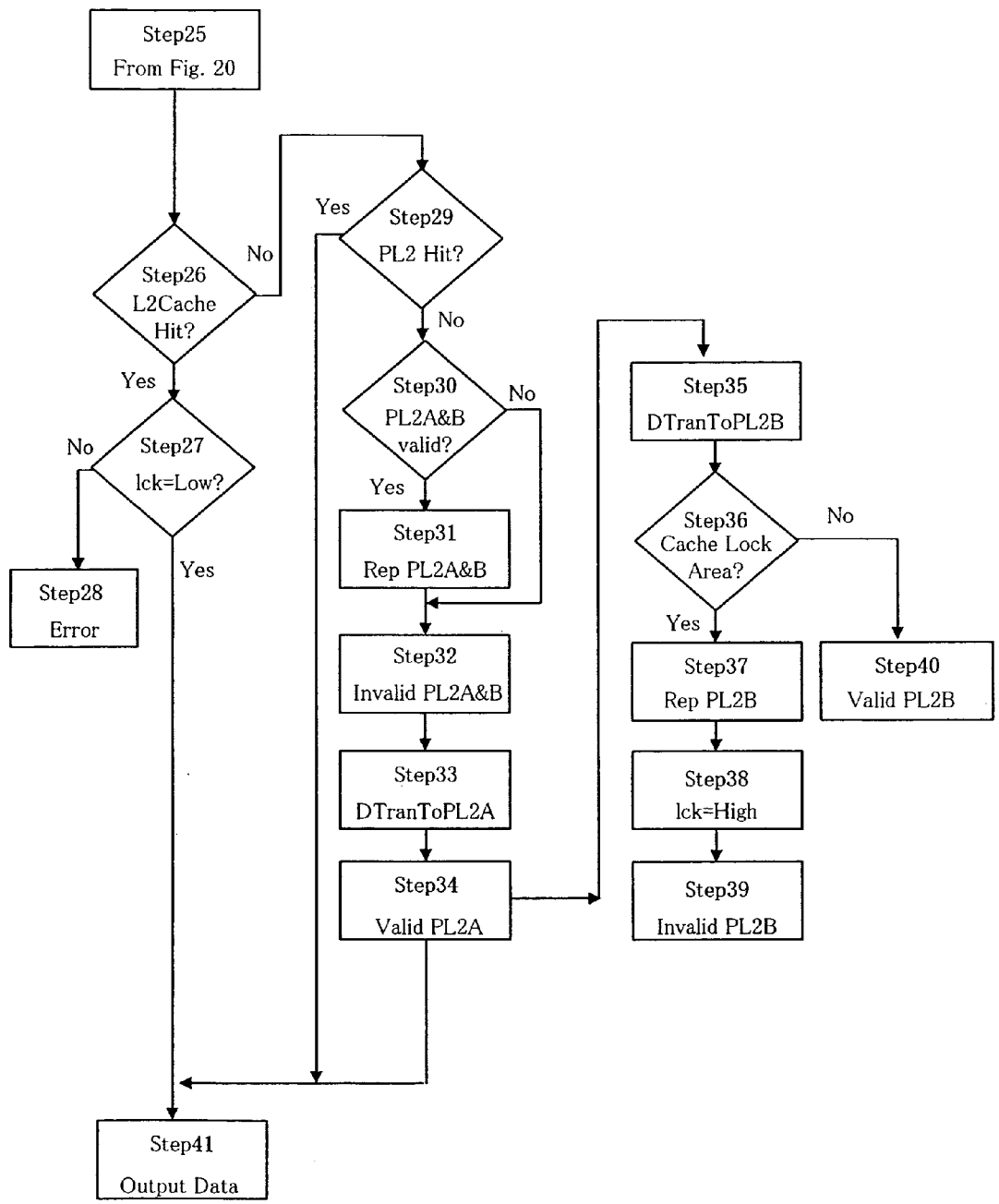
FIG. 21 is a flowchart showing one example of a flow of data read operation in the memory system to which the present invention is applied.

FIG. 21 is a flowchart showing one example of a cache lock release. When a cache lock release command is written in a cache lock area setting register CaLockReg from the NOR interface NOR IF (Step 1), the cache memory L2Cache sets all cache lock flags lck of its own to 0 (Low) (Step 2), invalidates the cache lock range address set in the cache lock area setting register CaLockReg (Step 3), and finally sets a cache lock release completion signal indicating that the cache lock release has been completed in the cache memory L2Cache to High (Step 4). Through the above-described procedure, invalidation of the address range for performing cache lock is inputted into the memory address management circuit MMG.

(Read Operation after Cache Lock)

FIG. 20 is a flowchart for describing one example of operations of the cache memories L2Cache, PL2A, and PL2B when cache lock has been set.

When a read request and an address RADD are inputted into the memory module MSM from the NOR interface NOR IF (Step 1), the memory address management circuit MMG checks whether the address RADD is within the address range for performing cache lock (Step 2). When the address RADD is out of the address range for performing cache lock, the control proceeds to Step 26. Details of operation from Step 26 are shown in FIG. 21.

Further, when the address RADD is within the address range for performing cache lock, hit determination is performed in the cache memory L2Cache (Step 3).

In the case of a hit the cache memory L2Cache, whether or not a cache lock flag corresponding to a hit tag address is High is checked (Step 4), and when the cache lock flag is High, data is outputted from the cache memory L2Cache (Step 24). When the cache lock flag is Low, the cache lock flag is set to High (Step 5), data is outputted from the cache memory L2Cache (Step 24).

In the case of a miss in the cache memory L2Cache, hit determination for the cache memories PL2A and PL2B is performed (Step 6), and in the case of a hit in the cache memories PL2A and PL2B, data in the cache memories PL2A and PL2B are transferred to the cache memory L2Cache and then updated (Step 12). When data is to be updated, data where the cache lock flag is Low is updated in accordance with an LRU method. Next, after the cache lock flag is set to High (Step 13), the cache memories PL2A and PL2B are invalidated (Step 14), and data is outputted from the cache memories PL2A and PL2B (Step 24).

In the case of a miss in the cache memories PL2A and PL2B, whether or not the cache memories PL2A and PL2B are valid is checked (Step 7), and when they are valid, data currently present in the cache memories PL2A and PL2B are transferred to the cache memory L2Cache and then updated (Step 8). When data is to be updated, data where the cache lock flag is Low is updated in accordance with an LRU method.

Next, the cache lock flag is set to High (Step 9), and the cache memories PL2A and PL2B are invalidated (Step 10). Then, requested data is transferred from the flash memory FLASH_CHIP to the cache memory PL2A (Step 11) and data in the cache memory PL2A is transferred to the cache memory L2Cache and then updated (Step 15).

When date is to be updated, data where the cache lock flag is Low is updated in accordance with an LRU method. Next, the cache lock flag is set to High (Step 16), the cache memory PL2A is invalidated (Step 17), and data is outputted from the cache memory PL2A (Step 24). Simultaneously with this, the next page data is transferred from the flash memory FLASH_CHIP to the cache memory PL2B by means of the pre-reading function (Step 18), and whether or not the data is within the address range for performing cache lock is then checked (Step 19). When the data is within the address range for performing cache lock, data in the cache memory PL2B is transferred to the cache memory L2Cache and then updated (Step 20). When the data is to be updated, data where the cache lock flag is Low is updated in accordance with an LRU method. Next, the cache lock flag is set to High (Step 21), and the cache memory PL2B is invalidated (Step 22). When the data is out of the address range for performing cache lock, the cache memory PL2B is made valid (Step 23).

(Read Operation of Cache Lock)

FIG. 21 is a flowchart for describing one example of operations of the cache memories L2Cache, PL2A, and PL2B when cache lock is set and a read request and an address RADD inputted from the NOR interface NOR IF to the memory module MSM are out of the address range for performing cache lock.

When an address RADD is out of the address range for performing cache lock (Step 25), hit determination is performed in the cache memory L2Cache (Step 26).

In the case of a hit in the cache memory L2Cache, whether or not a cache lock flag corresponding to a hit tag address is Low is checked (Step 27), and when the cache lock flag is Low, data is outputted from the cache memory L2Cache (Step 41). When the cache lock flag is High, an error is outputted (Step 28).

In the case of a miss in the cache memory L2Cache, hit determination for the cache memories PL2A and PL2B is performed (Step 29), and in the case of a hit in the cache memories PL2A and PL2B, data is outputted from the cache memories PL2A and PL2B (Step 41).

In the case of a miss in the cache memories PL2A and PL2B, whether or not the cache memories PL2A and PL2B are valid is checked (Step 30), and when they are valid, data currently present in the cache memories PL2A and PL2B are transferred to the cache memory L2Cache and then updated (Step 31). When the data is to be updated, data where the cache lock flag is Low is updated in accordance with an LRU method.

Next, the cache memories PL2A and PL2B are invalidated (Step 32). Then, requested data is transferred from the flash memory FLASH_CHIP to the cache memory PL2A (Step 33), and data in the cache memory PL2A is validated (Step 34). Thereafter, data is outputted from the cache memory PL2A (Step 41).

Simultaneously with Step 41, the next page data is transferred from the flash memory FLASH_CHIP to the cache memory PL2B by means of the pre-reading function (Step 35), and whether or not the data is within the address range for performing cache lock is checked (Step 36). When the data is within the address range for performing cache lock, data in the cache memory PL2B is transferred to the cache memory L2Cache and then updated (Step 37). When the data is to be updated, data where the cache lock flag is Low is updated in accordance with an LRU method. Next, the cache lock flag is set to High (Step 38), the cache memory PL2B is invalidated (Step 39). Further, when the data is out of the address range for performing cache lock, the cache memory PL2B is validated (Step 40).

Second Embodiment (Flash with a Plurality of Memory Banks)

Figure 22:
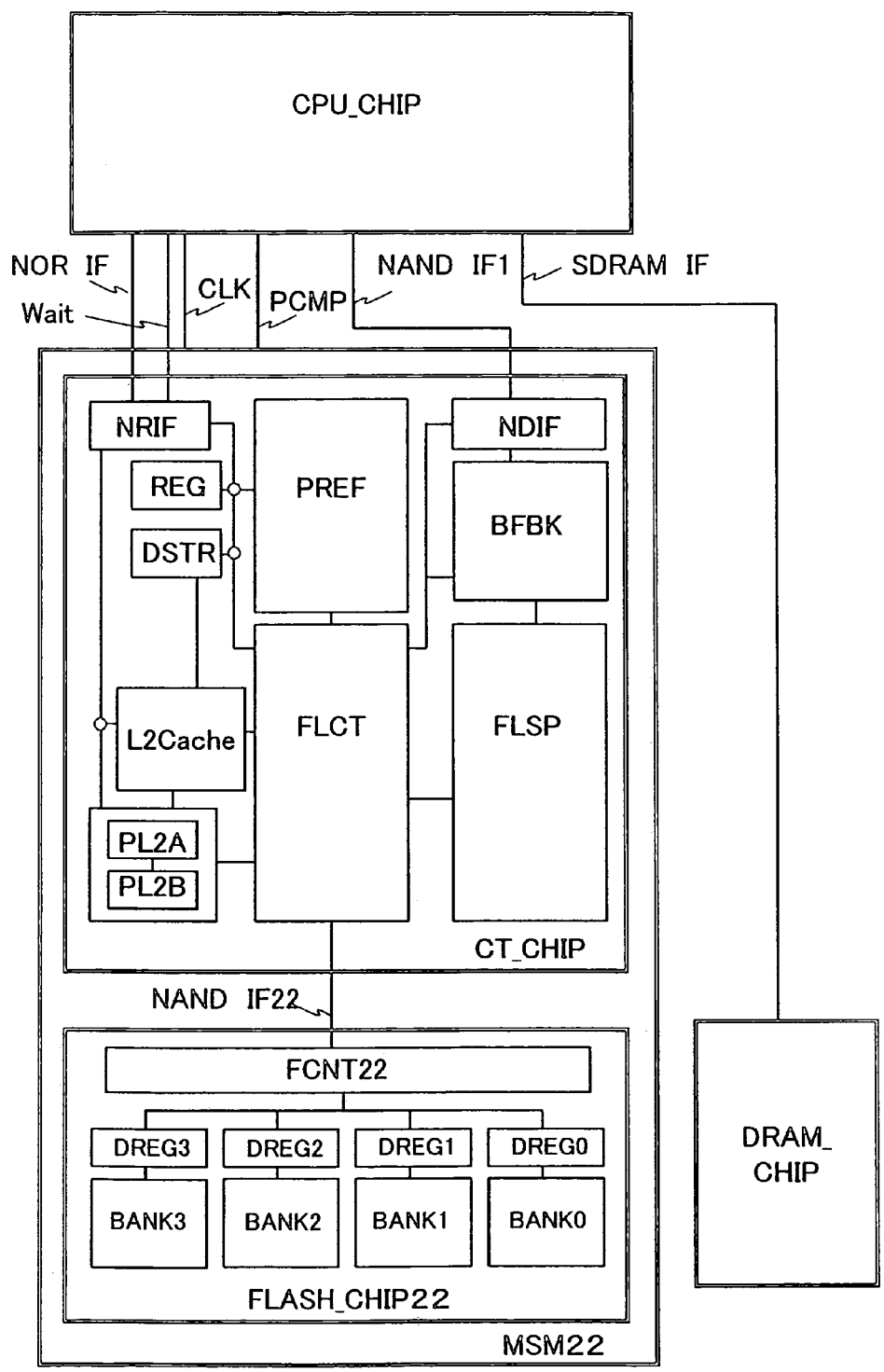
FIG. 22 is a configuration diagram of a memory system to which the present invention is applied.

FIG. 22 is a block diagram showing a second embodiment in which a flash memory FLASH_CHIP22 having a plurality of memory banks is applied to the present invention.

That is, a memory system including a data processing device CPU_CHIP, a memory module MSM22, and a dynamic random access memory DRAM_CHIP is shown in FIG. 22.

The memory module MSM22 is composed of a flash memory FLASH_CHIP22 and a control circuit CT_CHIP.

The data processing device CPU_CHIP, the control circuit CT_CHIP, and the dynamic random access memory DRAM_CHIP are respectively equivalent to those shown in FIG. 1.

The control circuit CT_CHIP is composed of a NOR interface circuit NRIF which receives read and write requests from a NOR interface (NOR IF), a NAND interface circuit NDIF which receives read and write requests from a NAND interface (NAND IF), a register block REG, an address conversion circuit DSTR, cache memories L2Cache, PL2A, and PL2B, a prefetch control circuit PREF, a flash control circuit FLCT, a buffer circuit BFBK, and a flash error control circuit FLSP.

The NOR interface (NOR IF), the NOR interface circuit NRIF, the NAND interface (NAM IF), the NAND interface circuit NDIF, the SDRAM interface (SDRAM_IF), the register block REG, the address conversion circuit DSTR, the cache memories L2Cache, PL2A, and PL2B, the prefetch control circuit PREF, the flash control circuit FLCT, the buffer circuit BFBK, and the flash error control circuit FLSP are respectively equivalent to those shown in FIG. 1.

The flash memory FLASH_CHIP22 is composed of a control circuit FCNT22, data registers DREG0 to DREG3, and memory banks BANK0 to BANK3.

Though not particularly limited, regarding data transfer between the data registers and the memory banks, the data transfer between the memory bank BANK0 and the data register DREG0, the data transfer between the memory bank BANK1 and the data register DREG1, the data transfer between the memory bank BANK2 and the data register DREG2, and the data transfer between the memory bank BANK3 and the data register DREG3 can be independently performed.

Though not particularly limited, a storage capacity of one memory bank is 64 Mbytes, and the sum total of storage capacity of four memory banks is 256 Mbytes.

Further, though not particularly limited, a data size of one data register is 2 kbytes, and the sum total of data size of four data registers is 8 kbytes.

The control circuit FCNT22 controls data transfer between the data registers DREG0 to DREG3 and the memory banks BANK0 to BANK3 in response to read and write commands from the control circuit CT_CHIP.

The flash memory FLASH_CHIP22 can operate through both of the AND interface and NAND interface, and operation of the flash memory FLASH_CHIP22 will be described based on the case of using the NAND interface as an example.

The control circuit FCNT22 controls data transfer between the data registers DREG0 to DREGS and the memory banks BANK0 to BANKS in response to read and write commands from the NAND interface NAND IF3 of the control circuit CT_CHIP.

When a read request and a read address are inputted from the control circuit CT_CHIP in the control circuit FCNT22 through the NAND interface NAND IF22, data in the memory bank designated by the read address is transferred to a data register corresponding to data transfer from the memory bank. Next, the data is transferred to the control circuit CT_CHIP through the NAND interface NAND IF3.

Regarding the designation of the memory banks, the read address can designate all the banks at once, can designate two banks, and can designate the banks one by one independently. Therefore, for example, data transfer time from a memory bank to a data register can be hidden by performing data transfer from the memory bank BANK1 to the data register DREG1 in the background during the data reading from the data register DREG0, and thus data transfer speed can be increased.

Also, since the data transferred to the data register is retained as it is, the data register can be utilized as an L3 cache with 8 kbytes, and data transfer speed can be further increased.

As described above, even if a flash memory FLASH_CHIP22 having a plurality of memory banks is utilized, the present invention can be realized.

Third Embodiment

The inventors of the present invention have studied the reliability of a cellular phone and a memory module used in the cellular phone, in which a static random access memory SRAM and a flash memory are mounted as one package, prior to filing this patent application.

Soft error is a phenomenon where α rays emitted from radioactive material such as uranium in a semiconductor sealing member enter a memory array in the static random access memory SRAM and stored data retained in the memory array is destroyed, which is a factor for degrading the reliability of the static random access memory SRAM. Further, since an area becomes larger along with the increase in storage capacity of the static random access memory SRAM, a probability that α rays enter the static random access memory SRAM increases, and the reliability is further degraded.

The reliability of a volatile memory such as a dynamic random access memory DRAM or a static random access memory SRAM is degraded by α rays. However, it has been found that a non-volatile memory such as a flash memory is not affected by α rays because of its memory array structure.

In view of these circumstances, one object of the present invention is to provide a memory system including a ROM and a RAM with high reliability.

Figure 23:
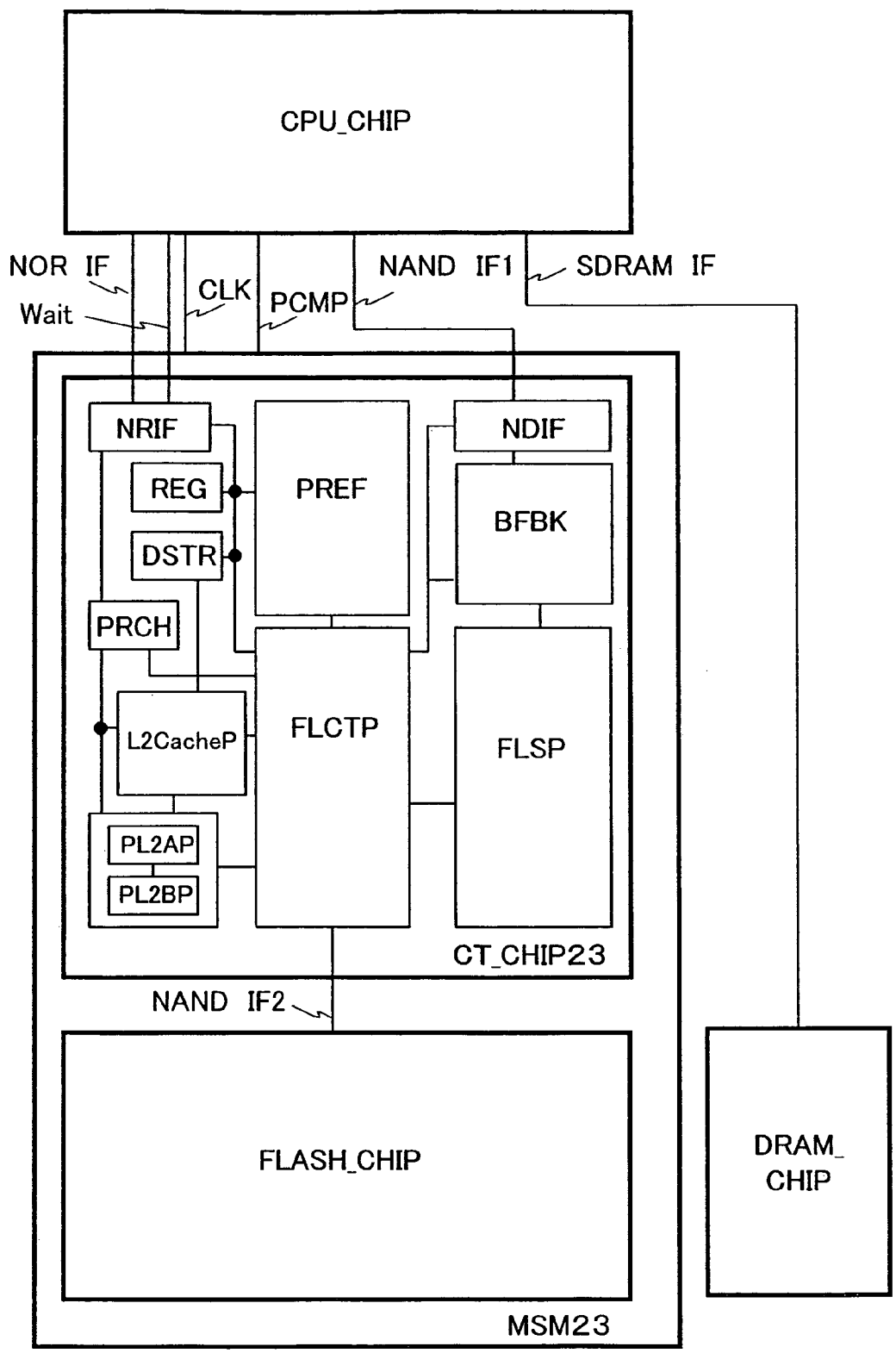
FIG. 23 is a configuration diagram of a memory system to which the present invention is applied.

FIG. 23 is a diagram showing a third embodiment of the present invention. FIG. 23 is a diagram of an embodiment showing a memory system composed of a data processing device CPU_CHIP23, a memory module MSM23, and a dynamic random access memory DRAM_CHIP.

The memory module MSM23 includes a flash memory FLASH_CHIP and a control circuit CT_CHIP23.

The data processing device CPU_CHIP, the flash memory FLASH_CHIP, and the dynamic random access memory DRAM_CHIP are equivalent to those shown in FIG. 1.

The control circuit CT_CHIP23 is composed of a NOR interface circuit NRIF which receives read and write requests from a NOR interface (NOR IF), a NAND interface circuit NDIF which receives read and write requests from a NAND interface (NAND IF), a register block REG, an address conversion circuit DSTR, a parity check circuit PRCH, cache memories L2CacheP, PL2AP, and PL2BP, a prefetch control circuit PREF, a flash control circuit FLCTP, a buffer circuit BFBK, and a flash error control circuit FLSP.

The NOR interface (NOR IF), the NOR interface circuit NRIF, the NAND interface (NAND IF), the NAND interface circuit NDIF, the SDRAM interface (SDRAM_IF), the register block REG, the address conversion circuit DSTR, the prefetch control circuit PREF, the flash control circuit FLCTP, the buffer circuit BFBK, and the flash error control circuit FLSP are equivalent to those shown in FIG. 1.

The parity check circuit PRCH performs parity check based upon data read from the cache memory L2CacheP and parity data.

The parity check includes even parity check and odd parity check, and the parity check circuit PRCH can perform both the parity checks. In this embodiment, the odd parity check will be described.

The cache memories L2CacheP, PL2AP, and PL2BP are cache memories having parity data, but the other configuration and operation thereof are equivalent to those described in FIG. 1.

The flash control circuit FLCTP is a control circuit having a parity data generation circuit, but the other configuration and operation thereof are equivalent to those described in FIG. 1.
(Operation of L2Cachep)

One example of the operation when data is read from the cache memory L2Cache will be described.

In the case of a hit in the cache memory L2CacheP, data and parity data are directly read from the cache memory L2CacheP and parity check is performed in the parity check circuit PRCH.

Though not particularly limited, whether or not the number of Highs of parity bits corresponding to 8-bit data is even is checked in the even parity check. When the number is even, it is determined that the data has been read correctly, and when the number is odd, it is determined that the read data includes any error.

When it is determined in the parity check circuit PRCH that the data has been read correctly, the data is outputted to the data processing device CPU_CHIP through the NOR interface circuit NRIF and the NOR interface NOR IF.

When it is determined that data in the cache memory L2Cache has been destroyed by soft error and read data includes any error, the flash control circuit FLCTP reads original data of the data including the error therein from the flash memory FLASH_CHIP and transfers it to the flash error control circuit FLSP.

The prefetch control circuit PREF transfers data retained in the cache memories PL2AP and PL2BP to the cache memory L2CacheP to update the cache memory L2Cache during the data transfer to the flash error control circuit FLSP from the data register DREG in the flash memory FLASH_CHIP. In this update, update of parity data is performed simultaneously with the data transfer.

The flash error control circuit FLSP performs error detection and correction to the data transferred from the flash memory FLASH_CHIP. When no error is detected in the circuit ECC, the data is transferred to the cache memory PL2AP, and when any error is detected, the data is subjected to error correction and then transferred to the cache memory PL2AP. Though not particularly limited, the flash error control circuit FLSP generates 1-bit parity data for 8-bit data at the time of data transfer to the cache memory PL2AP and transfers the parity data together with the data to the cache memory PL2AP. In the even parity, though not particularly limited, when the number of High bits in the 8-bit data is odd, the parity data becomes High, and the number of High bits is made even. Also, when the number of High bits in the 8-bit data is even, the parity data becomes Low, and the number of High bits is made even.

The data transferred to the cache memory PL2AP is subjected to parity check in the parity check circuit PRCH. Though not particularly limited, whether or not the number of Highs of the parity bits corresponding to 8-bit data is even is checked in the even parity check. When the number is even, it is determined that the data has been read correctly, and when the number is odd, it is determined that the data includes any error.

When it is determined in the parity check circuit PRCH that the data has been read correctly, the data is outputted to the data processing device CPU_CHIP through the NOR interface circuit NRIF and the NOR interface NOR IF.

When it is determined that the read data includes any error, data is read from the flash memory again.

As described above, even when data in the cache memory L2Cache has been destroyed by soft error and it has been determined by the parity check circuit PRCH that the read data includes any error, degradation of reliability due to soft error can be prevented by reading data from the flash memory FLASH_CHIP.

Fourth Embodiment (Dram Inside MCP)

Figure 24:
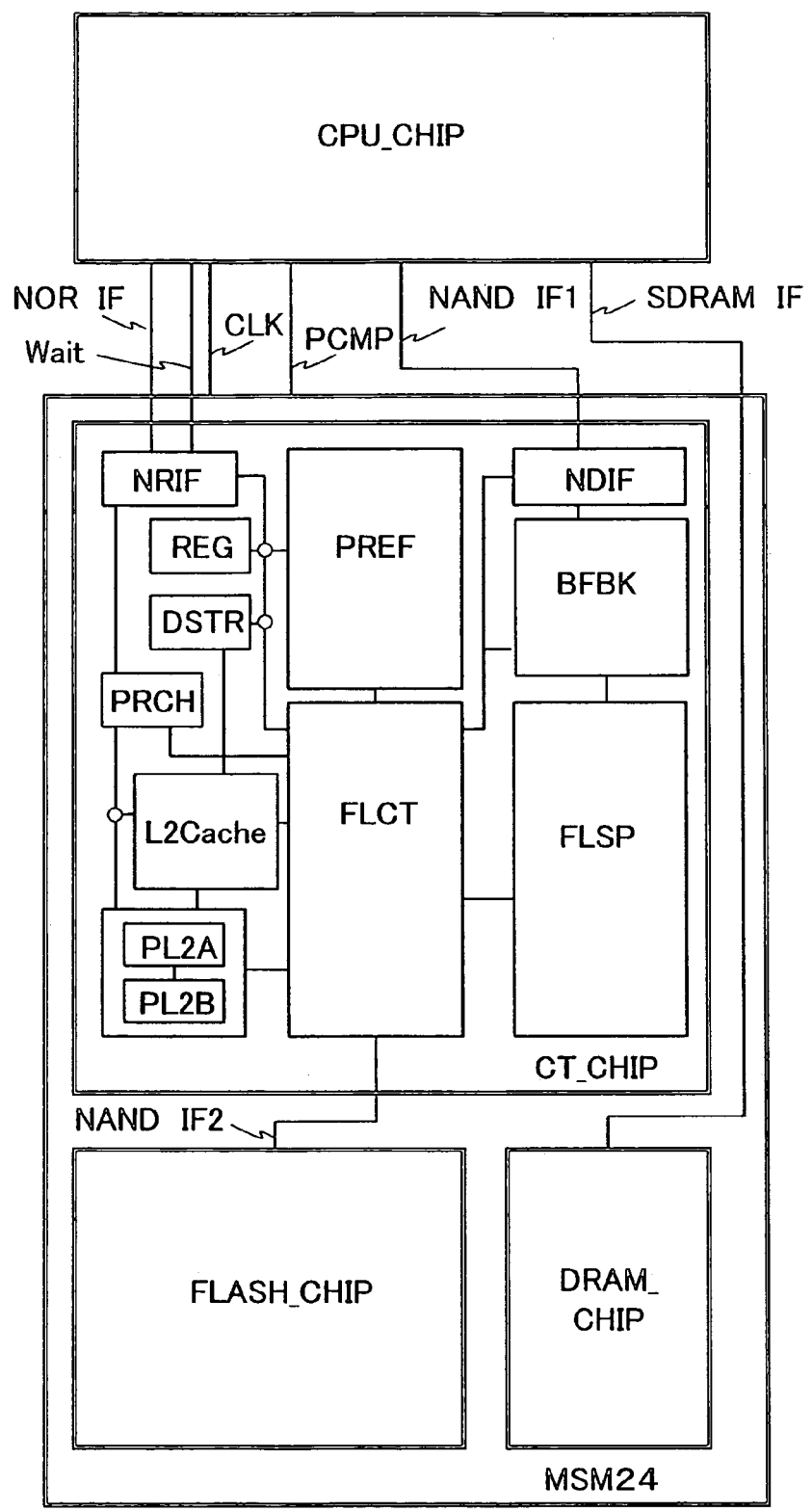
FIG. 24 is a configuration diagram of a memory system to which the present invention is applied.

FIG. 24 is a block diagram of another embodiment to which the present invention is applied. FIG. 24 shows a memory system composed of a data processing device CPU_CHIP and a memory module MSM24.

The memory module MSM24 includes a flash memory FLASH_CHIP, a control circuit CT_CHIP and a dynamic random access memory DRAM_CHIP.

Though not particularly limited, a typical flash memory used as the flash memory FLASH_CHIP is a large-capacity flash memory provided with a NAND interface, and an example where a large-capacity flash memory provided with a NAND interface is utilized is described in this embodiment.

The dynamic random access memory DRAM_CHIP is classified to various types of memories such as EDO (extended data out), SDRAM (synchronous DRAM), and DDR (double data rate) depending on difference in internal configuration or interface. Any DRAM can be used as the memory module MSM24. The SDRAM will be described as one example in this embodiment.

The control circuit CT_CHIP includes a NOR interface NOR IF and a NAND interface NAND IF, and it is a circuit for controlling data transfer between the flash memory FLASH_CHIP and the data processing device CPU_CHIP. These components are equivalent to those shown in FIG. 1.

Further, since the dynamic random access memory DRAM_CHIP is mounted on the memory module MSM24 and it performs the data transfer with the data processing device CPU_CHIP directly through the SDRAM interface SDRAM IF, the memory module MSM24 including the NOR interface, the NAND interface, and the SDRAM interface can realize the present invention shown in FIG. 1.

By incorporating the dynamic random access memory DRAM_CHIP in the memory module in this manner, size reduction of the device can be achieved, which makes it possible to realize the present invention.

Fifth Embodiment (Hard Disk)

Figure 25:
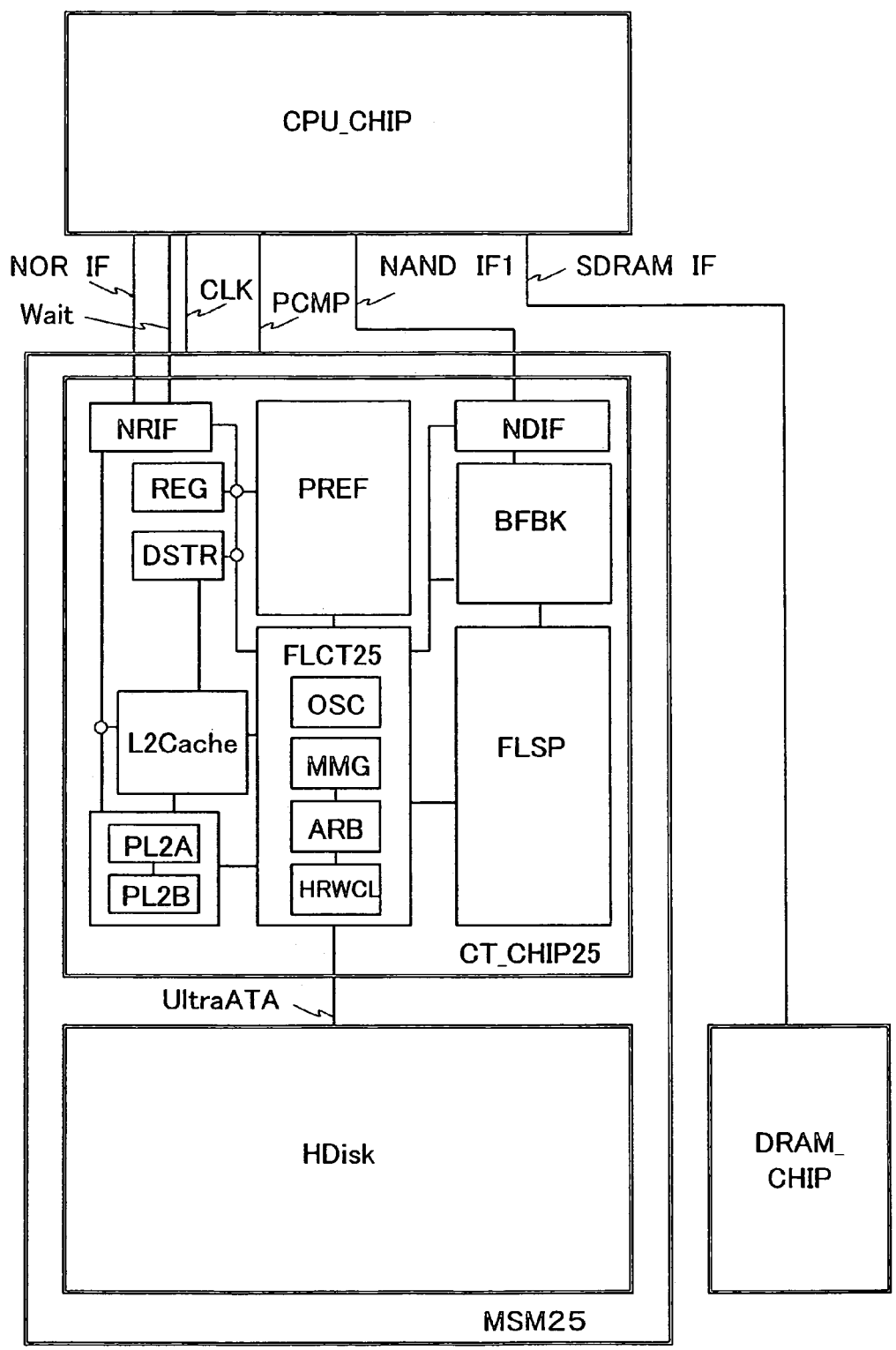
FIG. 25 is a configuration diagram of a memory system to which the present invention is applied.

FIG. 25 is a block diagram showing a fifth embodiment to which the present invention is applied.

FIG. 25 shows a memory system including a data processing device CPU_CHIP, a memory module MSM25, and a dynamic random access memory DRAM_CHIP. The memory module MSM25 is composed of a hard disk HDisk and a control circuit CT_CHIP25.

The data processing device CPU_CHIP and the dynamic random access memory DRAM_CHIP are respectively equivalent to those shown in FIG. 1.

This embodiment is one example where the hard disk HDisk is used instead of the flash memory.

The hard disk HDisk is a memory which has a capacity larger than that of the flash memory FLASH_CHIP and can be realized at a cost lower than that thereof. As an interface for reading data from the hard disk HDisk, IDE, ATA, UltraATA, and others can be used. In this embodiment, the UltraATA is described as an example, but the IDE, the ATA, and others can be used, of course.

Regarding a unit for data reading, an address management method, an error detection and correction method, or the like, since the flash memory originally takes over the unit for data reading, the address management method, the error detection and correction method, or the like realized in the hard disk, the hard disk HDisk can be used instead of the flash memory.

The control circuit CT_CHIP25 is composed of a NOR interface circuit NRIF which receives read and write requests from a NOR interface (NOR IF), a NAND interface circuit NDIF which receives read and write requests from a NAND interface (NAND IF), a register block REG, an address conversion circuit DSTR, cache memories L2Cache, PL2A, and PL2B, a prefetch control circuit PREF, a hard disk control circuit FLCT25, a buffer circuit BFBK, and a flash error control circuit FLSP.

The NOR interface (NOR IF), the NOR interface circuit NRIF, the NAND interface (NAND IF), the NAND interface circuit NDIF, the SDRAM interface (SDRAM_IF), the register block REG, the address conversion circuit DSTR, the cache memories L2Cache, PL2A, and PL2B, the prefetch control circuit PREF, the buffer circuit BFBK, and the flash error control circuit FLSP are respectively equivalent in configuration and operation to those shown in FIG. 1.

The hard disk control circuit FLCT25 is composed of a clock control circuit OSC, a memory address management circuit MMG, an access arbitration circuit ARB, and a control circuit HRWCL.

The clock control circuit OSC, the memory address management circuit MMG, and the access arbitration circuit ARB are respectively equivalent in configuration and operation to those shown in FIG. 1. Further, the control circuit HRWCL is a control circuit obtained by providing an UltraATA interface to the control circuit RWCL shown in FIG. 1 in order to read data from the hard disk HDisk, and operation thereof after reading data from the hard disk HDisk is equivalent to that of the control circuit RWCL shown in FIG. 1. Accordingly, the present invention can be realized by utilizing the hard disk HDisk.

As described above, by utilizing the hard disk HDisk, a memory system with a larger capacity can be realized at lower cost.

Sixth Embodiment

Figure 26A:
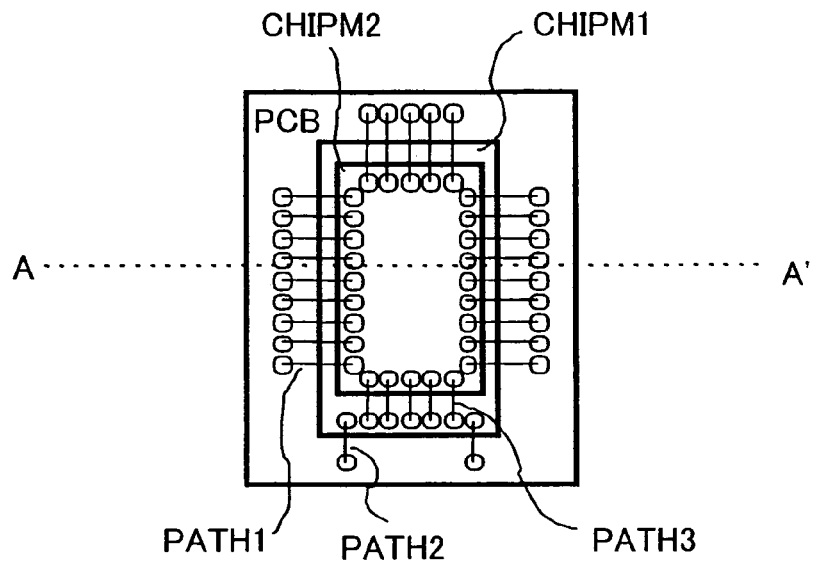
FIG. 26A is a diagram showing one example of a mounting structure in the memory system according to the present invention.
Figure 26B:
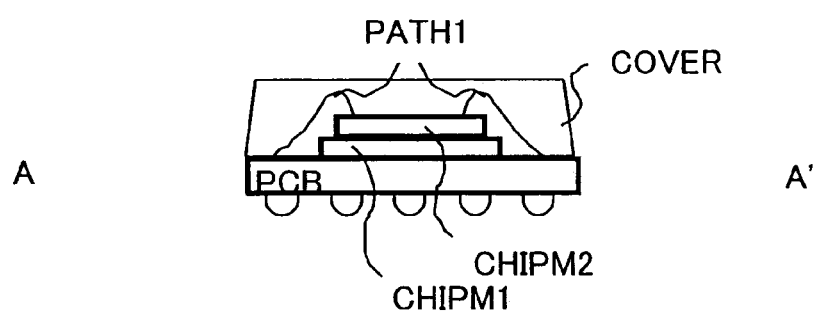
FIG. 26B is a diagram showing one example of a mounting structure in the memory system according to the present invention.

FIG. 26A and FIG. 26B show a sixth embodiment of the present invention. FIG. 26A is a top view of the embodiment and FIG. 26B is a sectional view of the embodiment taken along the line A-A' in the top view.

In a multi-chip module of this embodiment, a CHIPM1 and a CHIPM2 are mounted on a printed circuit board PCB (for example, a printed circuit board made of a glass epoxy board) to be provided on a device by a ball grid array (BGA). The CHIPM1 is a non-volatile memory and the CHIPM2 is a DRAM.

The memory module MSM shown in FIG. 1 and the memory module MSM22 shown in FIG. 22 can be integrated in one sealing member with the multi-chip module of this embodiment.

The bonding pads on the CHIPM1 and the printed circuit board PCB are connected through bonding wires (PATH2), and the bonding pads on the CHIPM2 and the printed circuit board PCB are connected through bonding wires (PATH1). The CHIPM1 and the CHIPM2 are connected through bonding wires (PATH3).

An upper face of the printed circuit board PCB on which the chips are mounted is covered with resin mold so that respective chips and their connecting wires are protected. Note that a metal, ceramic, or resin cover (COVER) can be applied so as to cover the resin mold.

In this embodiment, since bare chips are directly mounted on the printed circuit board PCB, a memory module with a small mounting area can be formed. Also, since respective chips can be stacked on each other, wire lengths between the chips and the printed circuit board PCB can be shortened, and the mounting area can be further reduced. A memory module can be manufactured with the reduced number of steps because the connecting wires between chips and those between respective chips and the printed circuit board are all formed by the wire bonding.

Further, by directly connecting respective chips through bonding wires, the number of bonding pads and the number of bonding wires on the PCB can be reduced, and a memory module can be manufactured with the reduced number of manufacturing steps. By using a resin cover, a further rigid memory module can be manufactured. When a ceramic or metal cover is used, a memory module which is not only rigid but also excellent in heat radiation and shield effect can be manufactured.

Seventh Embodiment

Figure 27A:
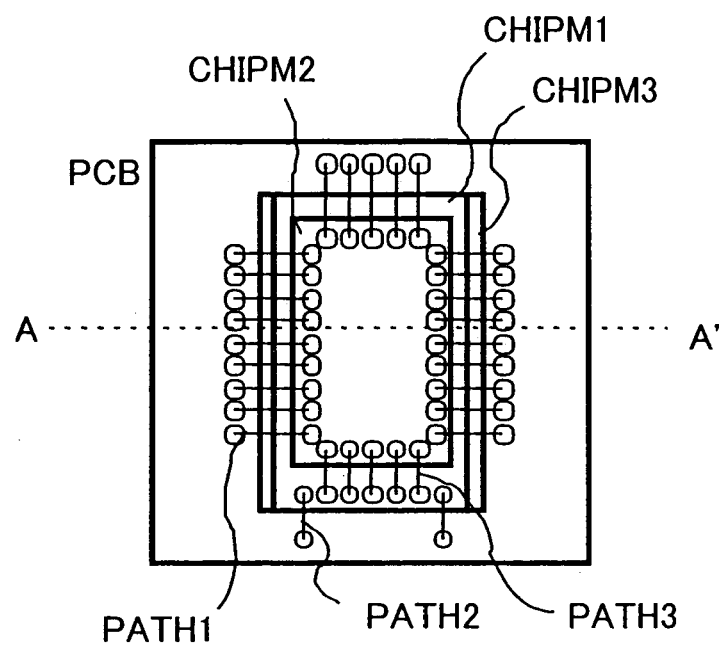
FIG. 27A is a diagram showing one example of a mounting structure in the memory system according to the present invention.
Figure 27B:
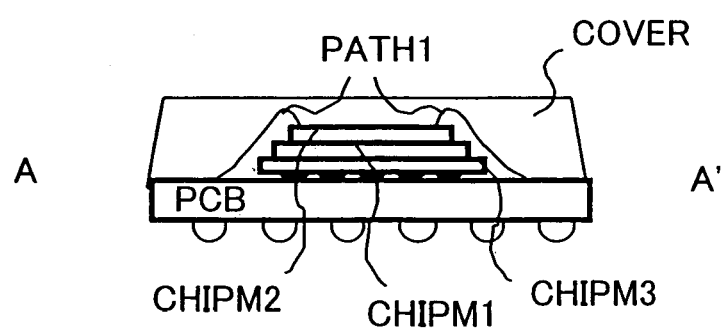
FIG. 27B is a diagram showing one example of a mounting structure in the memory system according to the present invention.

FIG. 27A and FIG. 27B show a seventh embodiment of the present invention. FIG. 27A is a top view of the embodiment and FIG. 27B is a sectional view of the embodiment taken along the line A-A' in the top view.

In a multi-chip module of this embodiment, a CHIPM1, a CHIPM2, and a CHIPM3 are mounted on a printed circuit board (for example, a printed circuit board made of a glass epoxy board) PCB to be provided on a device by a ball grid array (BGA). The CHIPM1 is a non-volatile memory and the CHIPM2 is a DRAM. The CHIPM3 is a data processing device composed of a central processing unit CPU, a NOR controller NRC, and a DRAM controller SDC or a control circuit which controls data transfer of the CHIPM1 and the CHIPM2.

The memory module MSM24 shown in FIG. 24 can be integrated in one sealing member with this multi-chip module.

The bonding pads on the CHIPM1 and the printed circuit board PCB are connected through bonding wires (PATH2), and the bonding pads on the CHIPM2 and the printed circuit board PCB are connected through bonding wires (PATH1). The CHIPM1 and the CHIPM2 are connected through bonding wires (PATH3). Further, a ball grid array is used for mounting and wiring for the CHIP3M.

In this mounting method, since three chips can be stacked on each other, a mounting area can be kept small. Further, since bonding between the CHIPM3 and the printed circuit board is unnecessary and the number of bonding wires can be reduced, the number of manufacturing steps can be reduced, and a more reliable multi-chip module can be realized.

Eighth Embodiment

Figure 28A:
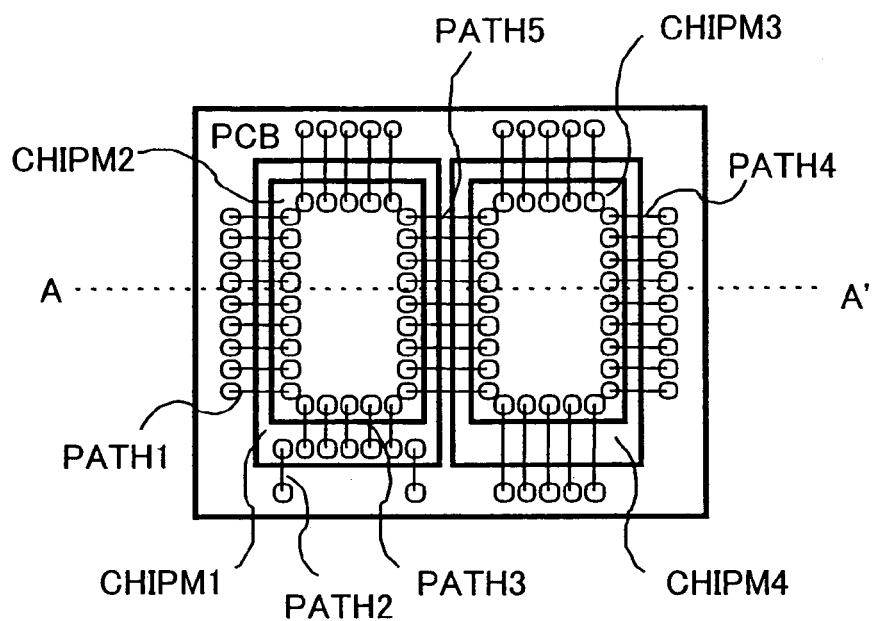
FIG. 28A is a diagram showing one example of a mounting structure in the memory system according to the present invention.
Figure 28B:
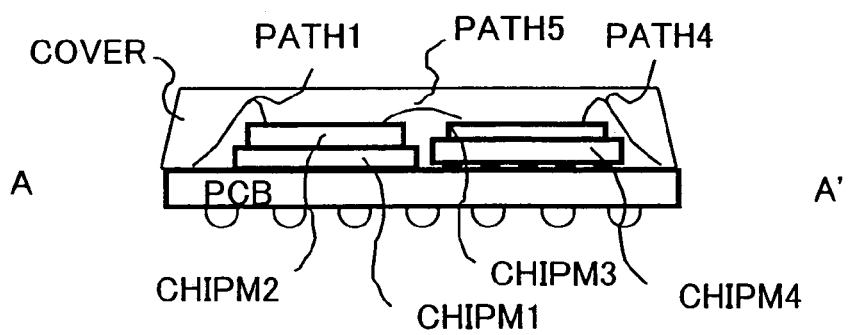
FIG. 28B is a diagram showing one example of a mounting structure in the memory system according to the present invention.

FIG. 28A and FIG. 28B show an eighth embodiment of a multi-chip module according to the present invention. FIG. 28A is a top view of the embodiment and FIG. 28B is a sectional view of the embodiment taken along the line A-A' in the top view.

In a memory module of this embodiment, a CHIPM1, a CHIPM2, a CHIPM3, and a CHIPM4 are mounted on a printed circuit board PCB (for example, a printed circuit board made of a glass epoxy board) to be provided on a device by a ball grid array (BGA). The CHIPM1 is a non-volatile memory and the CHIPM3 is a DRAM. The CHIPM2 is a control circuit which controls data transfer of the CHIPM1 and the CHIPM2, and the CHIPM4 is a data processing device composed of a central processing unit CPU, a NOR controller NRC, and a DRAM controller SDC.

In this mounting method, the memory system shown in FIG. 1, the memory system module shown in FIG. 22, the memory system shown in FIG. 23, and the memory system shown in FIG. 24 can be integrated in one sealing member.

The bonding pads on the CHIPM1 and the printed circuit board PCB are connected through bonding wires (PATH2), the bonding pads on the CHIPM2 and the printed circuit board PCB are connected through bonding wires (PATH4), and the bonding pads on the CHIPM3 and the printed circuit board PCB are connected through bonding wires (PATH1).

The CHIPM1 and the CHIPM3 are connected through bonding wires (PATH3), and the CHIPM2 and the CHIPM3 are connected through bonding wires (PATH5).

A ball grid array (BGA) is used for mounting and wiring for the CHIPM4.

In this mounting method, since bare chips are directly mounted on the printed circuit board PCB, a memory module with a small mounting area can be formed. Also, since respective chips can be arranged close to one another, wire lengths between chips can be shortened.

By directly connecting the chips through bonding wires, the number of bonding pads and the number of bonding wires on the printed circuit board can be reduced, and a memory module can be manufactured with the reduced number of manufacturing steps.

Further, since bonding between the CHIPM4 and the printed circuit board is unnecessary and the number of bonding wires can be reduced, the number of manufacturing steps can be reduced, and a multi-chip module with higher reliability can be realized.

Ninth Embodiment

Figure 29A:
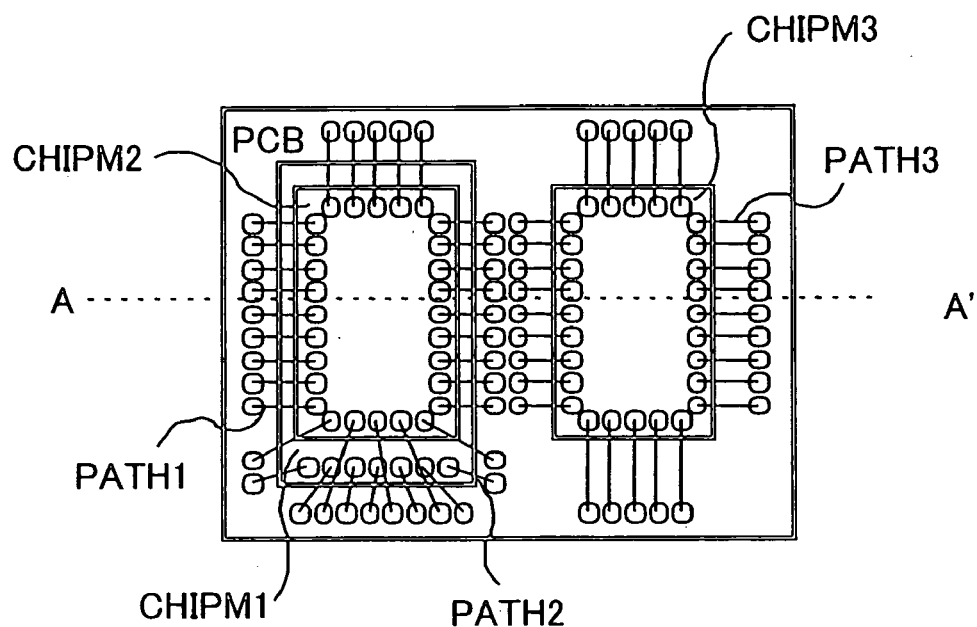
FIG. 29A is a diagram showing one example of a mounting structure in the memory system according to the present invention.
Figure 29B:
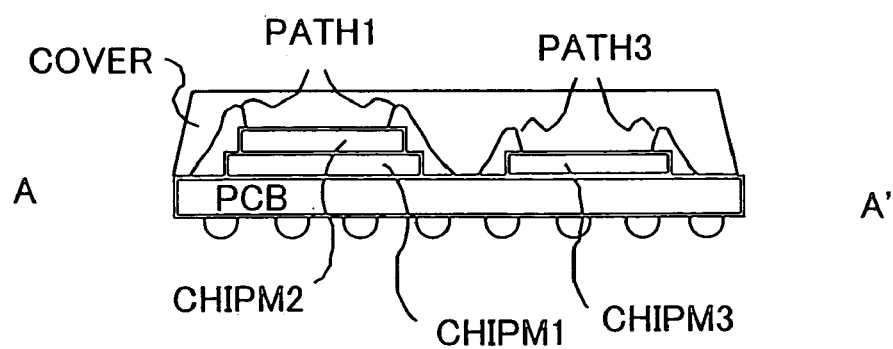
FIG. 29B is a diagram showing one example of a mounting structure in the memory system according to the present invention.

FIG. 29A and FIG. 29B show a ninth embodiment of a memory system according to the present invention. FIG. 29A is a top view of the embodiment and FIG. 29B is a sectional view of the embodiment taken along the line A-A' in the top view.

In a memory module of this embodiment, a CHIPM1, a CHIPM2, and a CHIPM3 are mounted on a printed circuit board PCB (for example, a printed circuit board made of a glass epoxy board) to be provided on a device by a ball grid array (BGA). The CHIPM1 is a non-volatile memory, and the CHIPM2 and the CHIPM3 are DRAMs. A memory module can be manufactured with the reduced number of steps because the connecting wires between chips and those between respective chips and the printed circuit board are all formed by the wire bonding. In this mounting method, the module MSN24 shown in FIG. 24 can be integrated in one sealing member.

The bonding pads on the CHIPM1 and the printed circuit board PCB are connected through bonding wires (PATH2), the bonding pads on the CHIPM2 and the printed circuit board PCB are connected through bonding wires (PATH1), and the bonding pads on the CHIPM3 and the printed circuit board PCB are connected through bonding wires (PATH3).

In this embodiment, since bare chips are directly mounted on the printed circuit board PCB, a memory module with a small mounting area can be formed. Also, since respective chips can be arranged close to one another, wire lengths between chips can be shortened.

A memory module can be manufactured with the reduced number of steps because the connecting wires between respective chips and the printed circuit board are all formed by the wire bonding.

Tenth Embodiment

Figure 30A:
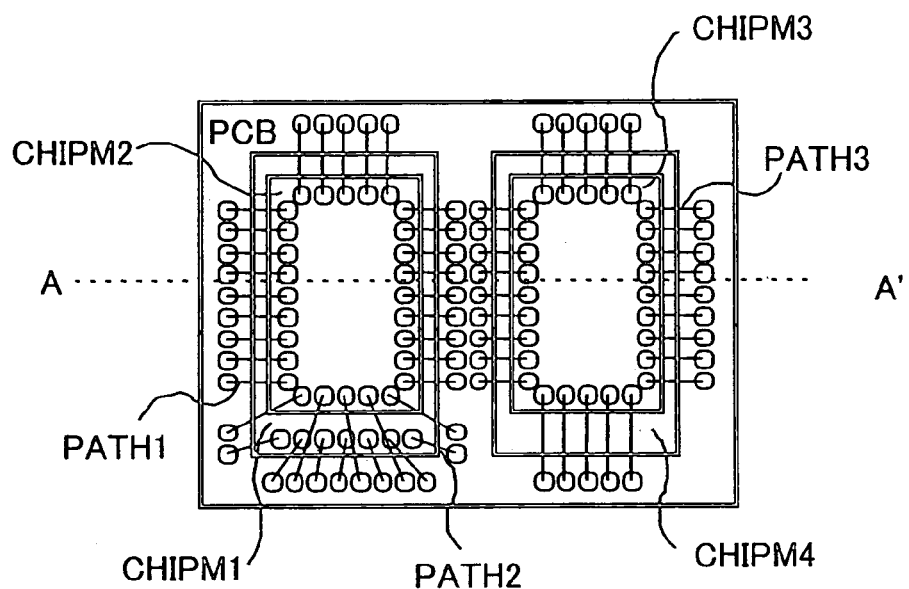
FIG. 30A is a diagram showing one example of a mounting structure in the memory system according to the present invention.
Figure 30B:
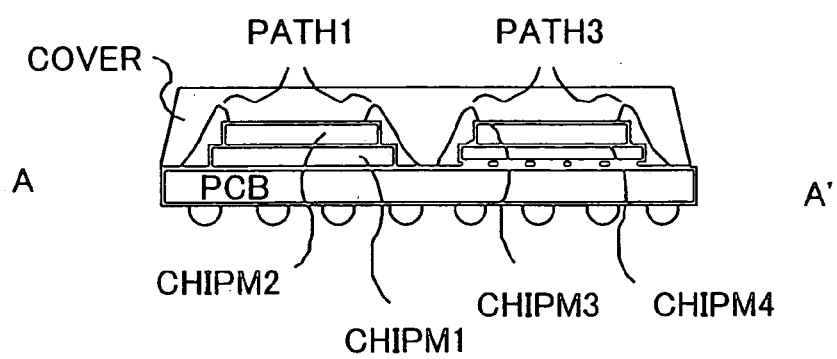
FIG. 30B is a diagram showing one example of a mounting structure in the memory system according to the present invention.

FIG. 30A and FIG. 30B show a tenth embodiment of a memory system according to the present invention. FIG. 30A is a top view of the embodiment and FIG. 30B is a sectional view of the embodiment taken along the line A-A' in the top view.

In a memory module of this embodiment, a CHIPM1, a CHIPM2, a CHIPM3, and a CHIPM4 are mounted on a printed circuit board (for example, a printed circuit board made of a glass epoxy board) PCB to be provided on a device by a ball grid array (BGA). The CHIPM1 is a non-volatile memory and the CHIPM2 and the CHIPM3 are DRAMs. The CHIPM4 is a data processing device composed of a central processing unit CPU, a NOR controller NRC, and a DRAM controller SDC.

In this mounting method, the memory system shown in FIG. 1, the memory system shown in FIG. 22, the memory system shown in FIG. 23, and the memory system shown in FIG. 24 can be integrated in one sealing member.

The bonding pads on CHIPM1 and the printed circuit board PCB are connected through bonding wires (PATH2), the bonding pads on the CHIPM2 and the printed circuit board PCB are connected through bonding wires (PATH1), and the bonding pads on the CHIPM3 and the printed circuit board PCB are connected through bonding wires (PATH3). A ball grid array (BGA) is used for mounting and wiring for the CHIPM4.

In this embodiment, since bare chips are directly mounted on the printed circuit board PCB, a memory module with a small mounting area can be formed. Further, since respective chips can be arranged close to one another, wire lengths between chips can be shortened. Since bonding between the CHIPM4 and the printed circuit board is unnecessary and the number of bonding wires can be reduced, the number of manufacturing steps can be reduced and a multi-chip module with higher reliability can be realized.

Eleventh Embodiment

Figure 31:
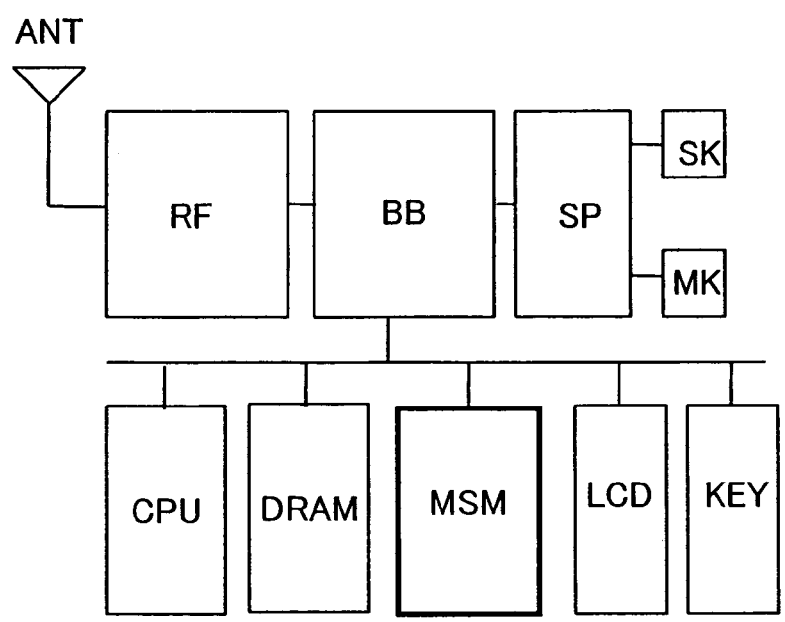
FIG. 31 is a block diagram showing a configuration example of a cellular phone utilizing the memory system according to the present invention.

FIG. 31 shows an eleventh embodiment of a cellular phone utilizing the memory module according to the present invention. The cellular phone is composed of an antenna ANT, a radio frequency block RF, a baseband block BB, a voice codec block SP, a speaker SK, a microphone MK, a processor CPU, a dynamic random access memory DRAM, a liquid crystal display unit LCD, a keyboard KEY, and the memory module MSK of the present invention.

Operation during phone call will be described.

Voice received through the antenna ANT is amplified by the radio frequency block RF and then inputted into the baseband block BB. In the baseband block BB, an analog signal of the voice is converted to a digital signal, and error correction and decoding process is performed, and the digital signal is then outputted to the voice codec block SP. When the voice codec block converts the digital signal to an analog signal and outputs the same to the speaker SK, a user hears voice of the other person from the speaker.

Next, a series of operations for accessing a home page on the Internet to down-load music data, play back the music, and save the down-loaded music data from a cellular phone will be described.

The memory module MSM stores a basic program, an application program (mail, Web browser, a music playing program, an operation playing program, a game program, and the like), music data, still image data, moving picture data, and the like.

When the user starts up the Web browser from the keyboard, the Web browser program stored in the FLASH provided in the memory module MEM is transferred to the cache memory located in the same memory module. After this program transfer, the processor CPU executes the Web browser program in the DRAM, and the Web browser is displayed on the liquid crystal display LCD. When the user accesses a desired home page and instructs down-loading of desired music data from the keyboard KEY, the music data is received via the antenna ANT, amplified in the radio frequency block RF, and then inputted to the baseband block BB. The baseband block BB converts the analog signals of the music data to digital signals, and the error correction and decoding process are performed to the signals. Then, the digitized music data is temporarily stored in the DRAM, and finally transferred to the FLASH in the memory module MEM.

Next, when a user instructs to start the music playing program from the keyboard KEY, a music playing program stored in the FLASH in the memory module MSM is transferred to the cache memory in the same memory module. When the transfer to the cache memory is terminated, the processor CPU executes the music playing program in the cache memory, and the music playing program is displayed on the liquid crystal display LCD.

When a user issues an instruction for listening music data downloaded to the FLASH, the processor CPU executes the music playing program to process music data retained in the FLASH, and the user finally hear music from the speaker SK.

At that time, since a large-capacity cache memory is used in the memory module of the present invention, the Web browser and the music playing program are retained in the cache memory, and both the programs can be simultaneously executed by the CPU. Further, CPU can start up an e-mail program to send/receive a mail concurrently.

Even when the Web browser is stopped, the Web browser is retained in the cache memory in the memory module. Therefore, it is possible to restart the Web browser immediately. When a power-off instruction is inputted from the keyboard, the memory module operates only the cache memory and retains the minimum data to minimize the power consumption.

By using the memory module according to the present invention in this manner, a large volume of mail, music playback, application programs and music data, still image data, moving picture data and the like can be stored and a plurality of programs can be simultaneously executed.

Twelfth Embodiment

Figure 32:
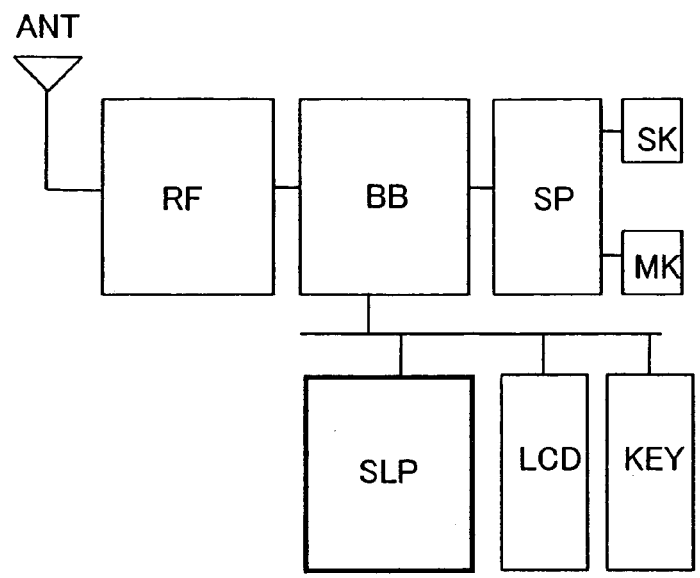
FIG. 32 is a block diagram showing a configuration example of a cellular phone utilizing the memory system according to the present invention.
Figure 33:
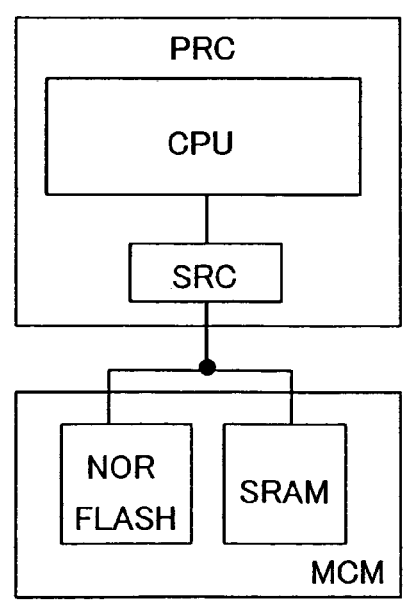
FIG. 33 is a block diagram showing a configuration example of a conventional memory utilized for a cellular phone.

FIG. 32 shows a twelfth embodiment of a cellular phone utilizing the memory system according to the present invention. The cellular phone is composed of an antenna ANT, a radio frequency block RF, a baseband block BB, a voice codec block SP, a speaker SK, a microphone MK, a processor CPU, a liquid crystal display unit LCD, a keyboard KEY and a memory system SLP of the present invention obtained by integrating a processor CPU, a dynamic random access memory DRAM, and a memory module MSK into one sealing member.

By using the memory system SL of the present invention, the number of components can be reduced. Consequently, cost reduction can be achieved and reliability of the cellular phone can be improved. A mounting area for the components constituting the cellular phone can be reduced and the size of the cellular phone can be reduced.

As described above, principal effects obtained by the invention disclosed in this specification are as follows:

First, by automatically transferring a boot program from the FLASH to the cache memory at the time of power-on, the mobile device can start up rapidly by reading the boot program in the cache memory.

Second, by automatically transferring a necessary program from the FLASH to the cache memory at the time of power-on, the mobile device can access the memory module immediately after the start up of the mobile device. Therefore, performance of the mobile device can be achieved.

Third, in the memory module to which the memory system according to the present invention has been applied, data in the FLASH is transferred to and retained in the cache memory. Therefore, the mobile device can directly access the cache memory, and high speed data transfer can be realized.

Fourth, in the memory module to which the memory system according to the present invention has been applied, the data pre-reading function is provided, and data to be utilized next is transferred to the cache memory in advance. Therefore, the hit rate of the cache memory can be improved and data transfer can be made faster.

Fifth, in the memory module to which the memory system according to the present invention has been applied, the data register in the flash memory can be utilized as the cache memory, and the capacity of the cache memory can be effectively increased. Therefore, the hit rate can be improved and data transfer can be made faster.

Sixth, in the memory module to which the memory system according to the present invention has been applied, address conversion is performed and index addresses are distributed in the cache memory to increase a utilization factor of the cache memory. Therefore, the hit rate can be improved and data transfer can be made faster.

Seventh, since data can be read from the cache memory even during data writing in the flash memory, operation speed of the mobile device can be increased.

Eighth, since it is possible to independently set the synchronous and asynchronous interfaces, the address conversion method, the cache area and the non-cache area, the cache lock area and the non-cache lock area, the writing times leveling process area and the non-writing times leveling process area, and the write protect area and the non-write protect area, setting in accordance with the system can be freely selected by a user.

Ninth, in the memory module of the present invention, error detection and correction are performed in the read operation from the FLASH, and replacement process for a failure address where the writing cannot be performed correctly is performed in the write operation. Therefore, it is possible to perform the process at high speed and to achieve high reliability.

Tenth, in the memory module of the present invention, error detection is performed in the read operation from the cache memory, and data is read from the flash memory when an error is detected. Therefore, it is possible to perform the process at high speed and to achieve high reliability.

Eleventh, since the writing times leveling process of the flash memory is performed in the memory module of the present invention, it is possible to perform the process at high speed and to achieve high reliability.

Twelfth, the boot program and the automatic transfer area designating data are written in the initial program area in the FLASH through the NOR interface, the NAND interface, and the AND interface which are standard interfaces, and the booting method and the data transfer area just after power-on can be changed. Therefore, demands for the mobile device can be satisfied flexibly, and high performance can be achieved.

Thirteenth, by mounting a plurality of semiconductor chips in one sealing member, a system memory module with a small mounting area can be provided.

What is claimed is:

1. A memory module comprising:
   a non-volatile memory;
   a cache memory; and
   a control circuit which controls accesses between said non-volatile memory and said cache memory,
   wherein the memory module is provided with a first non-volatile memory interface for accessing said cache memory from an information processing device outside of said memory module and a second non-volatile memory interface for accessing said non-volatile memory from said information processing device outside of said memory module,
   wherein data stored in the non-volatile memory is output from the second non-volatile memory interface via the cache memory when the information processing device accesses the second non-volatile memory interface,
   wherein data stored in the non-volatile memory is output from the first non-volatile memory interface without going through the cache memory when the information processing device accesses the first non-volatile memory interface, and
   wherein the first non-volatile memory interface and the second non-volatile memory interface are both connected to the information processing device, and said non-volatile memory and said cache memory are accessible at the same time independently via said first non-volatile memory interface and said second non-volatile memory interface, respectively.

2. The memory module according to claim 1, wherein, immediately after power-on, data in a predetermined address area in said non-volatile memory is transferred to the cache memory.

3. The memory module according to claim 2, wherein a transfer range data showing a range of a predetermined address area in said non-volatile memory is retained in said non-volatile memory.

4. The memory module according to claim 1,
   wherein a read access from said first non-volatile memory interface to the non-volatile memory is performed through said cache memory, and
   an access from said second non-volatile memory interface is performed without involving said cache memory.

5. The memory module according to claim 1, wherein data transfer from said non-volatile memory to said cache memory is performed by an access from said first non-volatile memory interface.

6. The memory module according to claim 1, wherein, in data transfer from said non-volatile memory to said cache memory and data transfer from said non-volatile memory to said second non-volatile memory interface, data whose error has been corrected is transferred.

7. The memory module according to claim 6, wherein, in data transfer from said cache memory, an error check is performed.

8. The memory module according to claim 7, wherein, when an error is found in said error check, data is transferred from said non-volatile memory to said cache memory.

9. The memory module according to claim 1, wherein, in data transfer to said non-volatile memory, address replacement process is performed.

10. The memory module according to claim 1, wherein said non-volatile memory retains a boot program.

11. The memory module according to claim 1, wherein a transfer range data showing a range of data to be transferred from said non-volatile memory to said cache memory just after power-on is retained in said non-volatile memory.

12. The memory module according to claim 1, wherein a read access from said first non-volatile memory interface to the cache memory, an access from said second non-volatile memory interface to the non-volatile memory, and an access from a dynamic random access memory interface to the dynamic random access memory can be performed simultaneously.

13. The memory module according to claim 1, wherein data transfer from a flash memory to said cache memory by a read access from said first non-volatile memory interface of said memory module is first priority, data transfer between said flash memory and said second non-volatile memory interface by an access from said second non-volatile memory interface is second priority, and data transfer by a write access from said first non-volatile memory interface is third priority.

14. The memory module according to claim 1, wherein said control circuit includes an address conversion circuit, and said address conversion circuit converts an address inputted from said first non-volatile memory interface to utilize the converted address for data retrieval in said cache memory.

15. The memory module according to claim 1, further comprising:
a dynamic random access memory; and
a dynamic random access memory interface for accessing the dynamic random access memory.

16. The memory module according to claim 15, wherein an access from said dynamic random access memory interface to the dynamic random access memory is performed without involving said cache memory.

17. The memory module according to claim 15, wherein said non-volatile memory is formed in a first semiconductor chip,
said control circuit including a cache memory is formed in a second semiconductor chip,
said dynamic random access memory is formed in a third semiconductor chip, and
said first to third semiconductor chips are mounted on a circuit board and sealed to form a multi-chip memory module.

18. The memory module according to claim 1,
wherein said non-volatile memory is formed in a first semiconductor chip,
said control circuit including a cache memory is formed in a second semiconductor chip, and
said first and second semiconductor chips are mounted on a circuit board and sealed to form a multi-chip memory module.

* * * * *